(12) United States Patent
Kawabata et al.

(10) Patent No.: US 10,538,627 B2
(45) Date of Patent: Jan. 21, 2020

(54) POLYIMIDE PRECURSOR COMPOSITION, PHOTOSENSITIVE RESIN COMPOSITION, CURED FILM, METHOD FOR PRODUCING CURED FILM, A SEMICONDUCTOR DEVICE, AND METHOD FOR PRODUCING POLYIMIDE PRECURSOR COMPOSITION

(71) Applicant: FUJIFILM Corporation, Tokyo (JP)

(72) Inventors: Takeshi Kawabata, Haibara-gun (JP); Takuma Amemiya, Haibara-gun (JP); Hidekazu Oohashi, Haibara-gun (JP); Yu Iwai, Haibara-gun (JP); Akinori Shibuya, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/824,360

(22) Filed: Nov. 28, 2017

(65) Prior Publication Data

US 2018/0079864 A1    Mar. 22, 2018

Related U.S. Application Data

(63) Continuation of application No. PCT/JP2016/065580, filed on May 26, 2016.

(30) Foreign Application Priority Data

May 29, 2015   (JP) ................................. 2015-109653
Aug. 17, 2015  (JP) ................................. 2015-160682

(51) Int. Cl.
*C08G 73/10* (2006.01)
*G03F 7/021* (2006.01)
(Continued)

(52) U.S. Cl.
CPC ...... *C08G 73/1067* (2013.01); *C08F 290/145* (2013.01); *C08G 73/10* (2013.01); *G03F 7/021* (2013.01); *G03F 7/0212* (2013.01); *G03F 7/0233* (2013.01); *G03F 7/031* (2013.01); *G03F 7/037* (2013.01); *G03F 7/0387* (2013.01); *G03F 7/0388* (2013.01); *G03F 7/162* (2013.01); *G03F 7/168* (2013.01); *G03F 7/2004* (2013.01); *G03F 7/322* (2013.01); *G03F 7/325* (2013.01); *G03F 7/40* (2013.01); *H01L 23/29* (2013.01); *H01L 23/293* (2013.01); *H01L 23/31* (2013.01); *H01L 24/29* (2013.01); *H01L 25/065* (2013.01); *H01L 25/07* (2013.01); *H01L 25/18* (2013.01); *H01L 24/16* (2013.01); *H01L 24/32* (2013.01); *H01L 24/73* (2013.01); *H01L 25/0657* (2013.01); *H01L 2224/131* (2013.01); *H01L 2224/16145* (2013.01); *H01L 2224/16146* (2013.01);
(Continued)

(58) Field of Classification Search
CPC .... G03F 7/0387; G03F 7/0388; G03F 7/0212; G03F 7/0233; G03F 7/021; G03F 7/325; G03F 7/031; G03F 7/037; G03F 7/162; G03F 7/168; G03F 7/2004; G03F 7/322; G03F 7/40; G03F 7/027; G03F 7/023; G03F 7/004
USPC ...................................... 430/281.1
See application file for complete search history.

(56) References Cited

U.S. PATENT DOCUMENTS 3,615,455 A * 10/1971 Laridon et al. ........... C08F 2/46
                                                        430/281.1
4,558,117 A * 12/1985 Nakano et al. ..... C08G 73/1025
                                                        430/283.1
(Continued)

FOREIGN PATENT DOCUMENTS

CN    1050935 A    4/1991
CN    1577088 A    2/2005
(Continued)

OTHER PUBLICATIONS

English translation of JP, 2005-321648, A (2005) from machine translation from AIPN Japan Patent Office National Center for Industrial Property Information and Training, generated Aug. 16, 2018, 13 pages. (Year: 2005).*
(Continued)

*Primary Examiner* — Cynthia Hamilton
(74) *Attorney, Agent, or Firm* — Sughrue Mion, PLLC

(57) ABSTRACT

A photosensitive resin composition using a polyimide precursor composition, a cured film, a method for producing a cured film, a semiconductor device, and a method for producing a polyimide precursor composition are provided. In the polyimide precursor composition, the molar ratio of repeating units represented by General Formula (1-2) among structural isomers of the polyimide precursor is 60% to 90% by mole. In General Formula (1-2), $A^1$ and $A^2$ each independently represents an oxygen atom or NH, $R^{111}$ and $R^{112}$ each independently represents a single bond or a divalent organic group, and $R^{113}$ and $R^{114}$ each independently represents a hydrogen atom or a monovalent organic group.

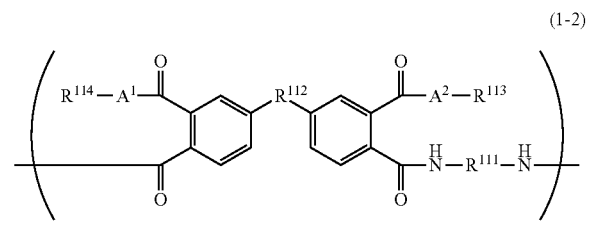

22 Claims, 1 Drawing Sheet

(51) Int. Cl.
| | |
|---|---|
| G03F 7/023 | (2006.01) |
| G03F 7/038 | (2006.01) |
| H01L 23/29 | (2006.01) |
| H01L 23/31 | (2006.01) |
| H01L 25/065 | (2006.01) |
| H01L 25/07 | (2006.01) |
| H01L 25/18 | (2006.01) |
| C08F 290/14 | (2006.01) |
| G03F 7/031 | (2006.01) |
| G03F 7/037 | (2006.01) |
| G03F 7/16 | (2006.01) |
| G03F 7/20 | (2006.01) |
| G03F 7/32 | (2006.01) |
| G03F 7/40 | (2006.01) |
| H01L 23/00 | (2006.01) |

(52) U.S. Cl.
CPC .......... *H01L 2224/16227* (2013.01); *H01L 2224/16238* (2013.01); *H01L 2224/2919* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2924/07025* (2013.01); *H01L 2924/15174* (2013.01); *H01L 2924/15311* (2013.01)

(56) References Cited

U.S. PATENT DOCUMENTS

| | | | | |
|---|---|---|---|---|
| 4,892,896 | A | * | 1/1990 | Wright .............. C08G 73/1025 523/300 |
| 5,077,382 | A | * | 12/1991 | Meterko et al. ... C08G 73/1042 257/E23.007 |
| 6,083,426 | A | | 7/2000 | Shimasaki et al. |
| 7,507,518 | B2 | | 3/2009 | Fujita et al. |

FOREIGN PATENT DOCUMENTS

| | | | | |
|---|---|---|---|---|
| CN | 1648154 | A | | 8/2005 |
| CN | 102597061 | A | | 7/2012 |
| CN | 104285184 | A | | 1/2015 |
| EP | 0421195 | A2 | * | 4/1991 .......... G03F 7/0387 |
| JP | 0540340 | A | | 2/1993 |
| JP | 05170901 | A | * | 7/1993 |
| JP | 2002-265531 | A | | 9/2002 |
| JP | 2002-275262 | A | | 9/2002 |
| JP | 2004-085637 | A | | 3/2004 |
| JP | 2005139433 | A | * | 6/2005 |
| JP | 2005321648 | A | * | 11/2005 |
| JP | 2007286154 | A | * | 11/2007 |
| JP | 2010009052 | A | * | 1/2010 |
| JP | 2010254982 | A | * | 11/2010 |
| WO | 2008/123583 | A1 | | 10/2008 |
| WO | 2009/139086 | A1 | | 11/2009 |

OTHER PUBLICATIONS

English translation of JP, 2007-286154, A (2007) from machine translation from AIPN Japan Patent Office National Center for Industrial Property Information and Training, generated Aug. 16, 2018, 10 pages. (Year: 2007).*

English translation of JP, 05-170901, A (1993) from machine translation from AIPN Japan Patent Office National Center for Industrial Property Information and Training, generated Aug. 16, 2018, 12 pages. (Year: 1993).*

English translation of JP, 2004-085637a, A (2004) from machine translation from AIPN Japan Patent Office National Center for Industrial Property Information and Training, generated Aug. 16, 2018, 13 pages. (Year: 2004).*

English translation of JP, 2002-275262 , A (2002) from machine translation from AIPN Japan Patent Office National Center for Industrial Property Information and Training, generated Aug. 16, 2018, 9 pages. (Year: 2002).*

English translation of JP, 2005-139433 A (2005) from machine translation from AIPN Japan Patent Office National Center for Industrial Property Information and Training, generated Mar. 29, 2019, 23 pages. (Year: 2005).*

English translation of JP, 2010-9052 A (2010) from machine translation from AIPN Japan Patent Office National Center for Industrial Property Information and Training, generated Mar. 29, 2019, 23 pages. (Year: 2010).*

English translation of JP, 2010-254982 A (2010) from machine translation from AIPN Japan Patent Office National Center for Industrial Property Information and Training, generated Mar. 29, 2019, 49 pages. (Year: 2010).*

English translation of JP 2002-265531, A (2002) from machine translation from AIPN Japan Patent Office National Center for Industrial Property Information and Training, generated Mar. 29, 2019, 28 pages. (Year: 2002).*

English translation of JP 05-40340 a (1993)(actual translation of application filed for this publication) obtained from J-PlatPat, Japanese patent office website, 16 pages down loaded Sep. 2019. (Year: 2019).*

English translation of CN1648154 (A) , published 2005, obtained and generated from ESPACENET on Oct. 23, 2019, 14 (Year: 2019).*

English translation of CN 102597061 A, published 2012, obtained and generated from ESPACENET on Oct. 22, 2019, 63 pages. (Year: 2019).*

English translation of CN 104285184 A, published 2015, obtained and generated from ESPACENET on Oct. 22, 2019, 36 pages. (Year: 2019).*

Office Action dated Oct. 22, 2018, from Korean Intellectual Property Office in counterpart Korean Application No. 10-2017-7033766.

International Search Report dated Jul. 12, 2016, issued by the International Bureau in International Application No. PCT/JP2016/065580.

International Preliminary Report on Patentability issued from the International Bureau in International Application No. PCT/JP2016/065580, dated Dec. 5, 2017.

Translation of Written Opinion dated Jul. 12, 2016, issued by the International Bureau in International Application No. PCT/JP2016/065580.

Office Action dated Jan. 15, 2019 from the Japanese Patent Office in counterpart JP Application No. 2017-521878.

Office Action dated Aug. 20, 2019 from the Japanese Patent Office in counterpart Japanese application No. 2017-521878.

C. Johnson et al., "Thermal Elimination of Isobutene from Meta and Para Tert-Di-Butyl Pyromellitic Acid", Journal of Polymer Science: Part B: Polymer Physics, Nov. 1992, vol. 30, Issue 12, pp. 1409-1417 (total 10 pages).

Mark Konieczny et al., "Curing studies of the meta, para and 50/50 mixed isomers of the ethyl ester of 4,4'-oxydianiline/pyromellitic dianhydride polyamic acid", Polymer, Jun. 1997, vol. 38, No. 12, pp. 2969-2979 (total 12 pages).

Office Action dated Sep. 17, 2019 from the China National Intellectual Property Administration in counterpart Chinese Application No. 201680030632.X.

Office Action dated Nov. 11, 2019 cited by Taiwan Intellectual Property Office in Application No. 105116522.

* cited by examiner

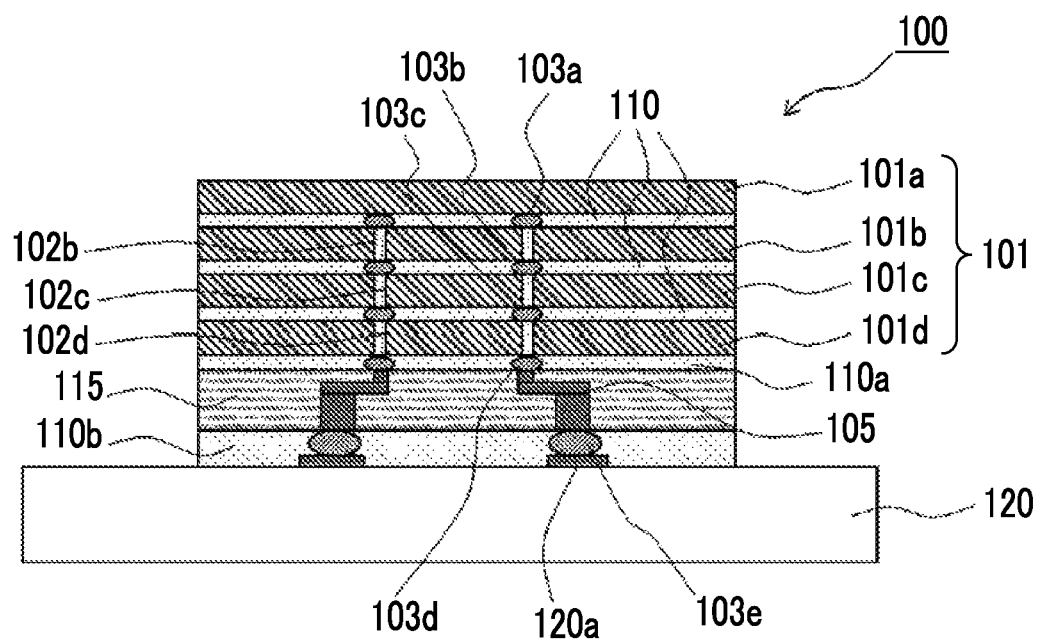

POLYIMIDE PRECURSOR COMPOSITION, PHOTOSENSITIVE RESIN COMPOSITION, CURED FILM, METHOD FOR PRODUCING CURED FILM, A SEMICONDUCTOR DEVICE, AND METHOD FOR PRODUCING POLYIMIDE PRECURSOR COMPOSITION

CROSS-REFERENCE TO RELATED APPLICATIONS

This application is a Continuation of PCT International Application No. PCT/JP2016/065580 filed on May 26, 2016, which claims priority under 35 U.S.C § 119(a) to Japanese Patent Application No. 2015-109653 filed on May 29, 2015 and Japanese Patent Application No. 2015-160682 filed on Aug. 17, 2015. Each of the above application(s) is hereby expressly incorporated by reference, in its entirety, into the present application.

BACKGROUND OF THE INVENTION

1. Field of the Invention

The present invention relates to a polyimide precursor composition, a photosensitive resin composition, a cured film, a method for producing a cured film, a semiconductor device, and a method for producing a polyimide precursor composition.

2. Description of the Related Art

Thermosetting resins which are cyclized and cured, such as a polyimide resin, exhibit excellent heat resistance and excellent insulating properties, and are therefore used for an insulating layer or the like of semiconductor devices.

Furthermore, the polyimide resin has low solubility in a solvent, and is therefore used in a state of a precursor resin (polyimide precursor resin) prior to being subjected to a cyclization reaction, which is then applied onto a substrate or the like, and then heated to result in cyclization of the polyimide precursor, thereby forming a cured film. As such a polyimide precursor, for example, WO2009/139086A describes a polyesterimide precursor having a predetermined structure.

SUMMARY OF THE INVENTION

Here, an increase in the cyclization rate of a polyimide precursor has been recently required. However, it could be seen that in a case of a polyimide precursor with a high cyclization rate, unfavorable cyclization proceeds in a case where the polyimide precursor is preserved for a long period of time, resulting in deterioration in stability in some cases.

The present invention aims to solve such the problems, and thus, has an object to provide a polyimide precursor composition having a high cyclization rate and excellent long-term storage stability, a photosensitive resin composition using the polyimide precursor composition, a cured film, a method for producing a cured film, a semiconductor device, and a method for producing a polyimide precursor composition.

Regarding the problems, the present inventors have conducted extensive studies, and as a result, have found that by employing a polyimide precursor having a specific structure among polyimide precursors, and increasing the ratio of specific structural isomers among the structural isomers, it is possible to maintain the stability even when a composition including a polyimide precursor is preserved for a long period of time while the cyclization rate of the polyimide precursor is increased, thereby completing the present invention.

Specifically, the problems have been solved by the following mean <1>, and preferably <2> to <25>.

<1> A polyimide precursor composition comprising:
a polyimide precursor including repeating units represented by General Formula (1-1),
in which the molar ratio of repeating units represented by General Formula (1-2) among the structural isomers of the polyimide precursor is 60% to 90% by mole,

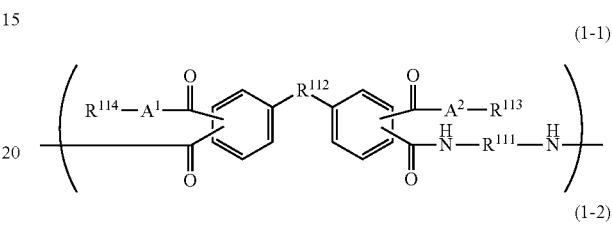

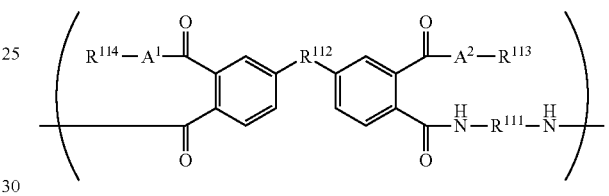

in General Formulae (1-1) and (1-2), $A^1$ and $A^2$ each independently represent an oxygen atom or NH, $R^{111}$ and $R^{112}$ each independently represent a single bond or a divalent organic group, and $R^{113}$ and $R^{114}$ each independently represent a hydrogen atom or a monovalent organic group.

<2> The polyimide precursor composition as described in <1>, in which at least one of $R^{113}$ or $R^{114}$ contains a polymerizable group.

<3> The polyimide precursor composition as described in <1>, in which both of $R^{113}$ and $R^{114}$ contain a polymerizable group.

<4> The polyimide precursor composition as described in any one of <1> to <3>, in which at least one of $A^1$ or $A^2$ is an oxygen atom.

<5> The polyimide precursor composition as described in any one of <1> to <4>, in which $R^{112}$ is a single bond, or a group selected from a hydrocarbon group having 1 to 10 carbon atoms, —O—, —C(=O)—, —S—, —S(=O)$_2$—, —NHCO—, and a combination thereof.

<6> The polyimide precursor composition as described in any one of <1> to <5>, in which the weight-average molecular weight of the polyimide precursor is 1,000 to 100,000.

<7> The polyimide precursor composition as described in any one of <1> to <6>, in which the weight-average molecular weight/number-average molecular weight which is the dispersity of the polyimide precursor is 2.0 to 4.0.

<8> A photosensitive resin composition comprising:
the polyimide precursor composition as described in any one of <1> to <7>; and
a curable compound.

<9> The photosensitive resin composition as described in <8>, in which the curable compound includes a compound having an ethylenically unsaturated bond.

<10> The photosensitive resin composition as described in <8>, in which the curable compound includes a compound having two or more ethylenically unsaturated groups.

<11> The photosensitive resin composition as described in <8>, in which the curable compound is at least one compound selected from a compound having at least one of a hydroxymethyl group, an alkoxymethyl group, or an acyloxymethyl group, an epoxy compound, an oxetane compound, and a benzoxazine compound.

<12> The photosensitive resin composition as described in any one of <8> to <11>, further comprising:
at least one kind of thermal base generator selected from an acidic compound which generates a base upon heating to 40° C. or higher and an ammonium salt having an anion with a pKa1 of 0 to 4 and an ammonium cation.

<13> The photosensitive resin composition as described in <12>, in which the acidic compound is a compound which generates a base upon heating to 120° C. to 200° C.

<14> The photosensitive resin composition as described in <12> or <13>, in which the acidic compound is an ammonium salt.

<15> The photosensitive resin composition as described in any one of <12> to <14>, in which the acidic compound is a salt of an ammonium cation and a carboxylate anion.

<16> The photosensitive resin composition as described in <12>, in which the ammonium salt having an anion with a pKa1 of 0 to 4 and an ammonium cation is an acidic compound.

<17> The photosensitive resin composition as described in <12> or <16>, in which the anion contained in the ammonium salt is a carboxylate anion.

<18> The photosensitive resin composition as described in any one of <8> to <17>, further comprising:
a photoradical polymerization initiator.

<19> The photosensitive resin composition as described in any one of <8> to <17>, further comprising:
a photo-acid generator.

<20> A cured film formed by curing the photosensitive resin composition as described in any one of <8> to <19>.

<21> The cured film as described in <20>, which is a re-wiring interlayer insulating film.

<22> A method for producing a cured film, comprising:
applying the photosensitive resin composition as described in any one of <8> to <19> onto a substrate; and
curing the photosensitive resin composition applied onto the substrate.

<23> A semiconductor device comprising:
the cured film as described in <20>, or the cured film produced by the production method as described in <22>.

<24> A method for producing a polyimide precursor composition, comprising:
reacting a compound represented by General Formula (P) with a compound represented by General Formula (Q) to produce a diester or a diamide; and
reacting the diester or the diamide with a compound represented by General Formula (R),
in which the reaction for producing the diester or the diamide is carried out at 40° C. to 80° C. for 3 to 10 hours,

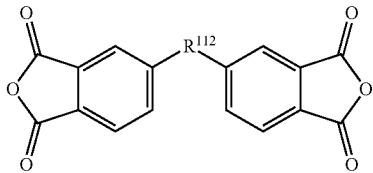

General Formula (P)

in General Formula (P), $R^{112}$ represents a single bond or a divalent organic group;

$$HA^3\text{-}R^{115}$$  General Formula (Q)

in General Formula (Q), $A^3$'s each independently represent an oxygen atom or NH, and $R^{115}$ represents a monovalent organic group; and $$H_2N\text{—}R^{111}\text{—}NH_2$$  General Formula (R)

in General Formula (R), $R^{111}$ represents a divalent organic group.

<25> The method for producing a polyimide precursor composition as described in <24>, in which the polyimide precursor composition is the polyimide precursor composition as described in any one of <1> to <7>.

According to the present invention, provided are a polyimide precursor composition having a high cyclization rate and excellent long-term storage stability, a photosensitive resin composition using the polyimide precursor composition, a cured film, a method for producing a cured film, a semiconductor device, and a method for producing a polyimide precursor composition.

BRIEF DESCRIPTION OF THE DRAWINGS

FIG. 1 is a schematic diagram showing the configuration of an embodiment of a semiconductor device.

DESCRIPTION OF THE PREFERRED EMBODIMENTS

Description of the constitutive components in the present invention which will be described below has been made on the basis of representative embodiments of the present invention in some cases, but the present invention is not limited to such embodiments.

Regarding the expressions of a group (atomic group) in the present specification, the expression with no indication of substitution or unsubstitution includes both a substituted group (atomic group) and an unsubstituted group (atomic group). For example, an "alkyl group" includes not only an alkyl group not having a substituent (unsubstituted alkyl group) but also an alkyl group having a substituent (substituted alkyl group).

In the present specification, "actinic rays" mean, for example, a bright line spectrum of a mercury lamp, far ultraviolet rays typified by excimer laser, extreme ultraviolet rays (EUV light), X-rays, electron beams, or the like. Further, in the present invention, "light" means actinic rays or radiation. Unless otherwise indicated, "exposure" includes not only exposure to a mercury lamp, far ultraviolet rays typified by excimer laser, X-rays, EUV light, or the like but also lithography with particle beams such as electron beams and ion beams.

In the present specification, the numerical value range expressed by using "to" means a range including the numerical values described before and after "to" as a lower limit value and an upper limit value, respectively.

In the present specification, "(meth)acrylate" refers to both or any one of "acrylate" and "methacrylate"; "(meth) allyl" refers to both or any one of "allyl" and "methallyl"; "(meth)acrylic" refers to both or any one of "acrylic" and "methacrylic"; and "(meth)acryloyl" refers to both or any one of "acryloyl" and "methacryloyl".

In the present specification, the term "step" includes not only an independent step, but also a step which may not be clearly separated from another step as long as an expected effect of the step can be attained.

In the present specification, the concentration of solid contents refers to a mass percentage of the mass of other components except for a solvent, with respect to the total mass of the composition. Further, the concentration of solid contents is a concentration at 25° C. unless otherwise specifically stated.

In the present specification, the weight-average molecular weight (Mw)·number-average molecular weight (Mn) is defined as a value in terms of polystyrene by GPC measurement unless otherwise specifically stated. In the present specification, the weight-average molecular weight (Mw) and the number-average molecular weight (Mn) can be determined, for example, using HLC-8220 (manufactured by Tosoh Corporation), and guard columns HZ-L, TSKgel Super HZM-M, TSKgel Super HZ4000, TSKgel Super HZ3000, and TSKgel Super HZ2000 (manufactured by Tosoh Corporation) as columns in the device. They are measured using tetrahydrofuran (THF) as an eluent. Further, the detection results are obtained using a detection machine with a wavelength of 254 nm of ultraviolet rays (UV rays) unless otherwise specifically stated.

The polyimide precursor composition of the present invention is a polyimide precursor composition including a polyimide precursor including repeating units represented by General Formula (1-1), in which the molar ratio of the repeating units represented by General Formula (1-2) among the structural isomers of the polyimide precursor is 60% to 90% by mole,

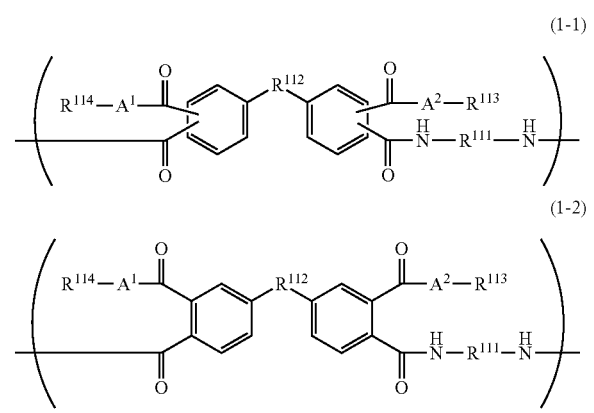

in General Formulae (1-1) and (1-2), $A^1$ and $A^2$ each independently represent an oxygen atom or NH, $R^{111}$ and $R^{112}$ each independently represent a single bond or a divalent organic group, and $R^{113}$ and $R^{114}$ each independently represent a hydrogen atom or a monovalent organic group.

As represented by Formula (3-1), the structure represented by General Formula (1-2) easily forms an imide ring, and has a higher cyclization rate as the structural isomer ratio is higher. Further, when the cyclization rate is higher as above, the cured film characteristics are improved. On the other hand, the structure represented by General Formula (1-2) has no problem when being used directly without storage, but when it is preserved for a long period of time, it has a problem in that precipitation easily occurs from the solution due to aggregation among the polymer chains, and the stability is deteriorated.

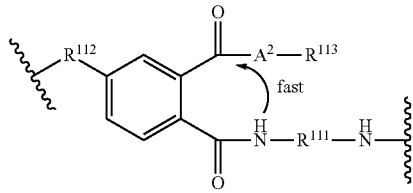

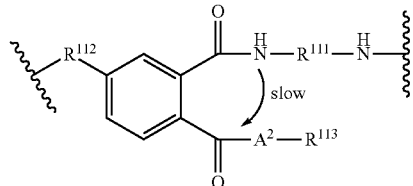

In the present invention, by setting the molar ratio of the repeating units represented by General Formula (1-2) to 60% to 90% by mole, the cyclization rate is high, and even with storage for a long period of time, it is accomplished to provide a stable polyimide precursor composition.

The repeating units represented by General Formula (1-1) of the present invention can be present as structural isomers which are repeating units represented by General Formulae (1-3) to (1-5), in addition to the repeating units represented by General Formula (1-2). In the present invention, the molar ratio of the repeating units represented by General Formula (1-2) in the repeating units represented by General Formula (1-1) is 60% to 90% by mole, but the total of the repeating units represented by General Formula (1-3) and the repeating units represented by General Formula (1-4) is preferably 10% to 40% by mole from the viewpoint of enhancement in the cyclization rate. Further, the ratio of repeating units represented by General Formula (1-5) is preferably 0% to 40% by mole from the viewpoint of enhancement in the cyclization rate.

Furthermore, the ratio of the repeating units represented by General Formula (1-2) is preferably 63% to 85% by mole.

In addition, the total of the repeating units represented by General Formula (1-3) and the repeating units represented by General Formula (1-4) is preferably 15% to 37% by mole. The ratio of the repeating units represented by General Formula (1-5) is more preferably 0% to 22% by mole.

Measurement of the structural isomer ratio can be carried out by means of $^{13}$C-NMR (deuterated DMSO). Here, taking the structure of the polyimide precursor into consideration, peaks in the areas where the isomer ratios are distinguishable may be selected and compared.

General Formula (1-3)

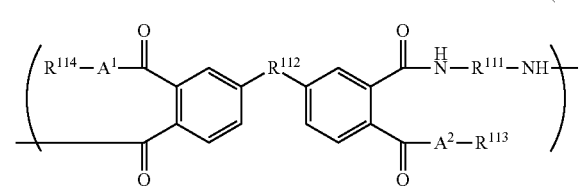

General Formula (1-4)

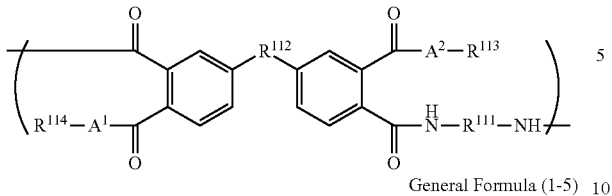

General Formula (1-5)

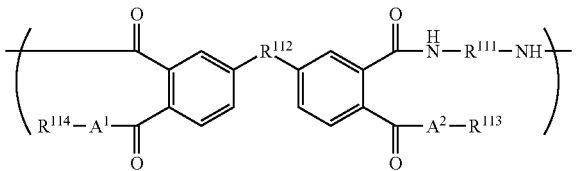

Furthermore, as will be described in detail later, the polyimide precursor in the present invention may include repeating units other than the repeating units represented by General Formula (1-1). The polyimide precursor composition of the present invention may include components other than the polyimide precursor, such as an additive to be added in the synthesis of the polyimide precursor, or solvents, but the polyimide precursor usually accounts for 95% by mass or more of the solid contents of the polyimide precursor composition.

Hereinafter, the details of General Formulae (1-1) to (1-5) will be described. In a case where the same symbols are used in General Formulae (1-1) to (1-5), the definitions and the preferred range are both the same. In addition, in the polyimide precursor in the present invention, the repeating units represented by General Formulae (1-1) to (1-5) may be each of one kind or of two or more kinds thereof.

$R^{112}$ represents a single bond or a divalent organic group. $R^{112}$ is preferably a single bond, or a group selected from a hydrocarbon group having 1 to 10 carbon atoms, —O—, —C(=O)—, —S—, —S(=O)$_2$—, —NHCO—, and a combination thereof, more preferably a single bond or a group selected from a methylene group, —O—, —C(=O)—, —S—, and —S(=O)$_2$—, and still more preferably —O—.

As the hydrocarbon group having 1 to 10 carbon atoms, an alkylene group is preferable, an alkylene group having 1 to 3 carbon atoms is more preferable, a methylene group, an ethylene group, or a propylene group is still more preferable, and a methylene group is even still more preferable. In addition, the alkylene group is preferably an unsubstituted alkylene group or fluorinated alkylene group, and more preferably an unsubstituted alkylene group.

Examples of the following partial structure including $R^{112}$ in each of General Formulae (1-2) to (1-5) include a residue remaining after removal of an anhydride group from tetracarboxylic dianhydride.

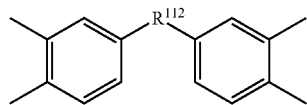

Specifically, a residue of a tetracarboxylic dianhydride represented by General Formula (P) is exemplified.

General Formula (P)

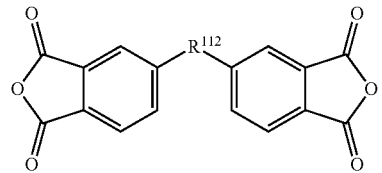

In General Formula (P), $R^{112}$ represents a single bond or a divalent organic group.

$R^{112}$ in General Formula (P) has the same definition as $R^{112}$ in General Formula (1-1), and a preferred range thereof is also the same.

A specific example of General Formula (P) is preferably at least one selected from 3,3',4,4'-biphenyltetracarboxylic dianhydride, 3,3',4,4'-diphenylsulfidetetracarboxylic dianhydride, 3,3',4,4'-diphenylsulfonetetracarboxylic dianhydride, 3,3',4,4'-benzophenonetetracarboxylic dianhydride, 3,3',4,4'-diphenylmethanetetracarboxylic dianhydride, and 3,3',4,4'-diphenyloxidetetracarboxylic dianhydride.

$A^1$ and $A^2$ each independently represent an oxygen atom or NH, and is preferably an oxygen atom.

$R^{113}$ and $R^{114}$ each independently represent a hydrogen atom or a monovalent organic group.

As the monovalent organic group represented by each of $R^{113}$ and $R^{114}$, a substituent which improves the solubility of a developer is preferably used.

Examples of the monovalent organic group include an aryl group and an aralkyl group, each having one, two, or three acidic groups, and preferably one acidic group, bonded to an aryl carbon. Specific examples of the monovalent organic group include an aryl group containing an acidic group and having 6 to 20 carbon atoms, and an aralkyl group containing an acidic group and having 7 to 25 carbon atoms. More specific examples thereof include a phenyl group containing an acidic group and a benzyl group containing an acidic group. The acidic group is preferably an HO group.

In a case where $R^{113}$ and $R^{114}$ are each a hydrogen atom, 2-hydroxybenzyl, 3-hydroxybenzyl, or 4-hydroxybenzyl, the solubility in an aqueous developer is favorable, and thus, it can be particularly suitably used as a negative tone photosensitive resin composition.

From the viewpoint of solubility in an organic solvent, $R^{113}$ and $R^{114}$ are each particularly preferably an alkyl group, a cycloalkyl group, or an aromatic group.

The number of carbon atoms in the alkyl group is preferably 1 to 30. The alkyl group may be linear, branched, or cyclic. Examples of the linear or branched alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a t-butyl group, a 1-ethylpentyl group, and a 2-ethylhexyl group. The cyclic alkyl group (cycloalkyl group) may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. Among those, a cyclohexyl group is most preferable from the viewpoint of compatibility with high sensitivity.

The aromatic group is specifically a substituted or unsubstituted benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring, with a benzene ring being the most preferable.

Moreover, it is preferable that at least one of $R^{113}$ or $R^{114}$ has a polymerizable group, and it is more preferable that both of $R^{113}$ and $R^{114}$ have a polymerizable group. Accordingly, sensitivity and resolution can be improved.

Examples of the polymerizable group contained in each of $R^{113}$ and $R^{114}$ include an epoxy group, an oxetanyl group, a group having an ethylenically unsaturated bond, a blocked isocyanate group, an alkoxymethyl group, a methylol group, and an amino group. Among those, a group having an ethylenically unsaturated bond is preferable for a reason that sensitivity is good. Examples of the group having an ethylenically unsaturated bond include a vinyl group, a (meth) allyl group, and a group represented by General Formula (III).

$R^{113}$ and $R^{114}$ are each more preferably a group represented by General Formula (III).

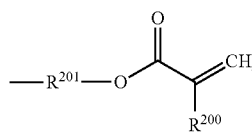

(III)

In General Formula (III), $R^{200}$ represents hydrogen or a methyl group, and is more preferably a methyl group.

In General Formula (III), $R^{201}$ is a single bond or divalent linking group, and preferably a divalent linking group. As the divalent linking group, an alkylene group or an alkyleneoxy group is preferable, and further, a hydrogen atom in each of the alkylene group and the alkyleneoxy group may be substituted with an acid group.

Suitable examples of $R^{201}$ include an ethylene group, a propylene group, a trimethylene group, a tetramethylene group, a 1,2-butanediyl group, a 1,3-butanediyl group, a pentamethylene group, a hexamethylene group, an octamethylene group, a dodecamethylene group, and —CH$_2$CH (OH)CH$_2$—, with an ethylene group, a propylene group, a trimethylene group, or —CH$_2$CH(OH)CH$_2$— being more preferable.

With respect to the proportion of $R^{113}$ and $R^{114}$ which are polymerizable groups, the ratio of polymerizable groups: non-polymerizable groups is preferably 100:0 to 5:95, more preferably 100:0 to 20:80, and most preferably 100:0 to 50:50 in terms of molar ratio.

The structure of each of -$A^2$-$R^{113}$ and -$A^1$-$R^{114}$ is preferably derived from a compound represented by General Formula (Q).

$HA^3$-$R^{115}$    General Formula (Q)

In General Formula (Q), $A^3$'s each independently represent an oxygen atom or NH, and $R^{115}$ represents a monovalent organic group.

$A^3$ is preferably an oxygen atom.

The organic group as $R^{115}$ has the same definition as the organic group described above for the above-mentioned $R^{113}$, and a preferred range thereof is also the same.

$R^{111}$ represents a divalent organic group. $R^{111}$ is preferably an aliphatic group, an alicyclic group, an aromatic group, —O—, —S—, —SO$_2$—, —CO—, —NHCO—, —C(CF$_3$)$_2$—, or a group formed by combination thereof. The aliphatic group may be a linear aliphatic group or a branched aliphatic group.

The aliphatic group is preferably an aliphatic group (preferably a linear alkylene group) having 1 to 5 carbon atoms, the alicyclic group is an alicyclic group (preferably a cycloalkylene group) having 6 to 12 carbon atoms, and the aromatic group is preferably an aromatic group having 6 to 16 carbon atoms.

$R^{111}$ as a divalent organic group is more preferably an aromatic group, or a group formed by combination of an aromatic group with at least one of —O—, —S—, —SO$_2$—, —CO—, —NHCO—, or —C(CF$_3$)$_2$, and more preferably an aromatic group, or a group formed by combination of an aromatic group with at least one of —O—, —S—, —SO$_2$—, —CO—, —NHCO—, or —C(CF$_3$)$_2$—.

Examples of the aromatic group include the following groups.

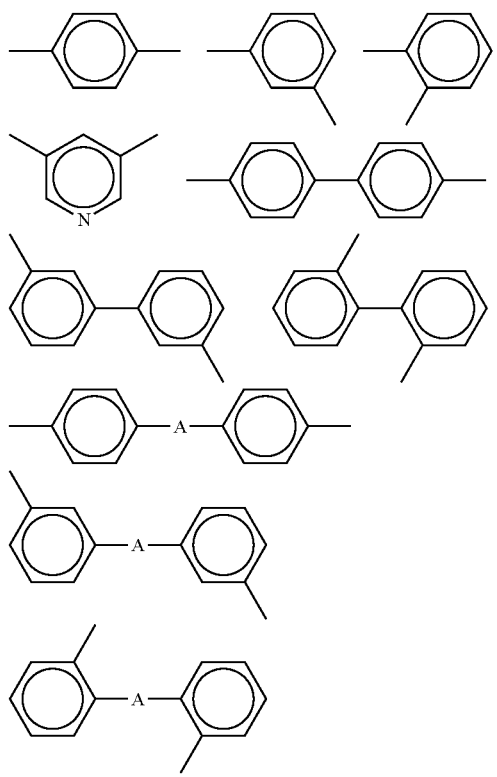

In the formulae, A is a group of —CH$_2$—, —O—, —S—, —SO$_2$—, —CO—, —NHCO—, —C(CF$_3$)$_2$—, and a combination thereof, and more preferably any one of —CH₂—, —O—, —S—, —SO₂—, —CO—, —NHCO—, and —C(CF₃)₂—.

Examples of $R^{111}$ include a diamine residue remaining after removal of an amino group in a diamine. Specific examples thereof include a diamine residue remaining after removal of an amine in a diamine of the compound represented by General Formula (R).

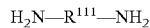   General Formula (R)

In General Formula (R), $R^{111}$ represents a divalent organic group. $R^{111}$ in General Formula (R) has the same definition as $R^{111}$ in General Formula (1-1), and a preferred range thereof is also the same.

Examples of the compound represented by General Formula (R) include 1,2-diaminoethane, 1,2-diaminopropane, 1,3-diaminopropane, 1,4-diaminobutane and 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl)methane, bis-(3-aminocyclohexyl)methane, 4,4'-diamino-3,3'-dimethylcyclohexylmethane, and isophoronediamine; m- and p-phenylenediamine, diaminotoluene, 4,4'- and 3,3'-diaminobiphenyl, 4,4'- and 3,3'-diaminodiphenyl ether, 4,4'- and 3,3'-diaminodiphenylmethane, 4,4'- and 3,3'-diaminodiphenylsulfone, 4,4'- and 3,3-diaminodiphenylsulfide, 4,4'- and 3,3'-diaminobenzophenone, 3,3-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenye)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, bis(3-amino-4-hydroxyphenyl)sulfone, bis(4-amino-3-hydroxyphenyl) sulfone, 4,4'-diaminoparaterphenyl, 4,4'-bis(4-aminophenoxy)biphenyl, bis[4-(4-aminophenoxy)phenyl] sulfone, bis[4-(3-aminophenoxy)phenyl]sulfone, bis[4-(2-aminophenoxy)phenyl]sulfone, 1,4-bis(4-aminophenoxy) benzene, 9,10-bis(4-aminophenyl) anthracene, 3,3'-dimethyl-4,4'-diaminodiphenylsulfone, 1,3-bis(4-aminophenoxy)benzene, 1,3-bis(3-aminophenoxy)benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy) phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl)fluorene, 4,4'-dimethyl-3,3'-diaminodiphenylsulfone, 3,3',5,5'-tetramethyl-4,4'-diaminodiphenylmethane, 2,4- and 2,5-diaminocumene, 2,5-dimethyl-p-phenylenediamine, acetoguanamine, 2,3,5,6-tetramethyl-p-phenylenediamine, 2,4,6-trimethyl-m-phenylenediamine, bis(3-aminopropyl) tetramethyldisiloxane, 2,7-diaminofluorene, 2,5-diaminopyridine, 1,2-bis(4-aminophenyl)ethane, diaminobenzanilide, an ester of diaminobenzoic acid, 1,5-diaminonaphthalene, diaminobenzotrifluoride, diaminoanthraquinone, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl) tetradecafluoroheptane, 2,2-bis[4-(3-aminophenoxy)phenyl] hexafluoropropane, 2,2-bis[4-(2-aminophenoxy)phenyl] hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl] hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2-bis[4-(4-amino-3-trifluoromethylphenoxy)phenyl] hexafluoropropane, 3,3',5,5'-tetramethyl-4,4'-diaminobiphenyl, 3,3'-dimethoxy-4,4'-diaminobiphenyl, 4,4'-diamino-2,2'-bis(trifluoromethyl)biphenyl, 2,2',5,5',6,6'-hexafluorotriden, and 4,4'-diaminoquaterphenyl.

Other examples of the compound represented by General Formula (R) include (DA-1) to (DA-18) shown below.

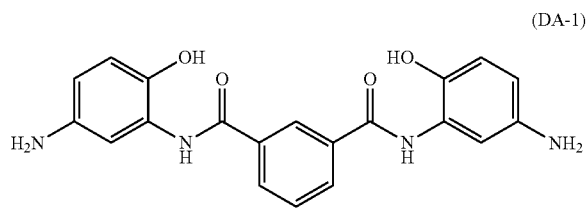
(DA-1)

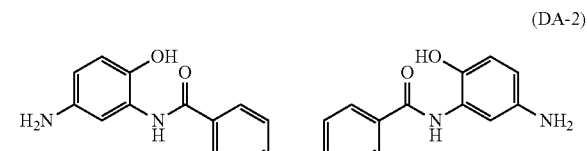
(DA-2)

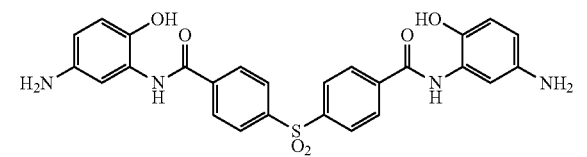
(DA-3)

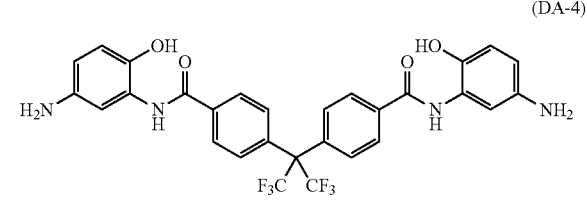
(DA-4)

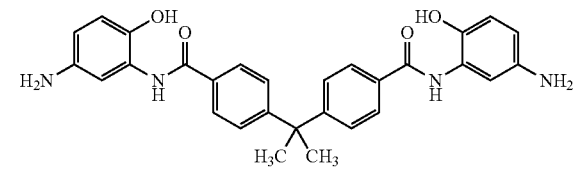
(DA-5)

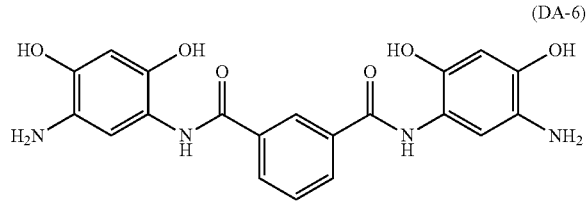
(DA-6)

-continued

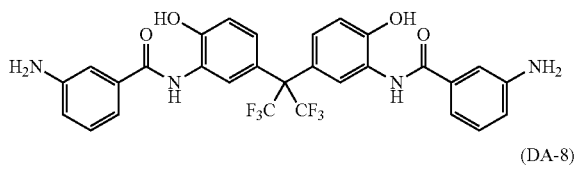
(DA-7)

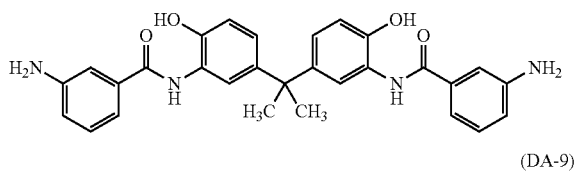
(DA-8)

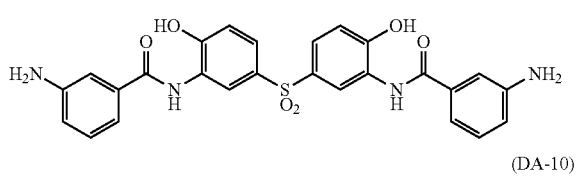
(DA-9)

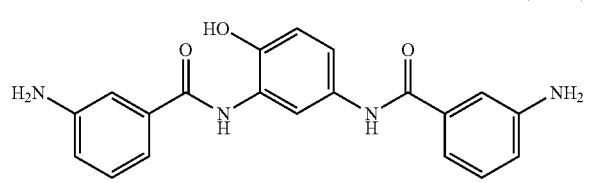
(DA-10)

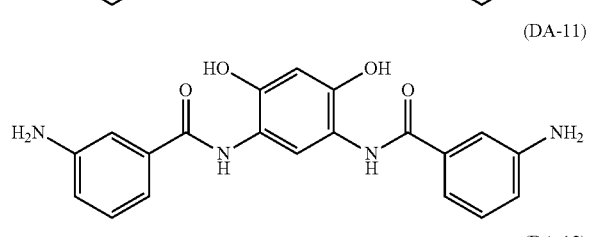
(DA-11)

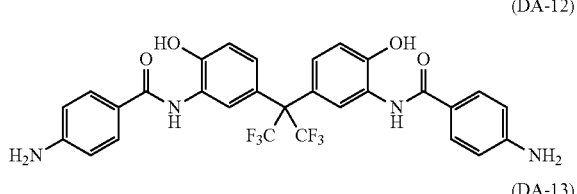
(DA-12)

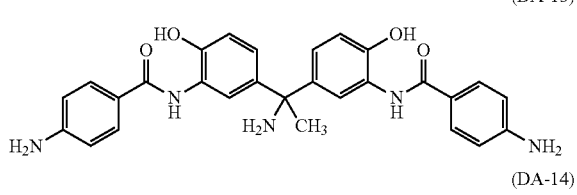
(DA-13)

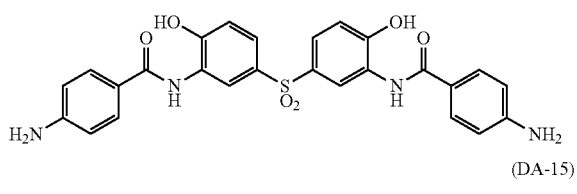
(DA-14)

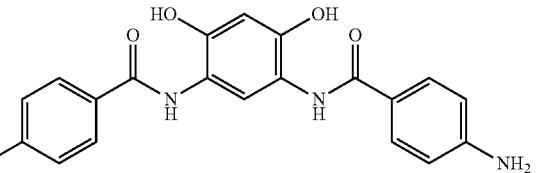
(DA-15)

-continued

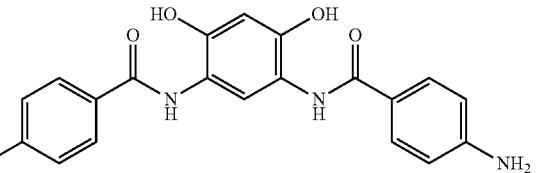
(DA-16)

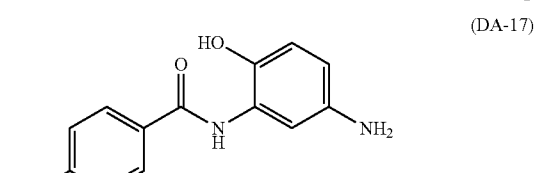
(DA-17)

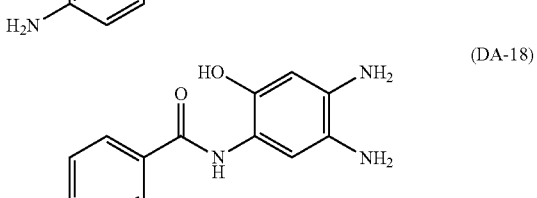
(DA-18)

$R^{111}$ is preferably a diamine residue remaining after removal of an amino group in a diamine below.

1,2-diaminoethane, 1,2-diaminopropane, 1,3-diaminopropane, 1,4-diaminobutane and 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl)methane, bis-(3-aminocyclohexyl)methane; m- and p-phenylenediamine, diaminotoluene, 4,4'- and 3,3'-diaminobiphenyl, 4,4'- and 3,3'-diaminodiphenyl ether, 4,4'- and 3,3'-diaminodiphenylmethane, 4,4'- and 3,3'-diaminodiphenylsulfone, 4,4'- and 3,3'-diaminobenzophenone, 3,3'-dimethyl-4,4'-diaminobiphenyl, 2,2'-dimethyl-4,4'-diaminobiphenyl, 2,2-bis(4-aminophenyl) hexafluoropropane, 2,2-bis(3-hydroxy-4-aminophenyl) propane, 2,2-bis(3-hydroxy-4-aminophenyl) hexafluoropropane, 2,2-bis(3-amino-4-hydroxyphenyl) propane, 2,2-bis(3-amino-4-hydroxyphenyl) hexafluoropropane, bis(3-amino-4-hydroxyphenyl) sulfone, bis(4-amino-3-hydroxyphenyl)sulfone, bis(3-aminopropyl)tetramethyldisiloxane, and 4,4'-diamino-2,2'-bis(trifluoromethyl)biphenyl; and at least one selected from (DA-7), (DA-8), (DA-12), and (DA-13) as mentioned above.

$R^{111}$ is more preferably the following diamine residues remaining after removal of an amino group in a diamine.

p-phenylenediamine, 4,4'-diaminobiphenyl, 4,4'-diaminodiphenyl ether, 2,2-bis(3-amino-4-hydroxyphenyl)propane, 2,2-bis(3-amino-4-hydroxyphenyl)hexafluoropropane, bis (3-amino-4-hydroxyphenyl) sulfone, bis(3-aminopropyl)tetramethyldisiloxane, and 4,4'-diamino-2,2'-bis(trifluoromethyl)biphenyl; and at least one selected from (DA-7), (DA-8), (DA-12), and (DA-13) as mentioned above.

In a case of using an alkali developer as the developer, from the viewpoint of the solubility in a developer, it is preferable that $R^{111}$ has an OH group. More specifically, preferred examples thereof include 2,2-bis(3-hydroxy-4-aminophenyl)propane, 2,2-bis(3-hydroxy-4-aminophenyl) hexafluoropropane, 2,2-bis(3-amino-4-hydroxyphenyl)propane, 2,2-bis(3-amino-4-hydroxyphenyl) hexafluoropropane, bis(3-amino-4-hydroxyphenyl)sulfone, bis(4-amino-3-hydroxyphenyl)sulfone, and (DA-1) to (DA-18) as mentioned above.

The polyimide precursor in the present invention may include other repeating units, in addition to the above repeating units. Examples of the other repeating units include repeating units having different imide precursor structures from that of the repeating units represented by General Formula (1-1), and repeating units having benzoxazole precursor structures.

Furthermore, in the present invention, it is preferable that a repeating unit which is an imide structure precursor other than the repeating units represented by General Formula (1-1) is substantially not included. The expression, being not substantially included, means that the amount accounts for, for example, 5% by mole or less, and further 1% by mole or less in all the repeating units included in the polyimide precursor.

The repeating unit which is a benzoxazole precursor structure is not particularly limited as long as it is a repeating unit capable of becoming benzoxazole, but is preferably compound represented by General Formula (3).

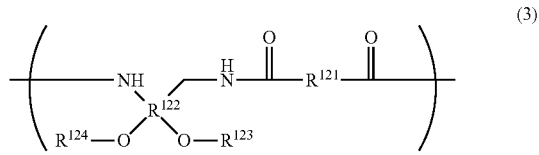

In General Formula (3), $R^{121}$ represents a divalent organic group, and $R^{122}$ represents a tetravalent an organic group, and $R^{123}$ and $R^{124}$ each independently represent a hydrogen atom or a monovalent organic group.

$R^{121}$ represents a divalent organic group. Examples of the divalent organic group include an aliphatic group or an aromatic group.

Examples of the divalent aromatic group include the following groups.

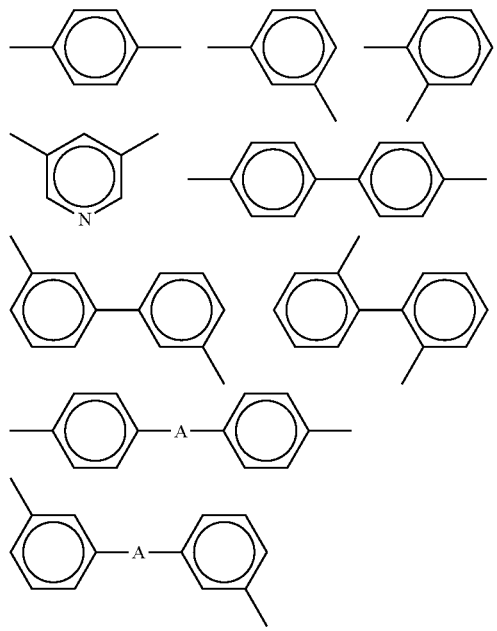

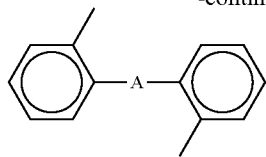

In the formulae, A represents a divalent group selected from the group consisting of $-CH_2-$, $-O-$, $-S-$, $-SO_2-$, $-CO-$, $-NHCO-$, and $-C(CF_3)_2-$.

The divalent aliphatic group is preferably an aliphatic chained structure in a view of promotion of cyclization at a low temperature. The number of carbon atoms of the aliphatic chained group is preferably 2 to 30, more preferably 2 to 25, still more preferably 5 to 20, and particularly preferably 8 to 15. Examples of the dicarboxylic acids having the aliphatic chained group include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimellic acid, 2,2,6,6-tetramethylpimellic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and a dicarboxylic acid represented by the following general formula.

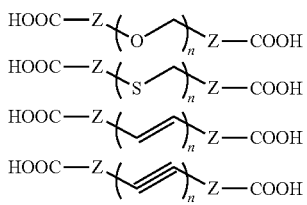

(In the formulae, Z is a hydrocarbon group having 1 to 6 carbon atoms, and n is an integer of 1 to 6.)

$R^{122}$ represents a tetravalent organic group. As the tetravalent organic group, a residue of a bisaminophenol derivative represented by General Formula (A) is preferable.

$$Ar(NH_2)_2(OH)_2 \qquad (A)$$

In the formula, Ar is an aryl group.

Examples of the bisaminophenol derivative of General Formula (A) include 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis(3-amino-4-hydroxyphenyl)methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)hexafluoropropane, bis(4-amino-3-hydroxyphenyl)methane, 2,2-bis(4-amino-3- hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used alone or as a mixture thereof.

Among bisaminophenol derivatives represented by General Formula (A), a bisaminophenol having an aromatic group selected from the following groups is preferable. That is, in a preferred aspect of $R^{111}$, the following groups are exemplified.

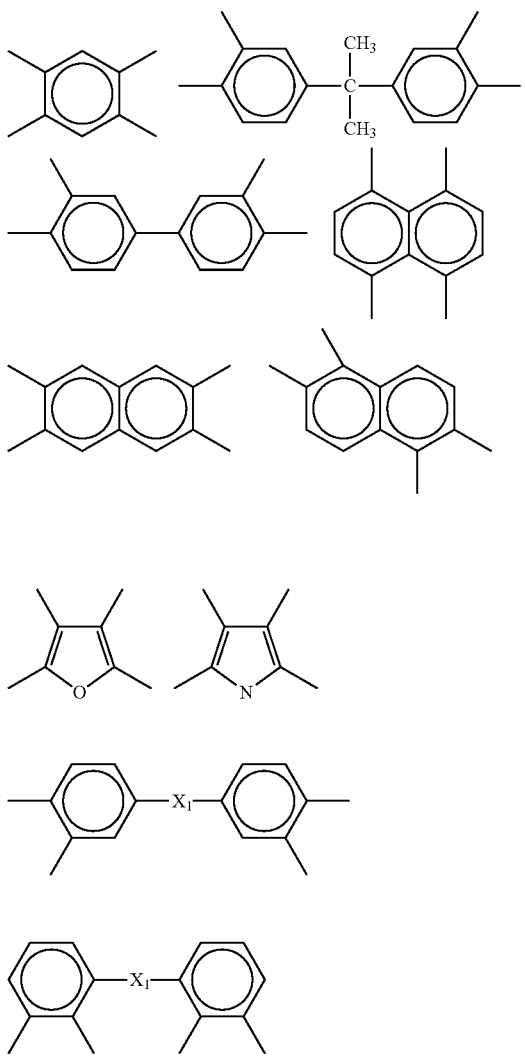

In the formulae, $X_1$ represents —O—, —S—, —C($CF_3$)$_2$—, —$CH_2$—, —$SO_2$—, or —NHCO—. Further, in the structures, —OH and —$NH_2$ contained in the structure of General Formula (A) bind to an ortho position (adjacent position) to each other.

In views of high transparency to an i-line and obtaining a benzoxazole precursor curable at a low temperature, the bisaminophenol derivative of General Formula (A) is preferably a bisphenol represented by General Formula (A-s).

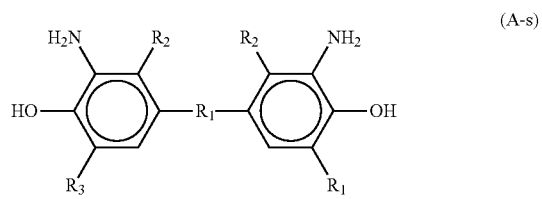

In the formula, $R_1$ is an organic group selected from the group of alkylene, substituted alkylene, —O—, —S—, —$SO_2$—, —CO—, —NHCO—, a single bond, and Formula (A-sc). $R_2$ is any one of an alkyl group, an alkoxy group, an acyloxy group, and a cycloalkyl group, and these may be the same as or different from each other. $R_3$ is any one of a hydrogen atom, an alkyl group, an alkoxy group, an acyloxy group, and a cycloalkyl group, and these may be the same as or different from each other.

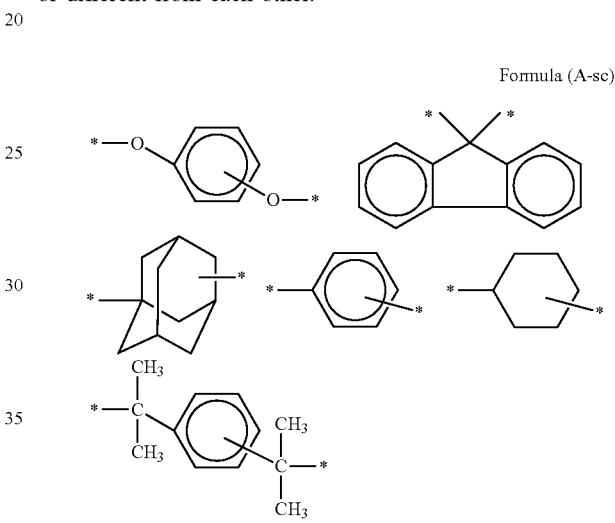

(In the formulae, * indicates a bonding of a bisaminophenol derivative represented by Formula (A-s) to an aromatic ring of an aminophenol group.)

In Formula (A-s), it is considered that a substituent being contained at an ortho position of a phenolic hydroxyl group, that is, at $R_3$ makes the distance between the carbonyl carbon of the amide bond and the hydroxyl group more nearer to each other, and an effect of obtaining a high cyclization rate upon curing at a low temperature is enhanced, which is thus particularly preferable.

Furthermore, in Formula (A-s), it is particularly preferable that $R_2$ is an alkyl group and $R_3$ is an alkyl group in a view of achieving a sufficient solubility in a case of using an aqueous alkali solution for a developer, leading to obtaining a polybenzoxazole precursor having an excellent balance while maintaining effects of high transparency to an i-line and a high cyclization rate upon curing at a low temperature.

Moreover, in Formula (A-s), it is more preferable that $R_1$ is alkylene or substituted alkylene. Specific examples of the alkylene and substituted alkylene for $R_1$ include —$CH_2$—, —CH($CH_3$)—, —C($CH_3$)$_2$—, —CH($CH_2CH_3$)—, —C($CH_3$)($CH_2CH_3$)—, —C($CH_2CH_3$)($CH_2CH_3$)—, —CH($CH_2CH_2CH_3$)—, —C($CH_3$)($CH_2CH_2CH_3$)—, —CH(CH($CH_3$)$_2$)—, —C($CH_3$)(CH($CH_3$)$_2$)—, —CH($CH_2CH_2CH_2CH_3$)—, —C($CH_3$)($CH_2CH_2CH_2CH_3$)—, —CH(CH$_2$CH($CH_3$)$_2$)—, —C($CH_3$)($CH_2$CH($CH_3$)$_2$)—, —CH($CH_2CH_2CH_2CH_2CH_3$)—, —C($CH_3$)

(CH$_2$CH$_2$CH$_2$CH$_2$CH$_3$)—,
(CH$_2$CH$_2$CH$_2$CH$_2$CH$_2$CH$_3$)—, and —CH(CH$_2$CH$_2$CH$_2$CH$_2$CH$_2$CH$_3$)—, and among these, —CH$_2$—, —CH(CH$_3$)—, and —C(CH$_3$)$_2$— are more preferable in a view that a polybenzoxazole precursor with an excellent balance, having a sufficient solubility in not only an aqueous alkali solution but also a solvent, while maintaining effects of high transparency to an i-line and a high cyclization rate upon curing at a low temperature.

For a method for producing the bisaminophenol derivative represented by Formula (A-s), reference can be made to, for example, paragraphs 0085 to 0094 and Example 1 (paragraphs 0189 to 0190) of JP2013-256506A.

Specific examples of the structure of the bisaminophenol derivative represented by Formula (A-s) include, but are not limited to, those described in paragraphs 0070 to 0080 of JP2013-256506A.

Among those, those shown below are preferable as the bisaminophenol derivative represented by Formula (A-s).

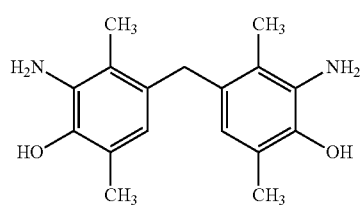
(A-s-1)

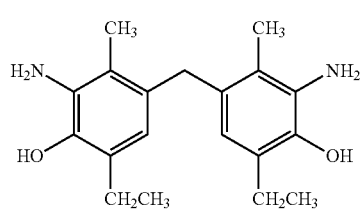
(A-s-2)

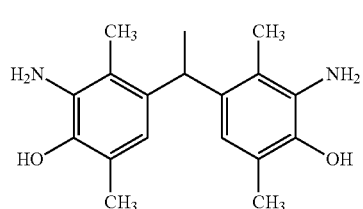
(A-s-3)

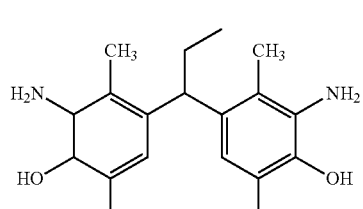
(A-s-4)

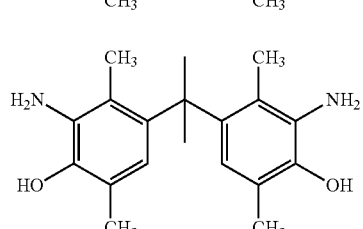
(A-s-5)

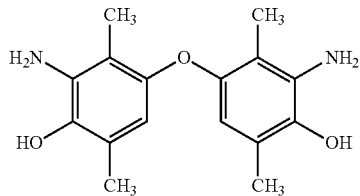
(A-s-6)

$R^{123}$ and $R^{124}$ each represent a hydrogen atom or a monovalent organic group, and in a view that a negative tone photosensitive resin having superior sensitivity and resolution can be obtained, it is preferable that at least one of $R^{123}$ or $R^{124}$ represents a polymerizable group. $R^{123}$ and $R^{124}$ are the same as the above-mentioned aspect for $R^{113}$ and $R^{114}$ in General Formulae (1-1) and (1-2), and a preferred range thereof is also the same.

The polybenzoxazole precursor may include other kinds of repeating structural units, in addition to the repeating structural units of General Formula (3).

In a view that generation of warping accompanying the ring closure can be suppressed, it is preferable that the polybenzoxazole precursor includes other kinds of diamine residues represented by General Formula (SL).

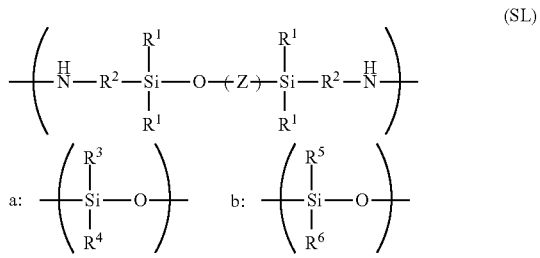
(SL)

In the formulae, Z has a structure a and a structure b, $R^1$ is a hydrogen atom or a hydrocarbon group having 1 to 10 carbon atoms, $R^2$ is a hydrocarbon group having 1 to 10 carbon atoms, at least one of $R^3$, $R^4$, $R^5$, or $R^6$ is an aryl group and the others are each a hydrogen atom or an organic group having 1 to 30 carbon atoms, and these may be the same as or different from each other. The polymerization of the structure a and the structure b may be either block polymerization or random polymerization. The amount in % by mole of the Z moiety is as follows: the structure a accounts for 5% to 95% by mole, the structure b accounts for 95% to 5% by mole, and a+b is 100% by mole.

In Formula (SL), preferred examples of Z include those in which $R^5$ and $R^6$ are each a phenyl group. Further, the molecular weight of the structure represented by Formula (SL) is preferably 400 to 4,000, and more preferably 500 to 3,000. The molecular weight can be generally determined by means of gel permeation chromatography. By setting the molecular weight to the above range, an effect of lowering the modulus of elasticity after dehydration and ring closure of a polybenzoxazole precursor, an effect of suppressing the warping, and an effect of enhancing the solubility can be both satisfied.

In a case where the polyimide precursor in the present invention includes a repeating unit which is a benzoxazole precursor, the content thereof is preferably 30% by mole or less of all the repeating units containing a polyimide precursor.

Furthermore, in the present invention, the polyimide precursor may also be in a form which does not substantially include a repeating unit other than the repeating units represented by General Formula (1-1) and a repeating unit which is another imide precursor. The expression, not substantially include, means that "other repeating units" in all the repeating units included in the polyimide precursor accounts for, for example, 5% by mole or less, and further, 1% by mole or less.

Moreover, in order to further improve the storage stability of the polyimide precursor composition, the polyimide precursor preferably has a terminal of the main chain sealed with a terminal sealing agent such as a monohydric alcohol, a monoamine, an acid anhydride, a monocarboxylic acid, a monoacid chloride compound, and a mono-active ester compound. Among these, the monohydric alcohol or the monoamine is preferably used. As the monohydric alcohol, a monohydric alcohol having 1 to 20 carbon atoms is preferable, and examples thereof include methanol, ethanol, 1-propanol, 2-propanol, 1-butanol, and 2-butanol. Preferred examples of the compound of the monoamine include aniline, 2-ethynylaniline, 3-ethynyl aniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. These may be used in combination of two or more kinds thereof, and a plurality of terminal sealing agents may be reacted to introduce a plurality of other terminal groups.

The weight-average molecular weight (Mw) of the polyimide precursor in the present invention is preferably 1,000 to 100,000, more preferably 3,000 to 50,000, still more preferably 5,000 to 30,000, even still more preferably 10,000 to 30,000, and even further still more preferably 20,000 to 30,000.

The number-average molecular weight (Mn) of the polyimide precursor in the present invention is preferably 4,000 to 20,000, more preferably 5,000 to 10,000, and still more preferably 6,000 to 9,000.

Furthermore, the weight-average molecular weight/number-average molecular weight (Mw/Mn) which is the dispersity of the polyimide precursor in the present invention is preferably 2.0 to 4.0, and more preferably 2.5 to 3.5.

Furthermore, the dispersity in the present invention is a calc. value determined from the measured values of Mw and Mn.

Polyimide precursor compositions in the related art have a high cyclization temperature, and are subject to cyclization by being heated to 300° C. or higher, but according to the present invention, the cyclization reaction can sufficiently proceed by heating to 300° C. or lower (preferably 200° C. or lower, and more preferably 180° C. or lower).

The method for producing a polyimide precursor composition of the present invention is not particularly determined, and a known method can be adopted and used for this. An example thereof may be a method include a step of reacting a compound represented by General Formula (P) with a compound represented by General Formula (Q) to produce a diester or a diamide, and a step of reacting the diester or the diamide with a compound represented by General Formula (R), in which the reaction for producing the diester or the diamide is carried out in a relatively short time. A preferred example thereof may be carrying out the reaction for producing the diester or the diamide for 3 to 10 hours. Here, the time for the reaction for producing the diester or the diamide refers to a time taken from the point of time when the compound represented by General Formula (P) and the compound represented by General Formula (Q) are mixed to the point of time when a step of stopping the reaction for producing the diester or diamine is initiated. As the step of stopping the reaction for producing the diester or the diamide, for example, cooling may be considered. In addition, the temperature for the reaction for producing the diester or the diamide is preferably 40° C. to 80° C., and more preferably 50° C. to 70° C. Incidentally, the cooling is exemplified by cooling to −20° C. to −0° C.

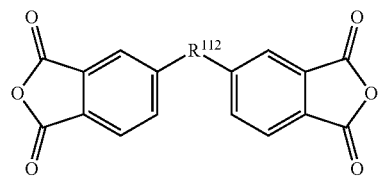

General Formula (P)

In General Formula (P), $R^{112}$ represents a single bond or a divalent organic group.

$$HA^3-R^{115}$$  General Formula (Q)

In General Formula (Q), $A^3$ each independently represent an oxygen atom or NH, and $R^{115}$ represents a monovalent organic group.

$$H_2N-R^{111}-NH_2$$  General Formula (R)

In General Formula (R), $R^{111}$ represents a divalent organic group.

The details of $R^{111}$ to $R^{115}$ are the same as above, and a preferred range thereof is also the same.

The compound represented by General Formula (P), the compound represented by General Formula (Q), and the compound represented by General Formula (R) may be of one kind or of two or more kinds thereof.

<Uses>

The uses of the polyimide precursor composition of the present invention are not particularly determined, and the polyimide precursor composition can be adopted and used in various uses using a polyimide.

In the present invention, particularly, the precursor composition is preferably used after being blended into a positive tone or negative tone photosensitive resin composition, and is more preferably used after being blended into the negative tone photosensitive resin composition.

In addition, the polyimide is strong against heat, and can be thus suitably used as a transparent plastic substrate for a liquid crystal display, an electronic paper, or the like, an automobile part, a heat-resistant paint, a coating, or a film.

<Photosensitive Resin Composition>

The photosensitive resin composition of the present invention includes the polyimide precursor composition of the present invention and a curable compound. The photosensitive resin composition may further include a base generator, a solvent, or the like.

In a case where the photosensitive resin composition is a negative tone photosensitive resin composition, the curable compound is preferably a compound having an ethylenically unsaturated bond. Further, in a case where the photosensitive resin composition is a positive tone photosensitive resin composition, the curable compound is preferably at least one compound selected from a compound having a hydroxymethyl group, an alkoxymethyl group, or an acyloxymethyl group, an epoxy compound, an oxetane compound, and a benzoxazine compound.

In addition, in a case where the photosensitive resin composition is a negative tone photosensitive resin composition, the composition preferably includes a photoradical polymerization initiator, in addition to the compound having an ethylenically unsaturated bond as the curable compound. The photosensitive resin composition may further include a sensitizing agent, a polymerization inhibitor, or the like. In addition, it is needless to say that the photosensitive resin composition may further include other components other than these.

On the other hand, in a case where the photosensitive resin composition is a positive tone photosensitive resin composition, this composition preferably includes a photoacid generator, in addition to at least one compound selected from a compound having a hydroxymethyl group, an alkoxymethyl group, or an acyloxymethyl group, an epoxy compound, an oxetane compound, and a benzoxazine compound as the curable compound. Further, the photosensitive resin composition may include a resin including a phenolic OH group. In addition, it is needless to say that the photosensitive resin composition may further include other components other than these.

The details of these components will be described later.

In the photosensitive resin composition of the present invention, the content of the polyimide precursor composition is preferably 30% to 99% by mass, more preferably 30% to 50% by mass, and still more preferably 30% to 45% by mass, with respect to the total solid content of the photosensitive resin composition.

Furthermore, in the present invention, in addition to the polyimide precursor composition of the present invention, a heterocycle-containing polymer precursor capable of forming a heterocycle-containing polymer when a cyclization reaction is carried out by heating may also be included. Such the heterocycle-containing polymer precursor, at least one selected from a polyimide precursor, a polyamideimide precursor, and a polybenzoxazole precursor, other than the polyimide precursor composition of the present invention, is preferable.

In addition, in the present invention, one embodiment may be configured such that the heterocycle-containing polymer precursor other than the polyimide precursor composition of the present invention is not substantially included. The expression, not being substantially included, means, for example, that the amount of the precursor other than the polyimide precursor including repeating units represented by General Formula (1-1) is 1% by mass or less in all the heterocycle-containing polymer precursors included in the photosensitive resin composition of the present invention.

<<Curable Compound>>

The photosensitive resin composition of the present invention contains a curable compound other than the polyimide precursor. By incorporation of the curable compound, it is possible to form a cured film having superior heat resistance. In addition, patterning can be carried out by a photolithography method.

The curable compound is a compound having curable group, and a known compound capable of undergoing a crosslinking reaction by a radical, an acid, a base, or the like can be used. The term curable group means a group capable of undergoing a crosslinking reaction by actinic rays, radiation, a radical, an acid, or a base, and preferred examples thereof include a group having an ethylenically unsaturated bond, an alkoxymethyl group, a hydroxymethyl group, an acyloxymethyl group, an epoxy group, an oxetanyl group, and a benzoxazolyl group. The compound having an ethylenically unsaturated bond used in the present invention is more preferably a compound having two or more ethylenically unsaturated groups.

The curable compound may be in any of chemical forms, for example, a monomer, a prepolymer, an oligomer, or a mixture thereof, and a multimer thereof.

In the present invention, a curable compound of a monomer type (hereinafter, also referred to as a curable monomer) is a compound different from the polymer compound. The curable monomer is typically a low-molecular weight compound, preferably a low-molecular weight compound having a molecular weight of 2,000 or less, more preferably a low-molecular weight compound having a molecular weight of 1,500 or less, and still more preferably a low-molecular weight compound having a molecular weight of 900 or less. In addition, the molecular weight of the curable monomer is usually 100 or more.

In addition, a curable compound of an oligomer type is typically a polymer having a relatively low molecular weight, and preferably a polymer in which 10 to 100 curable monomers are bonded. The molecular weight thereof is preferably 2,000 to 20,000, more preferably 2,000 to 15,000, and most preferably 2,000 to 10,000, as a weight-average molecular weight in terms of polystyrene by a gel permeation chromatography (GPC) method.

The number of functional groups in a curable compound in the present invention refers to the number of curable groups in one molecule.

From the viewpoint of resolution, the curable compound preferably contains at least one bifunctional or higher-functional curable compound containing two or more curable groups, and more preferably contains at least one trifunctional or higher-functional curable compound.

In addition, in a view of being able to improve heat resistance through the formation of a three-dimensional crosslinked structure, the curable compound in the present invention preferably contains at least one trifunctional or higher-functional curable compound. Further, the curable compound may be a mixture of a bifunctional or lower-functional curable compound and a trifunctional or higher-functional curable compound.

<<<Compound Having Ethylenically Unsaturated Bond>>>

The group having an ethylenically unsaturated bond is preferably a styryl group, a vinyl group, a (meth)acryloyl group, or a (meth)allyl group, and more preferably a (meth)acryloyl group.

Specific examples of the compound having an ethylenically unsaturated bond include an unsaturated carboxylic acid (for example, acrylic acid, methacrylic acid, itaconic acid, crotonic acid, isocrotonic acid, and maleic acid), its esters and amides, and multimers thereof. Esters of an unsaturated carboxylic acid and a polyhydric alcohol compound, amides of an unsaturated carboxylic acid and a polyvalent amine compound, and multimers thereof are preferable. Also, addition reaction products of unsaturated carboxylic esters or amides having a nucleophilic substituent, for example, a hydroxyl group, an amino group, and a mercapto group, with monofunctional or polyfunctional isocyanates or epoxy compounds, and dehydration condensation reaction products with a monofunctional or polyfunctional carboxylic acid are also suitably used. Further, addition reaction products of unsaturated carboxylic esters or amides having an electrophilic substituent, for example, an isocyanate group and an epoxy group, with monofunctional or polyfunctional alcohols, amines or thiols, and substitution reaction products of unsaturated carboxylic esters or amides having a leaving substituent, for example, a halogen group and a tosyloxy group, with monofunctional or polyfunctional alcohols, amines or thiols are also suitable. As other examples, a group of compounds where the unsaturated carboxylic acid described above is replaced by an unsaturated phosphonic acid, a vinylbenzene derivative, for example, styrene, vinyl ether, and allyl ether may also be used.

Specific examples of the monomer, which is an ester of a polyhydric alcohol compound with an unsaturated carboxylic acid, include, as an acrylic ester, ethylene glycol diacrylate, triethylene glycol diacrylate, 1,3-butanediol diacrylate, tetramethylene glycol diacrylate, propylene glycol diacrylate, neopentyl glycol diacrylate, trimethylol propanetriacrylate, trimethylol propanetri(acryloyloxypropyl)ether, trimethylol ethanetriacrylate, hexanediol diacrylate, 1,4-cyclohexanediol diacrylate, tetraethylene glycol diacrylate, pentaerythritol diacrylate, pentaerythritol triacrylate, dipentaerythritol diacrylate, dipentaerythritolhexaacrylate, pentaerythritol tetraacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide-modified triacrylate, and a polyester acrylate oligomer.

Examples of the methacrylic ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxphenyl]dimethylmethane, and bis-[p-(methacryloxyethoxy)phenyl]dimethylmethane.

Examples of the itaconic ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic ester include ethylene glycol dicrotonate, tetramethylene glycol dicrotonate, pentaerythritol dicrotonate, and sorbitol tetradicrotonate.

Examples of the isocrotonic ester include ethylene glycol diisocrotonate, pentaerythritol diisocrotonate, and sorbitol tetraisocrotonate.

Examples of the maleic ester include ethylene glycol dimaleate, triethylene glycol dimaleate, pentaerythritol dimaleate, and sorbitol tetramaleate.

As other examples of the ester, for example, the aliphatic alcohol esters described in JP1971-27926B (JP-S46-27926B), JP1976-47334B (JP-S51-47334B), and JP1982-196231A (JP-S57-196231A), the esters having an aromatic skeleton described in JP1984-5240A (JP-S59-5240A), JP1984-5241A (JP-S59-5241A), and JP1990-226149A (JP-H02-226149A), and the esters containing an amino group described in JP1989-165613A (JP-H01-165613A) are also suitably used.

Furthermore, specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bis-methacrylamide, diethylenetriamine trisacrylamnide, xylylene bisacrylamnide, and xylylene bismethacrylamide Other preferred examples of the amide monomer include those having a cyclohexylene structure described in JP1979-21726B (JP-S54-21726B).

Moreover, urethane-based addition polymerizable monomers produced using an addition reaction between an isocyanate and a hydroxyl group are also suitable, and specific examples thereof include vinylurethane compounds having two or more polymerizable vinyl groups per molecule obtained by adding a vinyl monomer containing a hydroxyl group represented by the following general formula to a polyisocyanate compound having two or more isocyanate groups per molecule, described in JP1973-41708B (JP-S48-41708B).

$CH_2=C(R^4)COOCH_2CH(R^5)OH$ (here, $R^4$ and $R^5$ each represent H or $CH_3$).

In addition, the urethane acrylates as described in JP1976-37193A (JP-S51-37193A), JP1990-32293B (JP-H02-32293B), and JP1990-16765B (JP-H02-16765B), and the urethane compounds having an ethylene oxide skeleton as described in JP1983-49860B (JP-S58-49860B), JP1981-17654B (JP-S56-17654B), JP1987-39417B (JP-S62-39417B), and JP1987-39418B (JP-S62-39418B) are also suitable.

Also, as the compound having an ethylenically unsaturated bond, the compounds described in paragraph Nos. 0095 to 0108 of JP2009-288705A can also be suitably used in the present invention.

Furthermore, the compound having an ethylenically unsaturated bond is also preferably a compound having a boiling point of 100° C. or higher under normal pressure. Examples thereof include a monofunctional acrylate or methacrylate such as polyethylene glycol mono(meth)acrylate, polypropylene glycol mono(meth)acrylate, and phenoxyethyl (meth)acrylate; a polyfunctional acrylate or methacrylate, such as polyethylene glycol di(meth)acrylate, trimethylolethane tri(meth)acrylate, neopentyl glycol di(meth)acrylate, pentaerythritol tri(meth)acrylate, pentacrythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, a compound obtained by adding ethylene oxide or propylene oxide to a polyfunctional alcohol such as glycerin or trimethylolethane, followed by (meth)acrylation, urethane (meth)acrylates as described in JP1973-41708B (JP-S48-41708B), JP1975-6034B (JP-S50-6034B) and JP1976-37193A (JP-S51-37193A), polyester acrylates described in JP1973-64183A (JP-S48-64183A), JP1974-43191B (JP-S49-43191B), and JP1977-30490B (JP-S52-30490B), and epoxy acrylates as a reaction product of an epoxy resin and a (meth)acrylic acid; and a mixture thereof. In addition, the compounds described in paragraph Nos. 0254 to 0257 of JP2008-292970A are also suitable. A polyfunctional (meth)acrylate obtained by reacting a polyfunctional carboxylic acid with a compound having a cyclic ether group and an ethylenically unsaturated bond, such as glycidyl (meth)acrylate, may also be exemplified.

Furthermore, as other preferred compounds having an ethylenically unsaturated bond, compounds having a fluorene ring and containing two or more groups having an ethylenically unsaturated bond described in JP2010-160418A, JP2010-129825A and Japanese Patent No. 4364216, and a cardo resin can also be used.

In addition, as other examples of the compound having an ethylenically unsaturated bond, specific unsaturated compounds described in JP1971-43946B (JP-S46-43946B), JP1989-40337B (JP-H01-40337B) and JP1989-40336B (JP-H01-40336B), and vinylphosphonic acid compounds described in JP1990-25493A (JP-H02-25493A) can also be exemplified. In some cases, a structure containing a perfluoroalkyl group described in JP1986-22048A (JP-S61-22048A) is suitably used. In addition, photocurable monomers or oligomers described in Journal of Japan Adhesiveness Society, Vol. 20, No. 7, pp. 300 to 308 (1984) can also be used.

Moreover, compounds each having an ethylenically unsaturated bond represented by General Formulae (MO-1) to (MO-5) can also be suitably used. Further, in the formulae, in a case where T is an oxyalkylene group, the terminal on the carbon atom side thereof is bonded to R.

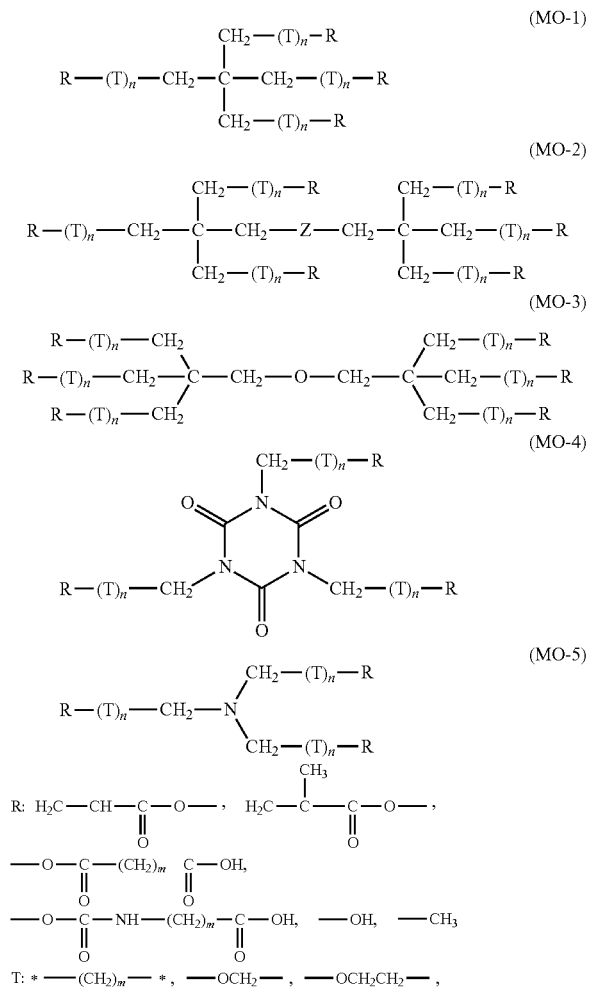

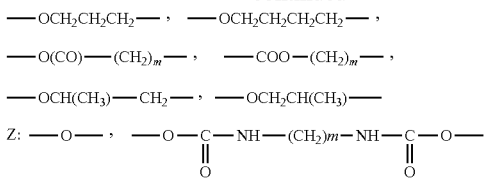

In the general formulae, n is an integer of 0 to 14 and in is an integer of 1 to 8. In a case where a plurality of R's or a plurality of T's are present in one molecule, a plurality of R's or a plurality of T's may be the same as or different from each other.

In each of the polymerizable compounds represented by General Formulae (MO-1) to (MO-5), at least one of a plurality of R's represents a group represented by —OC(=O)CH=CH$_2$ or —OC(=O)C(CH$_3$)=CH$_2$.

As to specific examples of the compounds having an ethylenically unsaturated bond represented by General Formulae (MO-1) to (MO-5), the compounds described in paragraph Nos. 0248 to 0251 of JP2007-269779A can also be suitably used in the present invention.

Furthermore, the compounds obtained by adding ethylene oxide or propylene oxide to a polyfunctional alcohol and then (meth)acrylating the adduct, described as General Formulae (1) and (2) together with their specific examples in JP1998-62986A (IP-H10-62986A), can also be used as the polymerizable compound.

Preferred examples of the compound having an ethylenically unsaturated bond include dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as a commercially available product, KAYARAD DPHA, manufactured by Nippon Kayaku Co., Ltd.), and structures in which the (meth)acryloyl group of the compounds described above are connected through ethylene glycol or propylene glycol residue. Oligomer types of these compounds can also be used.

The compound having an ethylenically unsaturated bond may be a polyfunctional monomer having an acid group such as a carboxyl group, a sulfonic acid group or a phosphoric acid group. The polyfunctional monomer having an acid group is preferably an ester of an aliphatic polyhydroxy compound and an unsaturated carboxylic acid, more preferably a polyfunctional monomer which is obtained by reacting a non-aromatic carboxylic anhydride with an unreacted hydroxyl group of the aliphatic polyhydroxy compound to introduce the acid group, and particularly preferably the ester described above where the aliphatic polyhydroxy compound is pentaerythritol and/or dipentaerythritol. Examples of the commercially available product thereof include M-510 and M-520, as polybasic acid-modified acryl oligomers manufactured by Toagosei Co., Ltd.

The polyfunctional monomers having an acid group may be used alone or in combination of two or more kinds thereof. Further, a polyfunctional monomer having no acid group and a polyfunctional monomer having an acid group may be used in combination, if desired.

The acid value of the polyfunctional monomer having an acid group is preferably 0.1 to 40 mgKOH/g, and particularly preferably 5 to 30 mgKOH/g. If the acid value of the polyfunctional monomer is within the above range, the production or handleability thereof becomes excellent and furthermore, developability becomes excellent. In addition, curability is favorable.

The compound having an ethylenically unsaturated bond can also employ a compound having a caprolactone structure.

The compound having a caprolactone structure and an ethylenically unsaturated bond is not particularly limited as long as it has a caprolactone structure in the molecule thereof, and examples thereof include an ε-caprolactone-modified polyfunctional (meth)acrylate obtained by esterification of a polyhydric alcohol, for example, trimethylolethane, ditrimethylolethane, trimethylolpropane, ditrimethylolpropane, pentaerythritol, dipentaerythritol, tripentaerythritol, glycerin, diglycerol or trimethylolmelamine with (meth)acrylic acid and ε-caprolactone. Among those, preferred is a polymerizable compound having a caprolactone structure represented by General Formula (C).

General Formula (C)

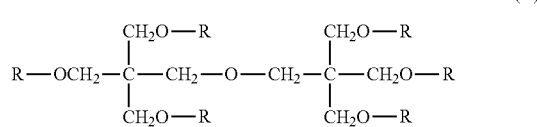

(In the formula, all of six R's are a group represented by General Formula (D), or one to five of six R's are a group represented by General Formula (D) and the remainder is a group represented by General Formula (E).)

General Formula (D)

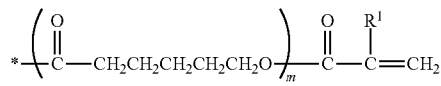

(In the formula, $R^1$ represents a hydrogen atom or a methyl group, m represents the number of 1 or 2, and "*" represents a bonding arm.)

General Formula (E)

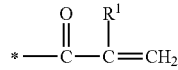

(In the formula, $R^1$ represents a hydrogen atom or a methyl group, and "*" represents a bonding arm.)

The polymerizable compound having a caprolactone structure is commercially available as KAYARAD DPCA Series from Nippon Kayaku Co., Ltd. and includes DPCA-20 (compound represented by General Formulae (C) to (E), in which m is 1, the number of the group represented by General Formula (D) is 2, and all of $R^1$ are a hydrogen atom), DPCA-30 (compound represented by General Formulae (C) to (E), in which m is 1, the number of the group represented by General Formula (D) is 3, and all of $R^1$ are a hydrogen atom), DPCA-60 (compound represented by General Formulae (C) to (E), in which m is 1, the number of the group represented by General Formula (D) is 6, and all of $R^1$ are a hydrogen atom), and DPCA-120 (compound represented by General Formulae (C) to (E), in which m is 2, the number of the group represented by General Formula (D) is 6, and all of $R^1$ are a hydrogen atom).

In the present invention, the compound having an ethylenically unsaturated bond having a caprolactone structure may be used alone or in combination of two or more kinds thereof.

The compound having an ethylenically unsaturated bond is also preferably at least one selected from the group of compounds represented by General Formula (i) or (ii).

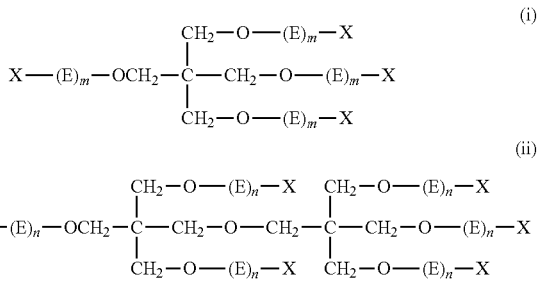

In General Formulae (i) and (ii), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In General Formula (i), the total number of (meth)acryloyl groups is 3 or 4, m's each independently represent an integer of 0 to 10, and the total of the respective m's is an integer of 0 to 40, provided that in a case where the total number of each m is 0, any one of X's is a carboxyl group.

In General Formula (ii), the total number of (meth) acryloyl groups is 5 or 6, n's each independently represent an integer of 0 to 10, and the total number of each n is an integer of 0 to 60, provided that in a case where the total number of each n is 0, any one of X's is a carboxyl group.

In General Formula (i), m is preferably an integer of 0 to 6, and more preferably an integer of 0 to 4.

The total of the respective m's is preferably an integer of 2 to 40, more preferably an integer of 2 to 16, and particularly preferably an integer of 4 to 8.

In General Formula (ii), n is preferably an integer of 0 to 6, and more preferably an integer of 0 to 4.

The total of the respective n's is preferably an integer of 3 to 60, more preferably an integer of 3 to 24, and particularly preferably an integer of 6 to 12.

An aspect in which in $-((CH_2)_yCH_2O)-$ or $-((CH_2)_yCH(CH_3)O)-$ in General Formula (i) or (ii), the terminal on the oxygen atom side is bonded to X is preferable. In particular, an aspect in which all of six X's in General Formula (ii) are acryloyl groups is preferable.

The compound represented by General Formula (i) or (ii) can be synthesized through a step of connecting a ring-opened skeleton of ethylene oxide or propylene oxide to pentaerythritol or dipentaerythritol by a ring-opening addition reaction, and a step of introducing a (meth)acryloyl group into the terminal hydroxyl group of the ring-opened skeleton by reacting, for example, (meth)acryloyl chloride, which are steps known in the related art. Each step is a well-known step and the compound represented by General Formula (i) or (ii) can be easily synthesized by a person skilled in the art.

Among the compounds represented by General Formulae (i) and (ii), a pentaerythritol derivative and/or a dipentaerythritol derivative is/are more preferable.

Specific examples of the compounds include compounds represented by Formulae (a) to (f) (hereinafter also referred to as "Exemplary Compounds (a) to (f)"). Among those, Exemplary Compounds (a), (b), (e), and (f) are preferable.

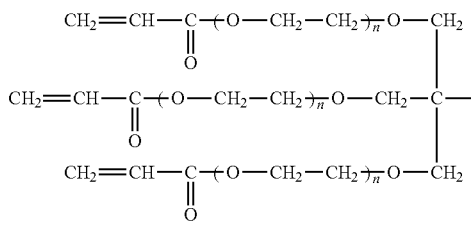 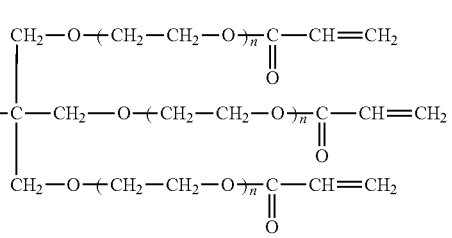

(a)

(the sum of the respective n's is 6)

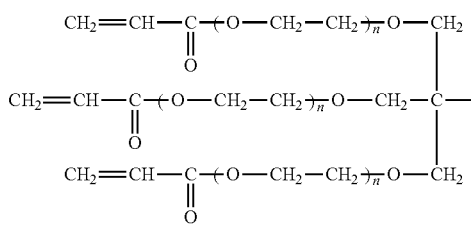 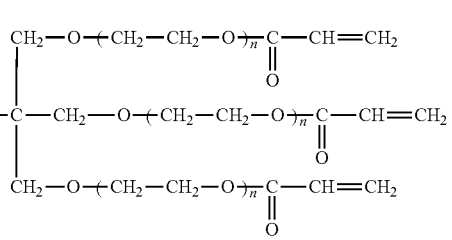

(b)

(the sum of the respective n's is 12)

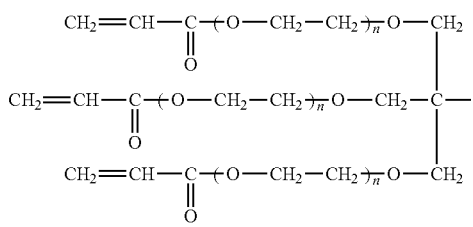 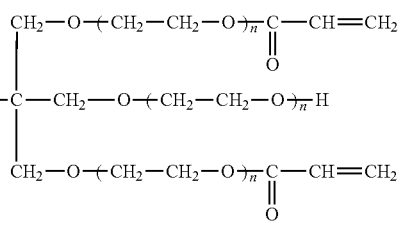

(c)

(the sum of the respective n's is 12)

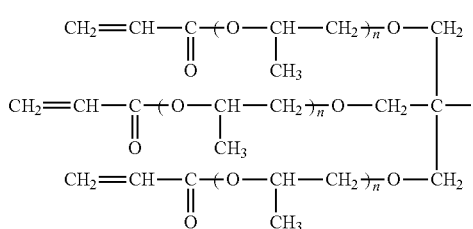 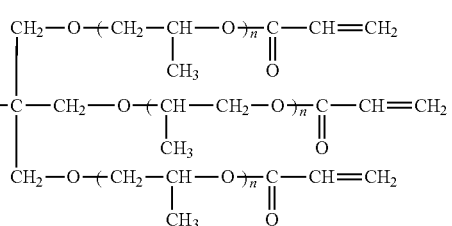

(d)

(the sum of the respective n's is 6)

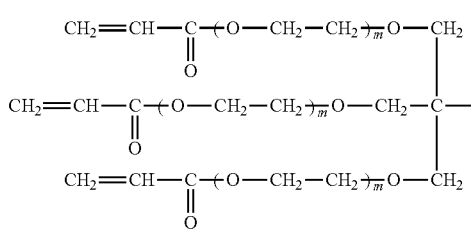

(e)

(the sum of the respective m's is 4)

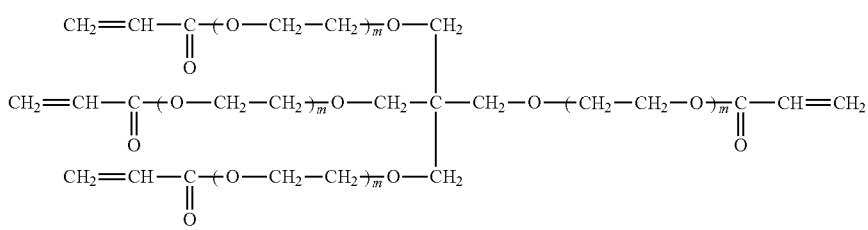

(the sum of the respective m's is 12)

Examples of commercially available products of the polymerizable compounds represented by General Formulae (i) and (ii) include SR-494, which is a tetrafunctional acrylate having four ethyleneoxy chains, manufactured by Sartomer Company, and DPCA-60, which is a hexafunctional acrylate having six pentyleneoxy chains and TPA-330, which is a trifunctional acrylate having three isobutyleneoxy chains, both manufactured by Nippon Kayaku Co., Ltd.

Furthermore, urethane acrylates as described in JP1973-41708B (JP-S48-41708B), JP1976-37193A (JP-S51-37193A), JP1990-32293B (JP-H02-32293B), and JP1990-16765B (JP-H02-16765B), and urethane compounds having an ethylene oxide skeleton described in JP1983-49860B (JP-S58-49860B), JP1981-17654B (JP-S56-17654B), JP1987-39417B (JP-S62-39417B) and JP1987-39418B (JP-S62-39418B) are also suitable as the compound having an ethylenically unsaturated bond. In addition, addition-polymerizable monomers having an amino structure or a sulfide structure in the molecule thereof described in JP 1988-277653A (JP-S63-277653A), JP1988-260909A (JP-S63-260909A) and JP1989-105238A (JP-H01-105238A) may also be used as the compound having an ethylenically unsaturated bond.

Examples of commercially available products of the compound having an ethylenically unsaturated bond include Urethane Oligomers UAS-10 and UAB-140 (manufactured by Sanyo Kokusaku Pulp Co., Ltd.), NK Ester M-40G, NK Ester 4G. NK Ester M-9300, NK Ester A-9300, and UA-7200 (manufactured by Shin-Nakamura Chemical Co, Ltd.), DPHA-4011 (manufactured by Nippon Kayaku Co., Ltd.), UA-306H, UA-306T, UA-3061, AH-600, T-600, and AI-600 (manufactured by Kyoeisha Chemical Co., Ltd.), and BLEMMER PME400 (manufactured by NOF Co., Ltd.).

From the viewpoint of heat resistance, the compound having an ethylenically unsaturated bond preferably has a partial structure represented by the following formula. Here, * in the formula is a bonding arm.

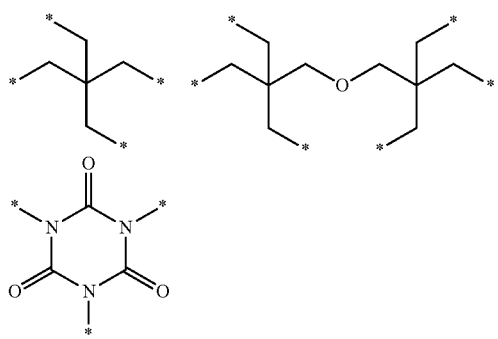

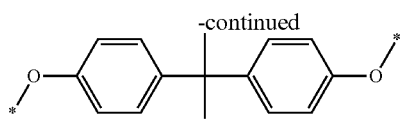

Specific examples of the compound having an ethylenically unsaturated bond having a partial structure include trimethylolpropane tri(meth)acrylate, isocyanuric acid ethylene oxide-modified di(meth)acrylate, isocyanuric acid ethylene oxide-modified tri(meth)acrylate, pentaerythritol tri(meth)acrylate, pentaerythritol tetra(meth)acrylate, dimethylolpropane tetra(meth)acrylate, dipentaerythritol penta(meth)acrylate, dipentaerythritol hexa(meth)acrylate, and tetramethylolmethane tetra(meth)acrylate.

From the viewpoints of good curability and heat resistance, the content of the compound having an ethylenically unsaturated bond in the photosensitive resin composition is preferably 1% to 50% by mass with respect to the total solid content of the photosensitive resin composition. The lower limit is more preferably 5% by mass or more. The upper limit is more preferably 30% by mass or less. The compounds having an ethylenically unsaturated bond may be used alone or in combination of two or more kinds thereof.

Furthermore, the mass ratio of the polyimide precursor to the compound having an ethylenically unsaturated bond (polyimide precursor/polymerizable compound) is preferably 98/2 to 10/90, more preferably 95/5 to 30/70, and most preferably 90/10 to 50/50. If the mass ratio of the polyimide precursor to the compound having an ethylenically unsaturated bond is within the above range, a cured film having excellent curability and heat resistance can be formed.

<<<Compound Having Hydroxymethyl Group, Alkoxymethyl Group, or Acyloxymethyl Group>>>

The compound having a hydroxymethyl group, an alkoxymethyl group, or an acyloxymethyl group is preferably a compound represented by General Formula (AM1).

$$R^4 \!-\!\!\left(CH_2\!-\!R^5\right)_t \tag{AM1}$$

(In the formula, t represents an integer of 1 to 20, $R^4$ represents a t-valent organic group having 1 to 200 carbon atoms, and $R^5$ represents a group represented by General Formula (AM2) or (AM3).)

$$-\!OR^6, \tag{AM2}$$

-continued

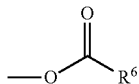
(AM3)

(In the formulae, $R^6$ represents a hydroxyl group or an organic group having 1 to 10 carbon atoms.)

The amount of the compound represented by General Formula (AM1) is preferably from 5 parts by mass to 40 parts by mass, and preferably from 10 parts by mass to 35 parts by mass, with respect to 100 parts by mass of the polyimide precursor. In addition, it is preferable that the amount of a compound represented by General Formula (AM4) in the entire curable compound is from 10% by mass to 90% by mass, and the amount of a compound represented by General Formula (AM5) in the entire thermal crosslinking agent is from 10% by mass to 90% by mass.

(AM4)

(In the formula, $R^4$ represents a divalent organic group having 1 to 200 carbon atoms, and $R^5$ represents a group represented by General Formula (AM2) or (AM3).)

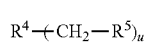
(AM5)

(In the formula, u represents an integer of 3 to 8, $R^4$ represents an u-valent organic group having 1 to 200 carbon atoms, and $R^5$ represents a group represented by General Formula (AM2) or (AM3).)

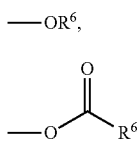
—$OR^6$, (AM2)

(AM3)

(In the formula, $R^6$ represents a hydroxyl group or an organic group having 1 to 10 carbon atoms.)

When a photosensitive resin composition is formed on a substrate having concaves and convexes by using these compounds, generation of cracks is further reduced. Further, the pattern processability is excellent, and high heat resistance with a 5%-mass reduction temperature of 350° C. or higher, and more preferably 380° C. or higher can be attained. Specific examples of the compound represented by General Formula (AM4) include 46DMOC and 46DMOEP (both trade names, manufactured by Asahi Organic Chemicals Industry Co., Ltd.), DML-MBPC, DML-MBOC, DML-OCHP, DML-PCHP, DML-PC, DML-PTBP, DML-34X, DML-EP, DML-POP, dimethyol BisOC-P, DML-PFP, DML-PSBP, and DML-MTrisPC (all trade names, manufactured by Honshu Chemical Industry Co., Ltd.), NIKALAC MX-290 (trade name, manufactured by Sanwa Chemical Co., Ltd.), 2,6-dimethoxymethyl-4-t-buthylphenol, 2,6-dimethoxymethyl-p-cresol, and 2,6-diacetoxymethyl-p-cresol.

In addition, specific examples of the compound represented by General Formula (AM5) include TriML-P, TriML-35XL, TML-HQ, TML-BP, TML-pp-BPF, TML-BPA, TMOM-BP, HML-TPPHBA, HML-TPHAP, HMOM-TPPHBA, and HMOM-TPHAP (all trade names, manufactured by Honshu Chemical Industry Co., Ltd.), TM-BIP-A (trade name, manufactured by Asahi Organic Chemicals Industry Co., Ltd.), and NIKALAC MX-280, NIKALAC MX-270, and NIKALACMW-100LM (all trade names, manufactured by Sanwa Chemical Co., Ltd.).

<<<Epoxy Compound (Compound Having Epoxy Group)>>>

The epoxy compound is preferably a compound having 2 or more epoxy groups within one molecule. The epoxy group undergoes a crosslinking reaction at 200° C. or lower, but does not undergo a dehydration reaction accompanying the crosslinking, and therefore, film shrinkage hardly occurs. As a result, incorporation of the epoxy compound is effective for reduction in curing at a low temperature and warping of the photosensitive resin composition.

The epoxy compound preferably contains a polyethylene oxide group. Thus, the modulus of elasticity is further reduced, and the warping is also further reduced. Further, since the flexibility is high, a cured film having excellent elongation or the like can be obtained. The polyethylene oxide group means that it has the number of the repeating units of ethylene oxide of 2 or more, with the number of the repeating units of 2 to 15 being preferable.

Preferred examples of the epoxy compound include, but are not limited to, a bisphenol A type epoxy resin; a bisphenol F type epoxy resin; an alkylene glycol type epoxy resin such as propylene glycol diglycidyl ether; a polyalkylene glycol type epoxy resin such as polypropylene glycol diglycidyl ether; and an epoxy group-containing silicone such as polymethyl(glycidyloxypropyl)siloxane. Specific examples thereof include EPICLON (registered trademark) 850-S, EPICLON (registered trademark) HP-4032, EPICLON (registered trademark) HP-7200, EPICLON (registered trademark) HP-820, EPICLON (registered trademark) HP-4700, EPICLON (registered trademark) EXA-4710, EPICLON (registered trademark) HP-4770, EPICLON (registered trademark) EXA-859CRP, EPICLON (registered trademark) EXA-1514, EPICLON (registered trademark) EXA-4880, EPICLON (registered trademark) EXA-4850-150, EPICLON EXA-4850-1000, EPICLON (registered trademark) EXA-4816, and EPICLON (registered trademark) EXA-4822 (all trade names, manufactured by Dainippon Ink and Chemicals, Inc.), RIKARESIN (registered trademark) BEO-60E (trade name, manufactured by New Japan Chemical Co., Ltd.), and EP-4003S and EP-4000S (both trade names, manufactured by ADEKA Corporation). Among these, the polyethylene oxide group-containing epoxy resin is preferable in a view that it is excellent in reduction in warping, and in heat resistance. For example, EPICLON (registered trademark) EXA-4880, EPICLON (registered trademark) EXA-4822, and RIKARESIN (registered trademark) BEO-60E are preferable since they each contain a polyethylene oxide group.

The blend amount of the epoxy compound is preferably 5 to 50 parts by mass, more preferably 10 to 50 parts by mass, and still more preferably 10 to 40 parts by mass, with respect to 100 parts by mass of the polyimide precursor. If the blend amount is 5 parts by mass or more, the warping of the cured film can be further suppressed, and if the blend amount is 50 parts by mass or less, pattern embedment at a reflow during curing can be further suppressed.

<<<Oxetane Compound (Compound Having Oxetanyl Group)>>>

The oxetane compound is a compound having two or more oxetane rings within one molecule, and examples thereof include 3-ethyl-3-hydroxymethyl oxetane, 1,4-bis{[(3-ethyl-3-oxetanyl)methoxy]methyl}benzene, 3-ethyl-3-(2-ethylhexylmethyl)oxetane, and 1,4-benzenedicarboxylic acid-bis[(3-ethyl-3-oxetanyl)methyl] ester. As specific examples thereof, ARON Oxetane series (for example, OXT-121, OXT-221, OXT-191, and OXT-223) manufactured by Toagosei Chemical Industry Co., Ltd. can be suitably used, and these may be used alone or as a mixture of two or more kinds thereof.

The blend amount of the oxetane compound is preferably 5 to 50 parts by mass, more preferably 10 to 50 parts by mass, and still more preferably 10 to 40 parts by mass, with respect to 100 parts by mass of the polyimide precursor.

<<<Benzoxazine Compound (Compound Having Benzoxazolyl Group)>>>

The benzoxazine compound undergoes a crosslinking reaction due to a side reaction of ring opening, and therefore, degassing which accompanies the curing does not occur and the shrinkage due to heat is small. As a result, it is preferable to use the benzoxazine compound in a view that occurrence of the warping is suppressed.

Preferred examples of the benzoxazine compound include a B-a type benzoxazine and a B-m type benzoxazine (both trade names, manufactured by Shikoku Chemicals Corporation), a benzoxazine adduct of a polyhydroxystyrene resin, and a phenol Novolac type dihydrobenzoxazine compound. These may be used alone or as a mixture of two or more kinds thereof.

The blend amount of the benzoxazine compound is preferably 5 to 50 parts by mass, more preferably 10 to 50 parts by mass, and still more preferably 10 to 40 parts by mass, with respect to 100 parts by mass of the polyimide precursor.

<<Thermal Base Generator>>

The photosensitive resin composition of the present invention may include a thermal base generator.

The kind of the thermal base generator is not particularly determined, but it is preferable to include a thermal base generator including at least one selected from an acidic compound which generates a base upon heating to 40° C. or higher, and an ammonium salt having an anion with a pKa1 of 0 to 4 and an ammonium cation. Here, the pKa1 indicates a logarithm expression ($-\mathrm{Log}_{10}\mathrm{Ka}$) of a dissociation constant (Ka) of the first proton of a polyvalent acid.

By blending such a compound, the cyclization reaction of the polyimide precursor can be carried out at a low temperature, and further, a photosensitive resin composition having superior stability can be obtained. In addition, the thermal base generator does not generate a base when not being heated, and therefore, even in the coexistence with the polyimide precursor, the cyclization of the polyimide precursor in the storage can be suppressed, contributing to storage stability.

The thermal base generator in the present invention includes at least one selected from an acidic compound (A1) which generates a base upon heating to 40° C. or higher, and ammonium salt (A2) having an anion with a pKa1 of 0 to 4 and an ammonium cation.

Since the acidic compound (A1) and the ammonium salt (A2) generate a base upon heating, the cyclization reaction of a polyimide precursor can be promoted by the action of a base generated from these compounds, and therefore cyclization of the polyimide precursor can be carried out at a low temperature. In addition, since even in a case where these compounds are present together with a polyimide precursor which is cyclized to be cured by the action of a base, cyclization of the polyimide precursor hardly proceeds without heating, it is possible to prepare a polyimide precursor composition having excellent stability.

In addition, in the present specification, the term of an acidic compound means a compound having a pH value of less than 7 measured at 20° C. using a pH meter, by such a manner that 1 g of a compound is collected in a container, 50 mL of a mixed liquid of deionized water and tetrahydrofuran (mass ratio: water/tetrahydrofuran=1/4) is added thereto, followed by stirring at room temperature for 1 hour, and a pH value of the resulting solution is measured.

In the present invention, the base generating temperature of the acidic compound (A1) and the ammonium salt (A2) is preferably 40° C. or higher, and more preferably 120° C. to 200° C. The upper limit of the base generating temperature is preferably 190° C. or lower, more preferably 180° C. or lower, and still more preferably 165° C. or lower. The lower limit of the base generating temperature is preferably 130° C. or higher, and more preferably 135° C. or higher.

If the base generating temperature of the acidic compound (A1) and the ammonium salt (A2) is 120° C. or higher, the base is so unlikely to occur during storage, and therefore it is possible to prepare a polyimide precursor composition having excellent stability. If the base generating temperature of the acidic compound (A1) and the ammonium salt (A2) is 200° C. or lower, it is possible to decrease the temperature for cyclization of a polyimide precursor. The base generating temperature may be measured, for example, by heating a compound to 250° C. at a rate of 5° C./minute in a pressure-resistant capsule, reading a peak temperature of an exothermic peak having the lowest temperature, and taking the peak temperature as a base generating temperature, using differential scanning calorimetry.

In the present invention, the base generated by a thermal base generator is preferably a secondary amine or a tertiary amine, and more preferably a tertiary amine. Since the tertiary amine has high basicity, the temperature for cyclization of a polyimide precursor resin can be further decreased. In addition, the boiling point of the base generated by a thermal base generator is preferably 80° C. or higher, more preferably 100° C. or higher, and most preferably 140° C. or higher. Further, the molecular weight of the base generated is preferably 80 to 2,000. The lower limit is more preferably 100 or more. The upper limit is more preferably 500 or less. In addition, the value of the molecular weight is a theoretical value calculated from the structural formula.

In the present invention, the acidic compound (A1) preferably includes one or more selected from an ammonium salt and a compound represented by General Formula (1) which will be described later.

In the present invention, the ammonium salt (A2) is preferably an acidic compound. The ammonium salt (A2) may be a compound containing an acidic compound which generates a base upon heating to 40° C. or higher (preferably 120° C. to 200° C.), or may be a compound other than an acidic compound which generates a base upon heating to 40° C. or higher (preferably 120° C. to 200° C.).

<<Ammonium Salt>>

In the present invention, the term of an ammonium salt means a salt of an ammonium cation represented by Formula (1) or (2) with an anion. The anion may be bonded via a covalent bond to any portion of the ammonium cation, or may also be contained outside the molecule of the ammonium cation. The anion is preferably present outside the molecule of the ammonium cation. The expression of the anion being present outside the molecule of the ammonium cation refers to a case where an ammonium cation and an anion are not bonded via a covalent bond. Hereinafter, an anion outside the molecule of the cation moiety is also referred to as a counter anion.

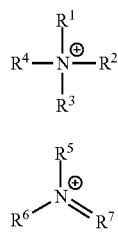

(1)

(2)

In the formula, $R^1$ to $R^6$ in each independently represent a hydrogen atom or a hydrocarbon group, and $R^7$ represents a hydrocarbon group. $R^1$ and $R^2$, $R^3$ and $R^4$, $R^5$ and $R^6$, and $R^5$ and $R^7$ may be bonded to each other to form a ring.

In the present invention, the ammonium salt preferably has an anion having a pKa1 of 0 to 4 and an ammonium cation. The upper limit of pKa1 of the anion is more preferably 3.5 or less, and still more preferably 3.2 or less. The lower limit is preferably 0.5 or more, and more preferably 1.0 or more. If a pKa1 of the anion is within the above range, a polyimide precursor can be cyclized at a low temperature and further, stability of a polyimide precursor composition can be improved. If the pKa1 is 4 or less, stability of a thermal base generator is good and a base being generated without heating can be suppressed, so stability of a polyimide precursor composition is good. If the pKa1 is 0 or more, the generated base is hardly neutralized and cyclization efficiency of a polyimide precursor is satisfactory.

The type of an anion is preferably one selected from a carboxylate anion, a phenol anion, a phosphoric acid anion and a sulfuric acid anion. More preferred is a carboxylate anion for a reason that it is possible for stability and thermal decomposition of a salt to be compatible. That is, the ammonium salt is more preferably a salt of an ammonium cation with a carboxylate anion.

The carboxylate anion is preferably a divalent or higher-valent anion of carboxylic acid having two or more carboxyl groups, and more preferably a divalent anion of carboxylic acid. According to this aspect, it is possible to obtain a thermal base generator capable of further improving stability, curability and developability of a polyimide precursor composition. In particular, the stability, curability, and developability of a polyimide precursor composition can be further improved by using a divalent anion of carboxylic acid.

In the present invention, the carboxylate anion is preferably an anion of carboxylic acid having a pKa1 of 4 or less. The pKa1 is more preferably 3.5 or less, and still more preferably 3.2 or less. According to this aspect, the stability of a polyimide precursor composition can be further improved.

Here, the pKa1 represents the logarithm of a reciprocal number of a first dissociation constant of an acid, and it is possible to refer to the values described in Determination of Organic Structures by Physical Methods (written by Brown, H. C., McDaniel, D. H., Hafliger, O., Nachod, F. C.; edited by Braude, E. A., Nachod, F. C.; Academic Press, New York, 1955), or Data for Biochemical Research (written by Dawson, R. M. C. et al.; Oxford, Clarendon Press, 1959). For compounds not listed in these documents, the value calculated from the structural formula using the software ACD/pKa (manufactured by ACD/Labs) shall be used as the pKa1.

In the present invention, the carboxylate anion is preferably represented by Formula (XI).

(XI)

In Formula (X1), EWG represents an electron-withdrawing group.

The term "electron-withdrawing group" in the present invention means that a Hammett's substituent constant (yin is a positive value. Here, the am is described in detail in the review by TSUNO Yuho, Journal of the Society of Synthetic Organic Chemistry, Japan, Vol. 23, No. 8 (1965), pp 631 to 642. In addition, the electron-withdrawing group of the present invention is not limited to the substituents described in the abovementioned document.

Examples of the substituent having a σm of a positive value include a $CF_3$ group (σm=0.43), a $CF_3CO$ group (σm=0.63), a HC≡C group (σm=0.21.), a $CH_2$=CH group (σm=0.06), an Ac group (σm=0.38), a MeOCO group (σm=0.37), a MeCOCH=CH group (σm=0.21), a PhCO group (σm=0.34), and a $H_2NCOCH_2$ group (σm=0.06). Incidentally, Me represents a methyl group, Ac represents an acetyl group, and Ph represents a phenyl group.

In the present invention, EWG preferably represents a group represented by General Formulae (EWG-1) to (EWG-6).

(EWG-1)

(EWG-2)

(EWG-3)

(EWG-4)

(EWG-5)

(EWG-6)

In the formula, $R^{x1}$ to $R^{x3}$ each independently represent a hydrogen atom, an alkyl group, an alkenyl group, an aryl group, a hydroxyl group, or a carboxyl group, and Ar represents an aromatic ring group.

In the present invention, the carboxylate anion is preferably represented by General Formula (X).

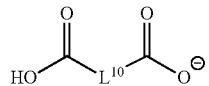
(X)

In General Formula (X), $L^{10}$ represents a single bond, or a divalent linking group selected from an alkylene group, an alkenylene group, an arylene group, —$NR^x$—, and a combination thereof, and $R^x$ represents a hydrogen atom, an alkyl group, an alkenyl group, or an aryl group.

Specific examples of the carboxylate anion include a maleic acid anion, a phthalic acid anion, an N-phenyliminodiacetic acid anion, and an oxalic acid anion. These anions may be preferably used.

The ammonium cation is preferably represented by any one of the following Formulae (Y1-1) to (Y1-6).

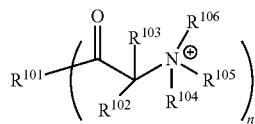
(Y1-1)

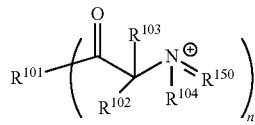
(Y1-2)

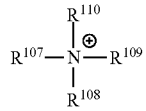
(Y1-3)

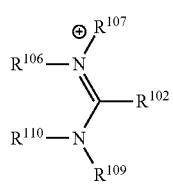
(Y1-4)

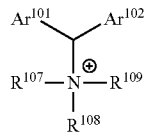
(Y1-5)

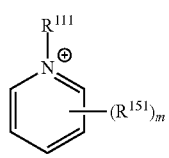
(Y1-6)

In the general formulae, $R^{101}$ represents an n-valent organic group, $R^{102}$ to $R^{111}$ each independently represent a hydrogen atom, or a hydrocarbon group, $R^{150}$ and $R^{151}$ each independently represent a hydrocarbon group, $R^{104}$ and $R^{105}$, $R^{104}$ and $R^{150}$, $R^{107}$ and $R^{108}$, and $R^{109}$ and $R^{110}$ may be bonded to each other to form a ring, $Ar^{101}$ and $Ar^{102}$ each independently represent an aryl group, n represents an integer of 1 or more, and m represents an integer of 0 to 5.

<<<Compound Represented by General Formula (1)>>>

In the present invention, the acidic compound is also preferably a compound represented by General Formula (1). This compound, although acidic at room temperature, undergoes the loss of a carboxyl group through decarboxylation or cyclodehydration by heating, and therefore the amine site which had been neutralized and inactivated till then becomes active to be basic. Hereinafter, General Formula (1) will be described.

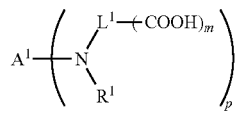
(1)

In General Formula (1), $A^1$ represents a p-valent organic group, $R^1$ represents a monovalent organic group, $L^1$ represents a (m+1)-valent organic group, m represents an integer of 1 or more, and p represents an integer of 1 or more.

In the present invention, the compound represented by General Formula (1) is preferably a compound represented by General Formula (1a).

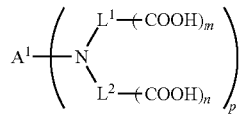
(1a)

In General Formula (1a), $A^1$ represents a p-valent organic group, $L^1$ represents a (m+1)-valent linking group, $L^2$ represents a (n+1)-valent linking group, m represents an integer of 1 or more, n represents an integer of 1 or more, and p represents an integer of 1 or more.

$A^1$, $L^1$, $L^2$, m, n, and p in General Formula (1a) have the same definitions, respectively, as in General Formula (1), and preferred ranges thereof are also the same.

In the present invention, the compound represented by General Formula (1) is preferably N-aryl iminodiacetic acid. The N-aryl iminodiacetic acid is a compound where, in General Formula (1), $A^1$ is an aromatic ring group, $L^1$ and $L^2$ are a methylene group, m is 1, n is 1, and p is 1. The N-aryl iminodiacetic acid is likely to generate a tertiary amine having a high boiling point at 120° C. to 200° C.

Hereinafter, specific examples of the thermal base generator in the present invention will be described, but the present invention is not limited thereto. These thermal base generators may be used alone or in combination of two or more kinds thereof. Me in the following formulae represents a methyl group.

TABLE 1

| Structure | Base generating temperature |
|---|---|
| (A-1) PhN(CH2COOH)2 | 145° C. |
| (A-2) 4-Me-C6H4-N(CH2COOH)2 | 140° C. |
| (A-3) 4-MeO-C6H4-N(CH2COOH)2 | 140° C. |
| (A-4) 4-Ph-C6H4-N(CH2COOH)2 | 150° C. |
| (A-5) 3,5-(F3C)2-C6H3-N(CH2COOH)2 | 155° C. |
| (A-6) 4-F3C-C6H4-N(CH2COOH)2 | 155° C. |
| (A-7) 4-MeC(O)-C6H4-N(CH2COOH)2 | 155° C. |
| (A-8) (HOOCCH2)2N-C6H4-CH2-C6H4-N(CH2COOH)2 | 145° C. |
| (A-9) (HOOCCH2)2N-C6H4-C(Me)2-C6H4-N(CH2COOH)2 | 140° C. |

TABLE 1-continued
| Structure | Base generating temperature |
|---|---|
| 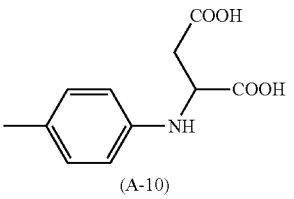 (A-10) | 200° C. |
| 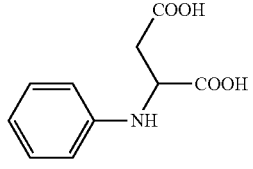 (A-11) | 200° C. |
TABLE 2
| Structure | Base generating temperature |
|---|---|
| (A-12) | 150° C. |
| (A-13) | 170° C. |
| (A-14) | 170° C. |
TABLE 2-continued
| Structure | Base generating temperature |
|---|---|
| (A-15) | 170° C. |
| (A-16) | 130° C. |
| (A-17) | 190° C. |
TABLE 3
| Structure | Base generating temperature pKa1 of anion |
|---|---|
| 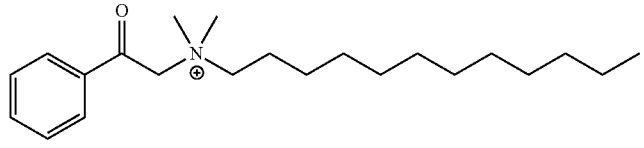 (A-18) | Base generating temperature = 150° C. pKa1 = 1.9 |

TABLE 3-continued
| Structure | Base generating temperature pKa1 of anion |
|---|---|
| 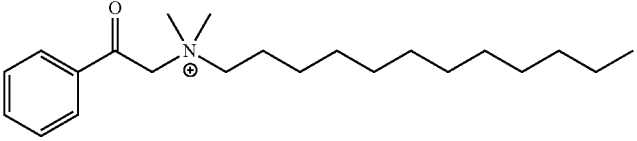 (A-19) | Base generating temperature = 150° C. pKa1 = 2.0 |
| 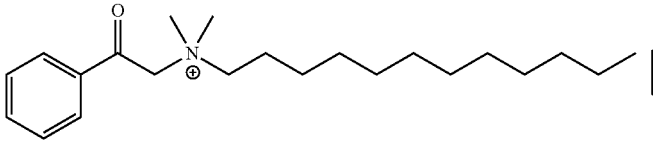 (A-20) | Base generating temperature = 150° C. pKa1 = 3.0 |
| 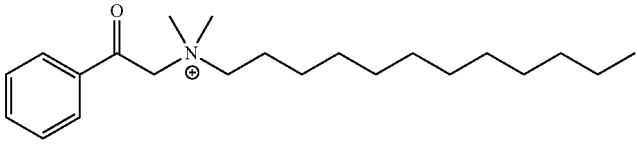 (A-21) | Base generating temperature = 150° C. pKa1 = 1.2 |
| 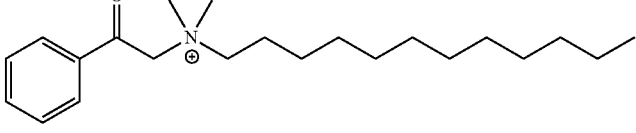 (A-22) | Base generating temperature = 130° C. pKa1 = 4.2 |
| 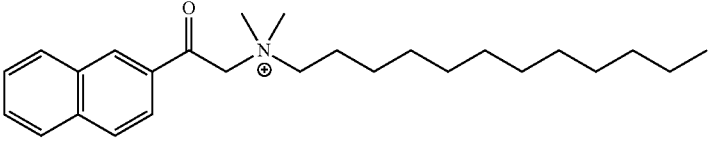 (A-23) | Base generating temperature = 140° C. pKa1 = 1.9 |
| 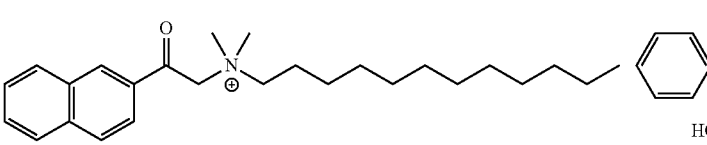 (A-24) | Base generating temperature = 140° C. pKa1 = 2.0 |
| 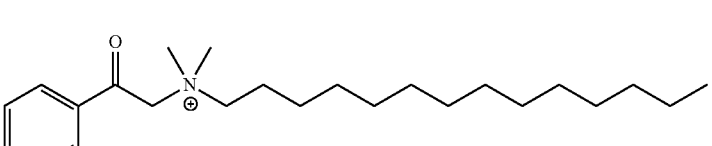 (A-25) | Base generating temperature = 150° C. pKa1 = 3.0 or less |

TABLE 3-continued

| Structure | Base generating temperature pKa1 of anion |
|---|---|
| (A-26) | Base generating temperature = 150° C.<br>pKa1 = 3.0 or less |

TABLE 4

| Structure | Base generating temperature pKa1 of anion |
|---|---|
| (A-27) | Base generating temperature = 140° C.<br>pKa1 = 1.2 |
| (A-28) | Base generating temperature = 140° C.<br>pKa1 = 1.2 |
| (A-29) | Base generating temperature = 140° C.<br>pKa1 = 1.2 |
| (A-30) | Base generating temperature = 140° C.<br>pKa1 = 1.2 |
| (A-31) | Base generating temperature = 140° C.<br>pKa1 = 1.2 |

TABLE 4-continued

| Structure | Base generating temperature pKa1 of anion |
|---|---|
| 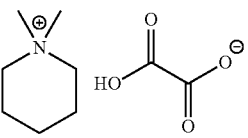 (A-32) | Base generating temperature = 190° C. pKa1 = 1.2 |
| 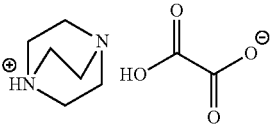 (A-33) | Base generating temperature = 70° C. pKa1 = 1.2 |
| 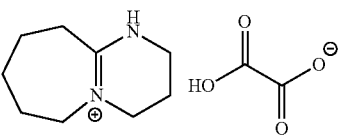 (A-34) | Base generating temperature = 80° C. pKa1 = 1.2 |
| 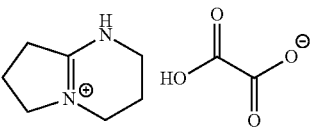 (A-35) | Base generating temperature = 80° C. pKa1 = 1.2 |
| 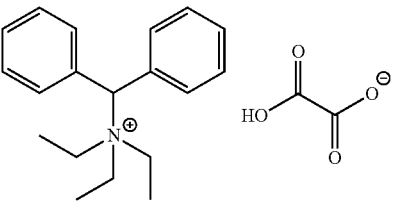 (A-36) | Base generating temperature = 170° C. pKa1 = 1.2 |
| 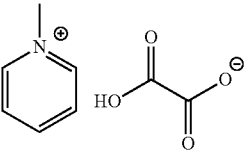 (A-37) | Base generating temperature = 180° C. pKa1 = 1.2 |

As the thermal base generator used in the present invention, those described in 0015 to 0055 of the specification of Japanese Patent No. 2015-034388 are preferably used, and the contents thereof are incorporated herein.

In a case of using the thermal base generator, the content of the thermal base generator in the photosensitive resin composition is preferably 0.1% to 50% by mass, with respect to the total solid content of the photosensitive resin composition. The lower limit is more preferably 0.5% by mass or more, and still more preferably 1% by mass or more. The upper limit is more preferably 30% by mass or less, and still more preferably 20% by mass or less.

One kind or two or more kinds of the thermal base generator may be used. In a case of using two kinds thereof, the total amount is preferably within the above range.

<<Photo-Acid Generator>>

The photosensitive resin composition of the present invention may include a photo-acid generator. By incorporation of the photo-acid generator, an acid is generated in the exposed areas, the solubility of the exposed areas in an aqueous alkali solution is increased, and therefore, the photosensitive resin composition can be used as a positive tone photosensitive resin composition.

Examples of the photo-acid generator include a quinonediazide compound, a sulfonium salt, a phosphonium salt, a diazonium salt, and an iodonium salt. Among these, the quinonediazide compound is preferably used in a view that an excellent dissolution inhibitory effect of the unexposed areas is expressed, and thus, a positive tone photosensitive resin composition having high sensitivity and a small reduction in the film can be obtained. Further, two or more kinds of the photo-acid generators can be included. Thus, the dissolution rate of the exposed areas and the unexposed areas can be further increased, and thus, a positive tone photosensitive resin composition having high sensitivity can be obtained.

Examples of the quinonediazide compound include a quinonediazide compound in which a sulfonic acid of a quinonediazide forms an ester bond with a polyhydroxy compound, a quinonediazide compound in which a sulfonic acid of a quinonediazide forms a sulfonamide bond with a polyhydroxy compound, and a quinonediazide compound in which a sulfonic acid of a quinonediazide forms an ester bond and/or sulfonamide bond with a polyhydroxy compound. By using such a quinonediazide compound, a positive tone photosensitive resin composition having photosensitivity at an i-line such as a mercury lamp (wavelength of 365 nm), an h-line (wavelength of 405 nm), or a g-line (of wavelength 436 nm), which is a general ultraviolet ray, can be obtained. Further, all the functional groups of the polyhydroxy compound, the polyamino compound, and the polyhydroxypolyamino compound do not need to be substituted with quinonediazide, but it is preferable that two or more functional groups within one molecule are substituted with quinonediazide.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (all trade names, manufactured by Honshu Chemical Industry Co., Ltd.), BIR-OC, BIP-PC, BIR-PC, BIR-PTBP, BIR-PCHP, BIP-BIOC-F, 4PC, BIR—BIPC—F, TEP-BIP-A, 46DMOC, 46DMOEP, TM-BIP-A (all trade names, manufactured by Asahi Organic Chemicals Industry Co., Ltd.), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate ester, bisphenol A, bisphenol E, methylene bisphenol, and BisP-AP (all trade names, manufactured by Honshu Chemical Industry Co., Ltd.), and a Novolac resin.

Examples of the polyamino compound include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenylsulfide.

Furthermore, examples of the polyhydroxypolyamino compound include, but are not limited to, 2,2-bis(3-amino-4-hydroxyphenyl)hexafluoropropane and 3,3'-dihydroxybenzidine.

As the quinonediazide compound, either of a compound having a 5-naphthoquinonediazide sulfonyl group and a compound having a 4-naphthoquinonediazide sulfonyl group is be preferably used. A compound having both of these groups in the same molecule may be used, and a compound in which another group is used may also be used in combination therewith.

Examples of a method for producing the quinonediazide compound include a method in which 5-naphthoquinonediazide sulfonyl chloride is reacted with a phenol compound in the presence of triethylamine. Examples of a method for synthesizing the phenol compound include a method in which an α-(hydroxyphenyl)styrene derivative is reacted with a polyhydric phenol compound in the presence of an acid catalyst.

The content of the photo-acid generator is preferably 3 to 40 parts by mass with respect to 100 parts by mass of the polyimide precursor. By setting the content of the photo-acid generator to this range, high sensitivity can be further promoted. In addition, a sensitizing agent and the like may be included, as desired.

<<Thermal Acid Generator>>

The photosensitive resin composition of the present invention may include a thermal acid generator. The thermal acid generator generates an acid upon heating, promotes the cyclization of the polyimide precursor, and further improves the mechanical characteristics of a cured film, and further, there is an effect of promoting the crosslinking reaction of at least one compound selected from a compound having a hydroxymethyl group, an alkoxymethyl group, or an acyloxymethyl group, an epoxy compound, an oxetane compound, and a benzoxazine compound.

The thermal decomposition initiation temperature of the thermal acid generator is preferably 50° C. to 270° C., and more preferably 250° C. or lower. Further, it is preferable to select a thermal acid generator which does not generate an acid during drying (prebaking: about 70° C. to 140° C.) after applying the photosensitive resin composition onto a substrate, but generates an acid during final heating (curing: about 100° C. to 400° C.) after exposure and development later since a reduction in the sensitivity during development can be suppressed.

The acid generated from the thermal acid generator is preferable, and preferred examples thereof include arylsulfonic acids such as p-toluenesulfonic acid and benzenesulfonic acid, alkylsulfonic acids such as methanesulfonic acid, ethanesulfonic acid, and butanesulfonic acid, or haloalkylsulfonic acids such as trifluoromethanesulfonic acid. Examples of such the thermal acid generator include those described in paragraph 0055 of JP2013-72935A.

Among these, an alkylsulfonic acid having 1 to 4 carbon atoms or a haloalkylsulfonic acid having 1 to 4 carbon atoms is more preferably generated from the viewpoints of less residues in the cured film and no deterioration of the physical properties of a cured film. (4-Hydroxyphenyl)dimethylsulfonium methanesulfonate, (4-((methoxycarbonyl)oxy)phenyl)dimethylsulfonium methanesulfonate, benzyl(4-hydroxyphenyl)methylsulfonium methanesulfonate, benzyl(4-((methoxycarbonyl)oxy)phenyl)methylsulfonium methanesulfonate, (4-hydroxyphenyl)methyl((2-methylphenyl)methyl)sulfonium methanesulfonate, (4-hydroxyphenyl)dimethylsulfonium trifluoromethanesulfonate, (4-((methoxycarbonyl)oxy)phenyl)dimethylsulfonium trifluoromethanesulfonate, benzyl(4-hydroxyphenyl)methylsulfonium trifluoromethanesulfonate, benzyl(4-((methoxycarbonyl)oxy)phenyl)methylsulfonium trifluoromethanesulfonate, (4-hydroxyphenyl)methyl((2-methylphenyl)methyl)sulfonium trifluoromethanesulfonate, 3-(5-(((propylsulfonyl)oxy)imino)thiophen-2 (5H)-ylidene)-2-(o-tolyl)propane nitrile, or 2,2-bis(3-(methanesulfonylamino)-4-hydroxyphenyehexafluoropropane is preferable as a thermal acid generator.

Furthermore, the compounds described in paragraph 0059 of JP2013-167742A is also preferable as the thermal acid generator.

By incorporation of the thermal acid generator at the content of preferably 0.01 parts by mass or more, more preferably 0.1 parts by mass or more, and still more preferably 0.01 parts by mass or more, with respect to 100 parts by mass of the polyimide precursor, the cyclization of the crosslinking reaction and the polyimide precursor is promoted, and therefore, the mechanical characteristics and the chemical resistance of the cured film can be further improved. In addition, from the viewpoint of the insulating properties of the cured film, the content is preferably 20 parts by mass or less, more preferably 15 parts by mass or less, and still more preferably 10 parts by mass or less.

<<Thermal Radical Polymerization Initiator>>

The photosensitive resin composition of the present invention may include a thermal radical polymerization initiator. A known thermal radical polymerization initiator may be used as the thermal radical polymerization initiator.

The thermal radical polymerization initiator is a compound which generates radicals with heat energy to initiate or accelerate a polymerization reaction of a polymerizable compound. By adding a thermal radical polymerization initiator, the polymerization reaction of the polymerizable compound can proceed when the cyclization reaction of a polyimide precursor is allowed to proceed. Further, in a case where the polyimide precursor contains an ethylenically unsaturated bond, it would become possible to achieve being of higher heat resistance since the polymerization reaction of a polyimide precursor can also be proceeded together with the cyclization of a polyimide precursor.

Examples of the thermal radical polymerization initiator include aromatic ketones, an onium salt compound, a peroxide, a thio compound, a hexaarylbiimidazole compound, a ketoxime ester compound, a borate compound, an azinium compound, a metallocene compound, an active ester compound, a compound having a carbon-halogen bond, and an azo-based compound. Among those, a peroxide and an azo-based compound are more preferable, and a peroxide is particularly preferable.

The thermal radical polymerization initiator used in the present invention has a 10 hour half-time period temperature of preferably 90° C. to 130° C., and more preferably 100° C. to 120° C.

Specific examples of the thermal radical polymerization initiator include the compounds described in paragraphs 0074 to 0118 of JP2008-63554A.

As a commercially available product, PERBUTYL Z and PERCUMYL D (manufactured by NIPPON OIL & FATS CO., LTD.) can be suitably used.

In a case where the photosensitive resin composition contains a thermal radical polymerization initiator, the content of the thermal radical polymerization initiator is preferably 0.1% to 50% by mass, more preferably 0.1% to 30% by mass, and particularly preferably 0.1% to 20% by mass, with respect to the total solid content of the photosensitive resin composition. Further, the thermal radical polymerization initiator is contained an amount of preferably 0.1 to 50 parts by mass, and more preferably 0.5 to 30 parts by mass, with respect to 100 parts by mass of the polymerizable compound. According to this aspect, it is easy to form a cured film having superior heat resistance.

The thermal radical polymerization initiator may be of one kind or of two or more kinds thereof. In a case where the thermal radical polymerization initiator is of two or more kinds, it is preferable that the total thereof is within the above range.

<<Sensitizing Dye>>

The photosensitive resin composition of the present invention may include a sensitizing dye. The sensitizing dye becomes an electron excited state by absorbing specific actinic radiations. The sensitizing dye in the electronically excited state comes into contact with a thermal base generator, a thermal radical polymerization initiator, a photoradical polymerization initiator, or the like, resulting in actions such as electron transfer, energy transfer, and heat generation. Thus, a thermal base generator, a thermal radical polymerization initiator, or a photoradical polymerization initiator undergoes chemical changes to be decomposed, thereby generating a radical, an acid or a base.

Preferred examples of the sensitizing dye include those which belong to the following compounds and have an absorption wavelength in a region of 300 nm to 450 nm. Examples thereof include polynuclear aromatic compounds (for example, phenanthrene, anthracene, pyrene, perylene, triphenylene, and 9,10-dialkoxyanthracene), xanthenes (for example, fluorescein, eosin, erythrosine, rhodamine B, and rose bengal), thioxanthones (for example, 2,4-diethylthioxanthone), cyanines (for example, thiacarbocyanine, and oxacarbocyanine), merocyanines (for example, merocyanine and carbomerocyanine), thiazines (for example, thionine, methylene blue, and toluidine blue), acridines (for example, acridine orange, chioroflavin, and acriflavin), anthraquinones (for example, anthraquinone), squaryliums (for example, squarylium), coumarins (for example, 7-diethylamino-4-methylcoumarin), phenothiazines, styryl benzenes, distyryl benzenes, and carbazoles.

Among these, it is preferable in the present invention to combine with polynuclear aromatic compounds (for example, phenanthrene, anthracene, pyrene, perylene, and triphenylene), thioxanthones, distyryl benzenes, or styryl benzenes from the viewpoint of initiation efficiency, and it is more preferable to use a compound having an anthracene skeleton. Examples of the particularly preferred specific compound include 9,10-diethoxyanthracene and 9,10-dibutoxyanthracene.

In a case where the photosensitive resin composition includes a sensitizing dye, the content of the sensitizing dye is preferably 0.01% to 20% by mass, more preferably 0.1% to 15% by mass, and still more preferably 0.5% to 10% by mass, with respect to the total solid content of the photosensitive resin composition. The sensitizing dye may be used alone and in combination of two or more kinds thereof.

<<Photoradical Polymerization Initiator>>

The photosensitive resin composition of the present invention may include a photoradical polymerization initiator. By incorporating the photoradical polymerization initiator into the photosensitive resin composition, the photosensitive resin composition is applied onto a semiconductor wafer or the like to form a composition layer in the form of a layer shape, and then irradiated with light to cause curing due to radicals, and thus, dissolution in the areas irradiated with light can be reduced. As a result, for example, by exposing the composition layer via a photomask having a pattern that masks only an electrode portion, there is an advantage that regions having different solubilities depending on the patterns of the electrodes can be prepared.

The photoradical polymerization initiator is not particularly limited as long as it has an ability of initiating the polymerization reaction (crosslinking reaction) of the polymerizable compound, and can be appropriately selected from known photoradical polymerization initiators. For example, it is preferable to have photosensitivity to rays ranging from an ultraviolet ray region to a visible light region. In addition, the photoradical polymerization initiator may be an activator which causes a certain reaction with a photo-excited sensitizing agent to produce an active radical.

The photoradical polymerization initiator preferably contains at least one compound having a molar light absorption coefficient of at least about 50 within a range of about 300 to 800 nm (preferably 330 to 500 nm). The molar light absorption coefficient of the compound can be measured using a known method, and specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

As the photoradical polymerization initiator, known compounds can be used without limitation, and examples thereof include halogenated hydrocarbon derivatives (for example, a derivative having a triazine skeleton, a derivative having an oxadiazole skeleton, and a derivative having a trihalomethyl group), acylphosphine compounds such as acylphosphine oxide, oxime compounds such as hexaaryl biimidazole and an oxime derivative, organic peroxide, thio compounds, ketone compounds, aromatic onium salts, ketoxime ethers, aminoacetophenone compounds, hydroxyacetophenone, azo-based compounds, azide compounds, metallocene compounds, organic boron compounds, and iron-arene complexes.

Examples of the halogenated hydrocarbon compound having a triazine skeleton include the compounds described in Wakabayashi et al., Bull. Chem. Soc. Japan, 42, 2924 (1969), the compounds described in UK1388492B, the compound described in JP1978-133428A (JP-S53-133428A), the compounds described in GE3337024B, the compounds described in F. C. Schaefer et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-1105-34920A), and the compounds described in U.S. Pat. No. 4,212,976A.

Examples of the compounds described in U.S. Pat. No. 4,212,976A include a compound having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, and 2-tribromomethyl-5-styryl-1,3,4-oxadiazole).

Furthermore, examples of the photoradical polymerization initiator other than the photoradical polymerization initiators described above include an acridine derivative (for example, 9-phenylacridine and 1,7-bis(9,9'-acridinyl)heptane), N-phenylglycine, a polyhalogen compound (for example, carbon tetrabromide, phenyl tribromomethyl sulfone, and phenyl trichloromethyl ketone), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds described, for example, in JP1993-19475A (JP-H05-19475A), JP1995-271028A (JP-H07-271028A), JP2002-363206A, JP2002-363207A, JP2002-363208A, and JP2002-363209A), acylphosphine oxides (for example, bis(2,4,6-trimethylbenzoyl)-phersylphosphineoxide, bis(2,6-dimethoxybenzoyl)-2,4,4-trimethyl-pentylphenylphosphine oxide, and Lucirin TPO), metallocenes (for example, titanocene compounds described in paragraph 0076 of JP2011-13602A, bis($\eta$5-2,4-cyclopentadien-1-yl)-bis(2,6-difluoro-3-(H-pyrrol-1-yl)phenyl)titanium, and $\eta$5-cyclopentadienyl-$\eta$6-cumenyl-iron(1+)-hexafluoroplaosphate(1−)), and compounds described in JP1978-133428A (JP-S53-133428A), JP1982-1819B (JP-S57-1819B), JP1982-6096B (JP-S57-6096B), and U.S. Pat. No. 3,615,455A.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenonetetracarboxylic acid or a tetramethyl ester thereof, 4,4'-bis(dialkylamino)benzophenones (for example, 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone), benzyl, anthraquinone, 2-t-butylanthraquinone, 2-methylanthraquinone, phenanthraquinone, xanthone, thioxanthone, 2-chlorothioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylyinyl)phenyl]propanol oligomer, benzoin, benzoin ethers (for example, benzoin methyl ether, benzoin ethyl ether, benzoin propyl ether, benzoin isopropyl ether, benzoin phenyl ether, and benzyl dimethyl ketal), acridone, chloroacridone, N-methylacridone, N-butylacridone, and N-butyl-chloroacridone.

As a commercially available product, KAYACURE-DETX (manufactured by Nippon Kayaku Co., Ltd.) is also suitably used.

As the photoradical polymerization initiator, a hydroxyacetophenone compound, an aminoacetophenone compound and an acylphosphine compound may also be preferably used. More specifically, for example, an aminoacetophenone initiator described in JP1998-291969A (JP-H10-291969A) and an acylphosphine oxide initiator described in Japanese Patent No. 4225898 may also be used.

As the hydroxyacetophenone-based initiator, IRGACURE-184, DAROCUR-1173, IRGACURE-500, IRGACURE-2959, and IRGACURE-127 (trade names: all manufactured by BASF Corp.) may be used.

As the aminoacetophenone-based initiator, commercially available products of IRGACURE-907, IRGACURE-369, and IRGACURE-379 (trade names, all manufactured by BASF Corp.) may be used.

As the aminoacetophenone-based initiator, compounds described in JP2009-191179A, in which the absorption wavelength matches a light source having a long wavelength, for example, 365 nm or 405 nm, may also be used.

As the acylphosphine initiator, commercially available products of IRGACURE-819 and DAROCUR-TPO (trade names, both manufactured by BASF Corp.) may be used.

The photoradical polymerization initiator more preferably includes an oxime compound. As specific examples of the oxime initiator, the compounds described in JP2001-233842A, the compounds describe in JP2000-80068A, and the compounds described in JP2006-342166A may be used.

Preferred examples of the oxime compound include 3-benzoyloxyiminobutan-2-one, 3-acetoxyiminobutan-2- one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

The oxime compound includes, for example, compounds described in J. C. S. Perkin II, (1979) pp. 1653 to 1660, J. C. S. Perkin II, (1979) pp. 156 to 162, Journal of Photopolymer Science and Technology, (1995) pp 202 to 232, JP2000-66385A, JP2000-80068A, JP2004-534797A, and JP2006-342166A.

As the commercially available products of the oxime compound, IRGACURE-OXE01 (manufactured by BASF Corp.), IRGACURE-OXE02 (manufactured by BASF Corp.), and N-1919 (manufactured by ADEKA Corporation) are also preferably used.

In addition, as the oxime compound, the compounds described in JP2009-519904A, in which oxime is linked to the N-position of carbazole, the compounds described in U.S. Pat. No. 7,626,957A, in which a hetero-substituent is introduced into the benzophenone moiety, the compounds described in JP2010-15025A and US2009/292039A, in which a nitro group is introduced into the dye moiety, the ketoxime compounds described in WO2009/131189A, the compounds containing a triazine skeleton and an oxime skeleton in the same molecule described in U.S. Pat. No. 7,556,910A, and the compounds having an absorption maximum at 405 nm and exhibiting good sensitivity for a g-line light source described in JP2009-221114A may also be used.

Incidentally, the cyclic oxime compounds described in JP2007-231000A and JP2007-322744A may also be preferably used. Among the cyclic oxime compounds, the cyclic oxime compounds condensed to a carbazole dye described in JP2010-32985A and JP2010-185072A have high light absorptivity and thus are preferable from the viewpoint of high sensitivity Moreover, the compounds described in JP2009-242469A having an unsaturated bond at a specific site of an oxime compound may also be suitably used.

Further, it is also possible to use an oxime initiator having a fluorine atom. Specific examples of such an initiator include the compounds described in JP2010-262028A, Compounds 24, and 36 to 40 described in paragraph 0345 of JP2014-500852A, and the Compound (C-3) described in paragraph 0101 of JP2013-164471A. Specific examples thereof include the following compounds.

24

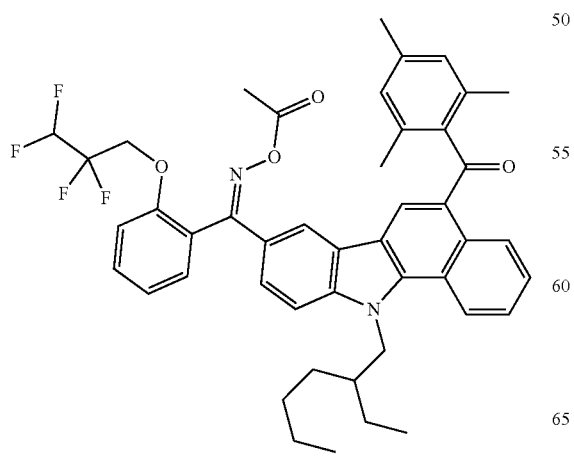

36

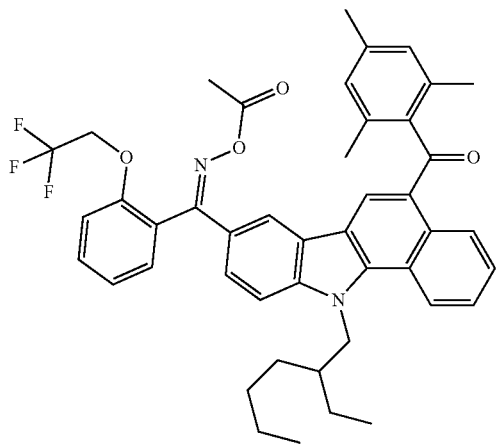

37

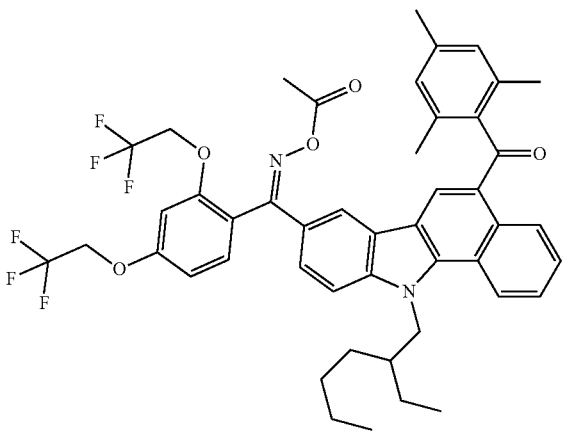

40

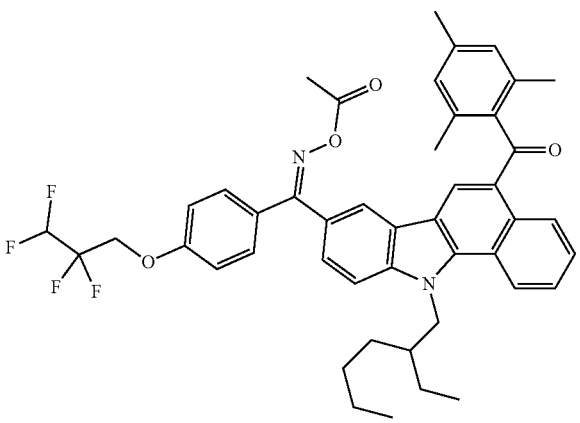

The most preferred examples of the oxime compound include the oxime compounds having a specific substituent described in JP2007-269779A and the oxime compounds having a thioaryl group described in JP2009-191061A.

From the viewpoint of exposure sensitivity, the photo-radical polymerization initiator is preferably a compound selected from the group consisting of a trihalomethyltriazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, a halomethyloxadiazole compound, and a 3-aryl-substituted coumarin compound.

More preferred photoradical polymerization initiator is a trihalomethyltriazine compound, an α-aminoketone compound, an acyl phosphine compound, a phosphine oxide compound, an oxime compound, a triarylimidazole dimer, an onium compound, a benzophenone compound or an acetophenone compound. At least one compound selected from the group consisting of a trihalomethyltriazine compound, an α-aminoketone compound, an oxime compound, a triarylimidazole dimer, and a benzophenone compound is the most preferable. It is the most preferable to use the oxime compound.

In a case where the photosensitive resin composition contains a photoradical polymerization initiator, the content of the photoradical polymerization initiator is preferably 0.1% to 30% by mass, more preferably 0.1% to 20% by mass, and still more preferably 0.1% to 10% by mass, with respect to the total solid content of the photosensitive resin composition. Further, the photoradical polymerization initiator is contained in an amount of preferably 1 to 20 parts by mass, and more preferably 3 to 10 parts by mass, with respect to 100 parts by mass of the polymerizable compound.

The photoradical polymerization initiator may be of one kind or of two or more kinds thereof. In a case where the photoradical polymerization initiator is of two or more kinds, it is preferable that the total thereof is within the above range.

<<Chain Transfer Agent>>

The photosensitive resin composition of the present invention may contain a chain transfer agent. The chain transfer agent is defined, for example, in Polymer Dictionary, 3rd Edition, pp. 683 and 684 (edited by The Society of Polymer Science, 2005). As the chain transfer agent, for example, a group of compounds having SH, PH, SiH, or GeH in their molecules is used. Such a compound group donates a hydrogen to a low active radical species to generate a radical or is oxidized and then deprotonated to generate a radical. In particular, thiol compounds (for example, 2-mercaptobenzimidazoles, 2-mercaptobenzothiazoles, 2-mercaptobenzoxazoles, 3-mercaptotriazoles, and 5-mercaptotetrazoles) can be preferably used.

In a case where the photosensitive resin composition has a chain transfer agent, the preferred content of the chain transfer agent is preferably 0.01 to 20 parts by mass, more preferably 1 to 10 parts by mass, and particularly preferably 1 to 5 parts by mass, with respect to 100 parts by mass of the total solid content of the photosensitive resin composition.

The chain transfer agent may be of one kind or of two or more kinds thereof. In a case where there are two or more kinds of the chain transfer agents, it is preferable that the total thereof is within the above range.

<<Polymerization Inhibitor>>

The photosensitive resin composition of the present invention preferably contains a small amount of a polymerization inhibitor in order to inhibit unnecessary thermal polymerization of a polyimide precursor and a radically polymerizable compound during production or storage of the composition.

Suitable examples of the polymerization inhibitor include hydroquinone, p-methoxyphenol, di-tert-butyl-p-cresol, pyrogallol, p-tert-butylcatechol, benzoquinone, 4,4'-thiobis (3-methyl-6-tert-butylphenol), 2,2'-methylene bis(4-methyl-6-tert-butylphenol), an N-nitroso-N-phenylhydroxylaminealuminum salt, phenothiazine, N-nitrosodiphenylamine, N-phenylnaphthylamine, ethylenediamine tetraacetic acid, 1,2-cyclohexanediamine tetraacetic acid, glycol ether-diamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, an N-nitroso-N-(1-naphthyl)hydroxylamineammonium salt, and bis(4-hydroxy-3,5-tert-butyl)phenylmethane.

In a case where the photosensitive resin composition contains a polymerization inhibitor, the content of the polymerization inhibitor is preferably 0.01% to 5% by mass with respect to the total solid content of the photosensitive resin composition.

The polymerization inhibitor may be of one kind or of two or more kinds thereof. In a case where there are two or more kinds of the polymerization inhibitors, it is preferable that the total thereof is within the above range.

<<Resin Containing Phenolic OH Group>>

In a case where the photosensitive resin composition of the present invention is of an alkali-developing positive tone, it is preferable that the photosensitive resin composition includes a resin containing a phenolic OH group in a view that the solubility in an alkali developer is adjusted, and thus good sensitivity is obtained.

Preferred examples of the resin containing a phenolic OH group include a novolac resin and a polyhydroxystyrene resin.

<<<Novolac Resin>>>

The novolac resin is obtained by polycondensation of phenols with aldehydes by a known method. Two or more kinds of the novolac resins may be combined.

Preferred examples of the phenols include phenol, o-cresol, m-cresol, p-cresol, 2,3-xylenol, 2,5-xylenol, 3,4-xylenol, 3,5-xylenol, 2,3,5-trimethylphenol, and 3,4,5-trimethylphenol, and particularly, phenol, m-cresol, p-cresol, 2,3-xylenol, 2,5-xylenol, 3,4-xylenol, 3,5-xylenol, and 2,3,5-trimethylphenol are preferable. These phenols may be used alone or in combination of two or more kinds thereof. From the viewpoint of the solubility in an alkali developer, m-cresol is preferable, and a combination of m-cresol and p-cresol is also preferable. That is, it is preferable that a cresol novolac resin including an m-cresol residue, or an m-cresol residue and a p-cresol residue is included as the novolac resin. Here, the molar ratio (m-cresol residue/p-cresol residue, m/p) of the m-cresol residue to the p-cresol residue in the cresol novolac resin is preferably 1.8 or more. Within this range, a suitable solubility in an alkali developer is exhibited, and good sensitivity is obtained. The molar ratio is more preferably 4 or more.

Furthermore, preferred examples of the aldehydes include formalin, paraformaldehyde, acetaldehyde, benzaldehyde, hydroxybenzaldehyde, and chloroacetaldehyde. Two or more kinds of these aldehydes may be used.

Furthermore, fully aromatic novolac resins obtained by polycondensation of phenols having an aromatic ring and aldehydes having an aromatic ring are preferable in a view that high heat resistance can provided for the cured film. Examples of such the fully aromatic novolac resin include those described in paragraphs 0015 to 0026 of JP2014-211517A.

With regard to a method for synthesizing novolac resins from phenols and aldehydes, reference can be made to, for example, paragraphs 0034 to 0035 of JP2014-157297A.

The weight-average molecular weight (hereinafter referred to as "Mw") of the novolac resin is preferably 1,000 or more, and more preferably 2,000 or more. In addition, the weight-average molecular weight is preferably 5,000 or less. Within this range, good sensitivity can be obtained.

The content of the novolac resin is preferably from 1 parts by mass to 70 parts by mass, and more preferably from 10 parts by mass to 70 parts by mass, with respect to 100 parts by mass of the polyimide precursor. Within this range, a pattern having high sensitivity and having no flow after heat treatment at a high temperature is obtained.

<<<Polyhydroxystyrene Resin>>>

The hydroxystyrene resin is a polymer including hydroxystyrene and/or a derivative thereof, and is not particularly limited. However, it may be a copolymer including hydroxystyrene and/or a derivative thereof, and other monomers. Examples of the monomers as used herein include ethylene, propylene, 1-butene, 2-methylpropene, styrene, and a derivative thereof. Among these, from the viewpoint that the solubility in an alkali developer can be easily adjusted, a copolymer formed of hydroxystyrene and/or a derivative thereof, and styrene and/or a derivative thereof is preferable. The derivative may be any one resulting from substitution with an alkyl group, an alkoxy group, a hydroxyl group, or the like at an ortho-; meta-, or para-position of an aromatic ring in hydroxystyrene and styrene. The hydroxystyrene of the hydroxystyrene resin can be any one of orthohydroxystyrene, metahydroxystyrene, and parahydroxystyrene. In addition, a plurality of hydroxystyrenes may coexist.

The constitutive ratio of the hydroxystyrene and a derivative thereof in the hydroxystyrene resin is preferably 50% or more, and more preferably 60% or more with respect to the lower limit, and preferably 90% or less, and more preferably 80% or less with respect to the upper limit. Within the above range, an effect of excellent compatibility of reduction in residues after exposure in the exposed areas and high sensitivity is attained.

Examples of the hydroxystyrene resin include those described in paragraphs 0012 to 0020 of JP2014-137523A.

The weight-average molecular weight (Mw) of the hydroxystyrene resin is preferably in the range of 3,000 to 60,000, and more preferably in the range of 3,000 to 25,000. Within the above range, an effect of excellent compatibility of high sensitivity and storage stability at room temperature of varnishes is attained.

<<Higher Fatty Acid Derivative or the Like>>

In order to prevent polymerization inhibition due to oxygen, a higher fatty acid derivative or the like, for example, behenic acid or behenic acid amide may be added to the photosensitive resin composition of the present invention to localize on the surface of a photosensitive resin composition in the process of drying after the coating.

In a case where the photosensitive resin composition contains a higher fatty acid derivative, the content of the higher fatty acid derivative is preferably 0.1% to 10% by mass with respect to the total solid content of the photosensitive resin composition.

The higher fatty acid derivative or the like may be of one kind or of two or more kinds thereof. In a case where the higher fatty acid derivative or the like is two or more types, it is preferable that the total thereof is within the above range.

<<Solvent>>

In a case where the photosensitive resin composition of the present invention is applied in a layer shape by application, it is preferable to blend a solvent. Any of the following known solvents can be used without limitation as long as it is capable of forming the photosensitive resin composition in a layer shape.

Suitable examples of the solvent include, as esters, for example, ethyl acetate, n-butyl acetate, isobutyl acetate, amyl foimate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl oxyacetate (for example: methyl oxyacetate, ethyl oxyacetate, butyl oxyacetate (for example: methyl methoxyacetate, ethyl methoxyacetate, butyl methoxyacetate, methyl ethoxyacetate or ethyl ethoxyacetate)), alkyl 3-oxypropionate esters (for example: methyl 3-oxypropionate and ethyl 3-oxypropionate (for example, methyl 3-methoxypropionate, ethyl 3-methoxypropionate, methyl 3-ethoxypropionate or ethyl 3-ethoxypropionate)), alkyl 2-oxypropionate esters (for example, methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate or ethyl 2-ethoxypropionate)), methyl 2-oxy-2-methylpropionate and ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate; as ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate or propylene glycol monopropyl ether acetate; as ketones, for example, methyl ethyl ketone, cyclohexanone, cyclopentanone, 2-heptanone, 3-heptanone, and N-methyl-2-pyrrolidone; as aromatic hydrocarbons, for example, toluene, xylene, anisole, and limonene; and as sulfoxides, for example, dimethyl sulfoxide.

From the viewpoint of improving the coated surface morphology or the like, an aspect of two or more kinds of the solvents are mixed is also preferable. Among those, a mixed solution formed of two or more kinds of the solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, propylene glycol methyl ether, and propylene glycol methyl ether acetate is preferable. Combined use of dimethyl sulfoxide and γ-butyrolactone is particularly preferable.

In a case where a solvent is blended into the photosensitive resin composition, the content of the solvent is set such that the total concentration of solid contents of the photosensitive resin composition becomes preferably 5% to 80% by mass, more preferably 5% to 70% by mass, and particularly preferably 10% to 60% by mass, from the viewpoint of coatability.

The solvent may be of one kind or of two or more kinds thereof. In a case where there are two or more kinds of the solvents, it is preferable that the total thereof is within the above range.

In addition, from the viewpoint of film strength, the content of N-methyl-2-pyrrolidone, N-ethyl-2-pyrrolidone, N,N-dimethylacetamide, and N,N-dimethylformamide is preferably less than 5% by mass, more preferably less than 1% by mass, still more preferably less than 0.5% by mass, and particularly preferably less than 0.1% by mass, with respect to the total mass of the composition.

<<Surfactant>>

From the viewpoint of further improving coatability, various surfactants may be added to the photosensitive resin composition of the present invention. As the surfactant, various surfactants, for example, a fluorine-based surfactant, a nonionic surfactant, a cationic surfactant, an anionic surfactant or a silicone-based surfactant may be used.

In particular, by including a fluorine-based surfactant, liquid properties (particularly, fluidity) of a coating solution prepared are further improved so that the uniformity of coating thickness or the liquid-saving property can be more improved.

In the case of forming a film by using a coating solution containing a fluorine-based surfactant, the interface tension between a surface to be coated and the coating solution is reduced, whereby wettability to the surface to be coated is improved and the coatability on the surface to be coated is increased. This is effective in that even in a case where a thin, film of about several μm is formed using a small liquid volume, formation of the film having a little thickness unevenness and a uniform thickness can be more suitably carried out.

The fluorine content in the fluorine-based surfactant is preferably 3% to 40% by mass, more preferably 5% to 30% by mass, and particularly preferably 7% to 25% by mass. The fluorine-based surfactant having a fluorine content in the range described above is effective in view of the uniformity of coating thickness and the liquid-saving property and also exhibits good solubility.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (all manufactured by DIC Corp.), FLUORAD FC430, FLUORAD FC431, and FLUORAD FC171 (all manufactured by Sumitomo 3M Ltd.), SURFLON 5-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by Asahi Glass Co, Ltd.), and PF636, PF656, PF6320, PF6520 and PF7002 (all manufactured by OMNOVA Solutions Inc.).

As the fluorine-based surfactant, a block polymer can also be used, and specific examples thereof include the compounds described in JP2011-89090A.

In addition, the following compounds are also exemplified as the fluorine-based surfactant used in the present invention.

The weight-average molecular weight of the compound is, for example, 14,000.

Specific examples of the nonionic surfactant include glycerol, trimethylolpropane, trimethylolethane, ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (PLURONIC L10, L31, L61, L62, 10R5, 17R2, and 25R2, and TETRONIC 304, 701, 704, 901, 904, and 150R1 (manufactured by BASF Corp.)), and SOLSPERSE 20000 (manufactured by The Lubrizol Corp.). In addition, PIONIN D-6112-W manufactured by Takemoto Oil & Fat Co., Ltd., or NCW-101, NCW-1001, or NCW-1002 manufactured by Wako Pure Chemical Industries, Ltd. can also be used.

Specific examples of the cationic surfactant include a phthalocyanine derivative (trade name: EFKA-745, manufactured by Morishita Sangyo K.K.), an organosiloxane polymer KP341 (manufactured by Shin-Etsu Chemical Co., Ltd.), a (meth)acrylic acid (co)polymers POLYFLOW No. 75, No. 90, and No. 95 (manufactured by Kyoeisha Chemical Co., Ltd.) and W001 (manufactured by Yusho Co., Ltd.).

Specific examples of the anionic surfactant include W004, W005, and W017 (manufactured by Yusho Co., Ltd.).

Examples of the silicon-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400" (manufactured by Dow Corning Toray Co., Ltd.), "TSF-4440", "TSF-4300", "TSF-4445", "TSF-4460", and "TSF-4452" (manufactured by Momentive Performance Materials Inc.), "KP341", "KF6001", and "KF6002" (manufactured by Shin-Etsu Silicone Co, Ltd.), and "BYK307", "BYK323", and "BYK330" (manufactured by BYK-Chemie GmbH).

In a case where the photosensitive resin composition contains a surfactant, the content of the surfactant is preferably 0.001% to 2.0% by mass, and more preferably 0.005% to 1.0% by mass, with respect to the total solid content of the photosensitive resin composition.

The surfactant may be of one kind or of two or more kinds thereof. In a case where there are two or more kinds of the surfactants, it is preferable that the total thereof is within the above range.

<<Corrosion Inhibitor>>

It is preferable to add a corrosion inhibitor to the photosensitive resin composition of the present invention. The corrosion inhibitor is added for the purpose of preventing the outflow of ions from the metal wiring, and as a compound,

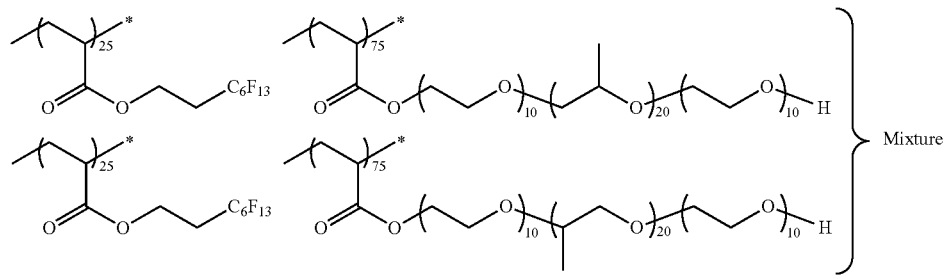

for example, the rust inhibitors described in paragraph 0094 of JP2013-15701A, the compounds described in paragraphs 0073 to 0076 of JP2009-283711A, the compounds described in paragraph 0052 of JP2011-59656A, the compounds described in paragraphs 0114, 0116, and 0118 of JP2012-194520A, or the like can be used. Among these, a compound having a tetrazole ring or a compound having a triazole ring can be preferably used, 1,2,4-triazole, 1,2,3-benzotriazole, 5-methyl-1H-benzotriazole, 1H-tetrazole, or 5-methyl-1H-tetrazole is more preferable, and 1H-tetrazole is the most preferable. A combination of two or more kinds of the corrosion inhibitors are used.

The blend amount of the corrosion inhibitor is preferably 0.1 to 10 parts by weight, and more preferably in the range of 0.2 to 5 parts by weight, with respect to 100 parts by mass of the polyimide precursor.

<<Metal Adhesiveness Improving Agent>>

The photosensitive resin composition of the present invention preferably includes a metal adhesiveness improving agent for improving adhesiveness to metallic materials used for electrodes, wirings, or the like. Examples of the metal adhesiveness improving agent include the sulfide-based compounds described in paragraphs 0046 to 0049 of JP2014-186186A and paragraphs 0032 to 0043 of JP2013-072935A. The content of the metal adhesiveness improving agent is preferably 0.1 to 30 parts by weight, and more preferably 0.5 to 15 parts by weight, with respect to 100 parts by mass of the polyimide precursor. If the content is 0.1 parts by weight or more, the metal adhesiveness to a film after thermal curing is improved, whereas if the content is 30 parts by weight or less, the heat resistance and the mechanical characteristics of the film after curing is improved.

<<Silane Coupling Agent>>

The photosensitive resin composition of the present invention preferably includes a silane coupling agent in a view of improving the adhesiveness to a substrate. Examples of the silane coupling agent include the compounds described in paragraphs 0062 to 0073 of JP2014-191002A, the compounds described in paragraphs 0063 to 0071 of WO2011/080992A1, the compounds described in paragraphs 0060 to 0061 of JP2014-191252A, the compounds described in paragraphs 0045 to 0052 of JP2014-41264A, and the compounds described in paragraph 0055 of WO2014/097594A. In addition, it is also preferable that different two or more kinds of the silane coupling agents are used as described in paragraphs 0050 to 0058 of JP2011-128358A.

The content of the silane coupling agent is preferably 0.1 to 20 parts by weight, and more preferably in the range of 1 to 10 parts by weight, with respect to 100 parts by mass of the polyimide precursor. If the content is 0.1 parts by mass or more, sufficient adhesiveness to a substrate can be provided, whereas if the content is 20 parts by mass or less, problems such as an increase in viscosity during storage at room temperature can be more suppressed.

<<Dissolution Accelerator>>

In a case where the photosensitive resin composition of the present invention is of a positive tone using an alkali developer, it is preferable to add a dissolution accelerator (solubility-promoting compound) from the viewpoint of improving the sensitivity. Examples of the dissolution accelerator include low molecular phenols (for example, Bis-Z, TekP-4HBPA, TrisP-HAP, TrisP-PA, BisRS-2P, and BisRS-3P (all trade names, manufactured by Honshu Chemical Industry Co., Ltd.), BIR—PC, BIR-PTBP, and BIR—BIPC-F (all trade names, manufactured by Asahi Organic Chemicals Industry Co., Ltd.), the phenols described in paragraphs 0056 to 0062 of JP2013-152381), and arylsulfonamide derivatives (for example, the compounds described in paragraph 0058 of JP2011-164454A).

<<Dissolution Inhibitor>>

In a case where the photosensitive resin composition of the present invention is of a positive tone using an alkali developer, it is preferable to add a dissolution inhibitor (solubility-inhibiting compound) for the purpose of adjusting the solubility in an alkali developer. As such the compound, an onium salt, a diaryl compound, and a tetraalkylammonium salt are preferable. Examples of the onium salt include iodonium salts such as a diaryliodonium salt, sulfonium salts such as a triarylsulfonium salt, phosphonium salts, and diazonium salts such as an aryldiazonium salt. Examples of the diaryl compound include diarylurea, diarylsulfone, diarylketone, diaryl ether, diarylpropane, diarylhexafluoropropane, and the like, in which two aryl groups are bonded via a bonding group, and as the aryl group, a phenyl group is preferable.

Examples of the tetraalkylammonium salt include tetraalkylammonium halide in which the alkyl group is a methyl group, an ethyl group, or the like.

Among these, the diaryliodonium salt, the diarylurea compound, the diarylsulfone compound, the tetramethylammonium halide compound, and the like can be mentioned as those exhibiting a good dissolution inhibitory effect, examples of the diarylurea compound include diphenylurea and dimethyldiphenylurea, and examples of the tetramethylammonium halide compound include tetramethylammonium chloride, tetramethylammonium bromide, and tetramethylammonium iodide.

Among these, a diaryliodonium salt compound represented by General Formula (Inh) is preferable.

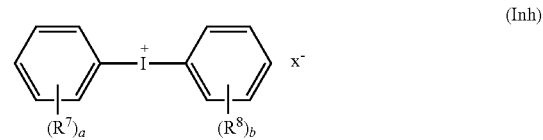

(Inh)

(In the formula, X⁻ represents a counter anion, $R^7$ and $R^8$ each independently represent a monovalent organic group, and a and b each independently represent an integer of 0 to 5.)

Examples of the anion X⁻ include a nitrate ion, a tetrafluorinated boron ion, a perchlorate ion, a trifluoromethanesulfonate ion, a p-toluenesulfonate ion, a thiocyanate ion, a chlorine ion, a bromine ion, and an iodine ion.

As the diaryliodonium salt, for example, diphenyliodonium nitrate, bis(p-tert-butylphenyl)iodonium nitrate, diphenyliodoniumtrifluoromethanesulfonate, bis(p-tert-butylphenyl)iodoniumtrifluoromethanesulfonate, diphenyliodonium bromide, diphenyliodonium chloride, diphenyliodonium iodide, or the like can be used.

Among these, diphenyliodonium nitrate, diphenyliodoniumtrifluoromethane sulfonate, and diphenyliodonium-8-anilinonaphthalene-1-sulfonate can be mentioned as the preferred salts due to enhanced effects.

In a view of tolerance in the sensitivity and the development time, the content of the dissolution inhibitor in a case where it is contained is preferably 0.1 to 20 parts by mass, more preferably 0.1 to 15 parts by mass, and still more preferably 0.5 to 10 parts by mass, with respect to 100 parts by mass of the polyimide precursor.

<<Other Additives>>

The photosensitive resin composition of the present invention may contain, if desired, various additives, for example, a curing agent, a curing catalyst, a silane coupling agent, a filler, an antioxidant, an ultraviolet absorbing agent, and an aggregation inhibitor as long as the effects of the present invention are not impaired. In the case of adding such an additive, the total blend amount thereof is preferably set to 3% by mass or less of the solid content of the photosensitive resin composition.

The water content of the photosensitive resin composition of the present invention is preferably less than 5% by mass, more preferably less than 1% by mass, and particularly preferably less than 0.6% by mass, from the viewpoint of coated surface morphology.

The metal content in the photosensitive resin composition of the present invention is preferably less than 5 ppm by mass, more preferably less than 1 ppm by mass, and particularly preferably less than 0.5 ppm by mass, from the viewpoint of insulating properties. Examples of the metal include sodium, potassium, magnesium, calcium, iron, chromium, and nickel. In a case of containing a plurality of metals, it is preferable that the total of these metals is within the above range.

Furthermore, examples of a method for reducing metal impurities that are included in the photosensitive resin composition without intention include a method in which a raw material having a low metal content as a raw material constituting the photosensitive resin composition is selected, the raw material constituting the photosensitive resin composition is filtered through a filter, and the inside of the device is lined with polytetrafluoroethylene and distilled under the conditions where contamination can be suppressed as much as possible.

The content of halogen atoms in the photosensitive resin composition of the present invention is preferably less than 500 ppm by mass, more preferably less than 300 ppm by mass, and particularly preferably less than 200 ppm by mass, from the viewpoint of wiring corrosion preventing properties. Among those, one present in the state of halogen ions is preferably less than 5 ppm by mass, more preferably less than 1 ppm by mass, and particularly preferably less than 0.5 ppm by mass. Examples of the halogen atom include a chlorine atom and a bromine atom. The total of chlorine atoms and bromine atoms, or the total of chloride ions and bromide ions is preferably within the above range.

<Preparation of Photosensitive Resin Composition>

The photosensitive resin composition of the present invention can be prepared by mixing the above-mentioned respective components. The mixing method is not particularly limited and may be carried out by a method known in the related art.

Incidentally, for the purpose of removing impurities such as dusts and fine particles in the photosensitive resin composition, it is preferable to subject the mixture to filtration using a filter. The filter pore diameter is preferably 5 µm or less, more preferably 3 µm or less, and still more preferably 1 µm or less. As for the materials of a filter, a polytetrafluoroethylene-made filter, a polyethylene-made filter, and a nylon-made filter are preferable. The filter which has been washed with an organic solvent in advance may also be used. In the step of filtration using a filter, a plurality of kinds of filters may be connected in series or in parallel, and used. In a case of using a plurality of kinds of filters, a combination of filters having different pore diameters and/or materials may be used. Incidentally, the photosensitive resin composition may be filtered in plural times, and the step of filtering in plural times may be a circulatory filtration step. In addition, filtration may be carried out with pressurization, and the pressure for the pressurization is preferably from 0.05 MPa to 0.3 MPa.

In addition to the filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

<Use of Photosensitive Resin Composition>

The photosensitive resin composition of the present invention can be cured and used as a cured film. The photosensitive resin composition of the present invention is capable of forming a cured film having excellent heat resistance and insulating properties, and therefore, can be preferably used for an insulating film of semiconductor devices, a re-wiring interlayer insulating film, or the like. In particular, the photosensitive resin composition of the present invention can be preferably used for re-wiring interlayer insulating film or the like in three-dimensional mounting devices.

Moreover, the photosensitive resin composition of the present invention can also be used in photoresists for electronics (a galvanic (electrolysis) resist (galvanic resist), an etching resist, or a solder top resist), or the like.

In addition, the photosensitive resin composition can also be used in manufacture of printing plates such as offset printing plates and screen printing plates, for use in etching of molded parts, in electronics, and particularly for production of protective lacquers and dielectric layers in microelectronics.

<Method for Producing Cured Film>

Next, a method for producing a cured film of the present invention will be described.

The method for producing a cured film includes a step of applying a photosensitive resin composition onto a substrate, and a step of curing the photosensitive resin composition applied onto the substrate.

<<Step of Applying Photosensitive Resin Composition onto Substrate>>

Examples of the method for applying a photosensitive resin composition onto a substrate include spinning, immersing, doctor-blade coating, suspended casting, painting, spraying, electrostatic spraying, and reverse-roll coating, spinning, electrostatic spraying, and reverse-roll coating being preferred due to uniform application onto a substrate.

Examples of the substrate include an inorganic substrate, a resin, and a resin composite material.

Examples of the inorganic substrate include a glass substrate, a quartz substrate, a silicon substrate, silicon nitride substrate, and a composite substrate in which molybdenum, titanium, aluminum, copper, or the like is vapor-deposited onto such a substrate.

Examples of the resin substrate include substrates made of synthetic resins such as polybutylene terephthalate, polyethylene terephthalate, polyethylene naphthalate, polybutylene naphthalate, polystyrene, polycarbonate, polysulfone, polyethersulfone, polyarylate, allyl diglycol carbonate, polyamide, polyimide, polyamideimide, polyetherimide, polybenzazole, polyphenylene sulfide, polycycloolefin, a norbornene resin, a fluororesin, for example polychlorotrifluoroethylene, a liquid crystal polymer, an acrylic resin, an epoxy resin, a silicone resin, an ionomer resin, a cyanate resin, crosslinked fumaric acid diester, cyclic polyolefin, aromatic ether, maleimide-olefin, cellulose, and an episulfide compound. A case of these substrates being used in the above-mentioned form is uncommon, and usually depending on the form of the final product, a multilayer laminate structure such as a TFT element is formed thereon.

The amount of the photosensitive resin composition to be applied (thickness of layer) and the type of the substrate (support of layer) are dependent on the field of applications which are desired. It is particularly advantageous that the photosensitive resin composition can be used in a widely variable layer thickness. The range of the layer thickness is preferably 0.5 to 100 μm.

After applying the photosensitive resin composition onto the substrate, it is preferable to carry out drying. The drying is preferably carried out, for example, at 60° C. to 150° C. for 10 seconds to 2 minutes.

<<Step of Heating>>

By heating the photosensitive resin composition applied onto the substrate, the cyclization reaction of the polyimide precursor proceeds, whereby it is possible to form a cured film having excellent heat resistance.

The heating temperature is preferably 50° C. to 300° C., and more preferably 100° C. to 250° C.

According to the present invention, since many isomers having higher cyclization rates are included, it is also possible to carry out the cyclization reaction of the polyimide precursor at a lower temperature.

It is preferable to adjust at least one selected from the heating rate, the heating time, and the cooling rate from the viewpoint of internal stress reduction and warping suppression of a cured film.

The heating rate is preferably 3° C./min to 5° C./min at heating initiation temperature set to 20° C. to 150° C.

In a case where the heating temperature is 200° C. to 240° C., the heating time is preferably 180 minutes or more. The upper limit is, for example, preferably 240 minutes or less. In a case where the heating temperature is 240° C. to 300° C., the heating time is preferably 90 minutes or more. The upper limit is, for example, preferably 180 minutes or less. In a case where the heating temperature is 300° C. to 380° C., the heating time is preferably 60 minutes or more. The upper limit is, for example, preferably 120 minutes or less.

The cooling rate is preferably 1° C./min to 5° C./min.

The heating may be carried out stepwise. An example of heating includes a step in which the temperature is increased at 5° C./min from 20° C. to 150° C., allowed to stand at 150° C. for 30 minutes, increased at 5° C./min from 150° C. to 230° C., and then allowed to stand at 230° C. for 180 minutes.

The heating step is preferably carried out in an atmosphere of low oxygen concentration, by flowing of an inert gas such as nitrogen, helium or argon or the like, from the viewpoint of preventing decomposition of a polyimide precursor such as a polyimide. The oxygen concentration is preferably 50 ppm by mass or less, and more preferably 20 ppm by mass or less.

In the present invention, a patterning step may be carried out between the step of applying a photosensitive resin composition onto a substrate and the heating step. The patterning step may be carried out, for example, by a photolithography method. For example, there is a method which is carried out through a step of exposing and a step of performing development treatment.

In a case of a negative tone, the patterning according to a photolithography method can be carried out, for example, by using a photosensitive resin composition including the above-mentioned polyimide precursor, the above-mentioned compound having an ethylenically unsaturated bond as a curable compound, and a photoradical polymerization initiator. Further, in a case of a positive tone, the patterning can be carried out, for example, by using a photosensitive resin composition including the above-mentioned polyimide precursor, at least one compound selected from a compound having a hydroxymethyl group, an alkoxymethyl group, or an acyloxymethyl group, an epoxy compound, an oxetane compound, and a benzoxazine compound as the above-mentioned curable compound, and a photo-acid generator. In addition, in a case of the negative tone, the polyimide precursor preferably has an ethylenically unsaturated bond.

Hereinafter, the case of patterning by a photolithography method will be described.

<<Step of Exposing>>

In the step of exposing, the photosensitive resin composition applied onto a substrate is irradiated with actinic rays or radiations in a predetermined pattern.

The wavelength of actinic rays or radiations varies depending on the composition of the photosensitive resin composition, and is preferably 200 to 600 nm and more preferably 300 to 450 nm.

As a light source, a low-pressure mercury lamp, a high-pressure mercury lamp, an ultra high-pressure mercury lamp, a chemical lamp, an LED light source, an excimer laser generator, or the like may be used, and actinic rays having a wavelength ranging from 300 nm to 450 nm such as am i-line (365 nm), an h-line (405 nm), and a g-line (436 nm) may be preferably used. The irradiating light may be adjusted as necessary by way of a spectral filter such as a long-wavelength cut-off filter, a short-wavelength cut-off filter, or a band-pass filter. The exposure dose is preferably 1 to 500 mJ/cm$^2$.

As exposure equipment, various types of exposure equipment such as a mirror projection aligner, a stepper, a scanner, proximity, contact, a microlens array, a lens scanner, and laser exposure may be used.

Incidentally, in a case of using (meth)acrylates and similar olefin unsaturated compounds, the photopolymerization thereof, particularly in a thin layer, is prevented by oxygen in the air, as is well-known. This effect may be alleviated by, for example, temporary introduction of the coating layer of a polyvinyl alcohol, or a method known in the related art, such as pre-exposure or pre-conditioning in an inert gas.

<<Step of Carrying Out Development Treatment>>

In the step of carrying out development treatment, an unexposed portion of the photosensitive resin composition is developed using a developer. An aqueous alkaline developer, an organic solvent or the like may be used as the developer.

Examples of an alkali compound used in the aqueous alkaline developer include sodium hydroxide, potassium hydroxide, sodium carbonate, potassium carbonate, sodium hydrogen carbonate, potassium hydrogen carbonate, sodium silicate, potassium silicate, sodium metasilicate, potassium metasilicate, ammonia, and amine. Examples of the amines include ethylamine, n-propylamine, diethylamine, di-n-propylamine, triethylamine, methyldiethylamine, alkanolamine, dimethylethanolamine, triethanolamine, quaternary ammonium hydroxides, tetramethylammonium hydroxide (TMAH), and tetraethylammonium hydroxide. Among those, preferred is a metal-free alkali compound. A suitable aqueous alkaline developer is generally up to 0.5 N in terms of alkali, but may be appropriately diluted before use. For example, about 0.15 to 0.4 N, and preferably 0.20 to 0.35 N of an aqueous alkaline developer is also suitable. The alkali compound may be of one kind or of two or more kinds thereof. In a case where the alkali compound is two or more types, it is preferable that the total thereof is within the above range.

The organic solvents that can be used are the same as the solvents which can be used in the photosensitive resin composition described above. Suitable examples thereof include n-butyl acetate, γ-butyrolactone, cyclopentanone, and a mixture thereof.

The field to which the method for producing a cured film of the present invention is applicable may be preferably an insulating film of semiconductor devices, a re-wiring interlayer insulating film, or the like. In particular, since the resolution is good, the method for producing a cured film according to the present invention can be preferably used for re-wiring interlayer insulating film or the like in three-dimensional mounting devices.

Furthermore, the method for producing a cured film can also be used in photoresists for electronics, (a galvanic (electrolysis) resist galvanic resin, an etching resist, or a solder top resist), or the like.

In addition, the method for producing a cured film can also be used in manufacture of printing plates such as offset printing plates and screen printing plates, for use in etching of molded parts, in electronics, and particularly for production of protective lacquers and dielectric layers in microelectronics.

<Semiconductor Device>

Next, description will be made on one embodiment of a semiconductor device using a photosensitive resin composition for a re-wiring interlayer insulating film.

A semiconductor device 100 shown in FIG. 1 is a so-called three-dimensional mounting device, in which a laminate 101 having a plurality of semiconductor elements semiconductor chips) 101a to 101d laminated thereon is disposed on a wiring board 120.

Furthermore, in this embodiment, although the description focuses on a case where the number of laminated semiconductor elements (semiconductor chips) is 4 layers, the number of laminated semiconductor elements (semiconductor chips) is not particularly limited and may be, for example, 2 layers, 8 layers, 16 layers, and 32 layers. Further, it may be a single layer.

A plurality of semiconductor elements 101a to 101d are all formed of a semiconductor wafer such as a silicon substrate.

An uppermost semiconductor element 101a does not have a through-electrode, and an electrode pad (not shown) is formed on one surface thereof.

Semiconductor elements 101b to 101d have through-electrodes 102b to 102d, and both surfaces of the respective semiconductor elements are provided with connection pads (not shown) provided integrally with the through-electrodes.

A laminate 101 has a structure in which the semiconductor element 101a having no through-electrode and the semiconductor elements 101b to 101d having the through-electrodes 102b to 102d are flip-chip connected.

In other words, the electrode pad of the semiconductor element 101a having no through-electrode is connected to the connection pad of the semiconductor element 101a side of the semiconductor element 101b having the through-electrode 102b adjacent thereto by a metal bump 103a such as a solder bump; and the connection pad of the other side of the semiconductor element 101b having the through-electrode 102b is connected to the connection pad of the semiconductor element 101b side of the semiconductor element 101c having a through-electrode 102c adjacent thereto by a metal bump 103b such as solder bump. Similarly, the connection pad of the other side of the semiconductor element 101c having the through-electrode 102c is connected to the connection pad of a semiconductor element 101c side of the semiconductor element 101d having a through-electrode 102d adjacent thereto by a metal bump 103c such as solder hump.

Underfill layers 110 are formed in gaps of the respective semiconductor elements 101a to 101d, and the respective semiconductor elements 101a to 101d are laminated through underfill layers 110.

A laminate 101 is laminated on a wiring board 120.

As the wiring board 120, for example, a multilayer wiring board using an insulating substrate such as a resin substrate, a ceramic substrate or a glass substrate as a base material is used. Examples of the wiring board 120 onto which the resin substrate is applied include a multilayer copper-clad laminate (multilayer printed wiring board).

On one surface of the wiring board 120 is provided a surface electrode 120a.

An insulating layer 115 on which the re-wiring layer 105 is formed is disposed between the wiring board 120 and the laminate 101, and the wiring board 120 and the laminate 101 are electrically connected via a re-wiring layer 105. The insulating layer 115 is formed of the photosensitive resin composition of the present invention.

That is, one end of the re-wiring layer 105 is connected to the electrode pad formed on the surface of the re-wiring layer 105 side of the semiconductor element 101d via a metal bump 103d such as solder hump. The other end of the re-wiring layer 105 is connected to the surface electrode 120a of the wiring board via a metal bump 103e such as solder bump.

Incidentally, an underfill layer 110a is formed between the insulating layer 115 and the laminate 101. Further, an underfill layer 110b is formed between the insulating layer 115 and the wiring board 120.

EXAMPLES

Hereinafter, the present invention will be further specifically described with reference to the following Examples, but the present invention is not limited thereto as long as those Examples do not depart from the spirit and scope of the present invention. Further, unless otherwise specified, "%" and "parts" are by mass. NMR is the abbreviation for nuclear magnetic resonance.

<Number-Average Molecular Weight and Mass-Average Molecular Weight of Polyimide Precursor>

The number-average molecular weight and the mass-average molecular weight of the polyimide precursor were measured by the following method.

The number-average molecular weight and the mass-average molecular weight were determined using HLC-8220 (manufactured by Tosoh Corporation), and TSKgel Super AWM-H (manufactured by Tosoh Corporation, 6.0 mmID (diameter)×15.0 cm) as a column in this device. Eluent: tetrahydrofuran, feeding conditions: sample pump 0.35 mL/min, reference pump: 0.2 mL/min, column temperature: 40° C., injection volume: 10 μL, calibration curve resin: polystyrene, and sample concentration: 0.1% by mass Synthesis Example 1

Synthesis of Polyimide Precursor Composition from 4,4'-Oxydiphthalic Anhydride, 2-Hydroxyethyl Methacrylate, and 4,4'-Diaminodiphenylmethane (A-1; Polyimide Precursor Composition Having Radically Polymerizable Group)

21.2 g of 4,4'-oxydiphthalic anhydride (dried at 140° C. for 12 hours), 18.0 g of 2-hydroxyethyl methacrylate, 0.05 g of hydroquinone, 23.9 g of pyridine, and 150 mL of diglyme were mixed, and the mixture was stirred at a temperature of 60° C. for 2 hours to produce a diester of 4,4'-oxydiphthalic acid and 2-hydroxyethyl methacrylate. Then, the reaction mixture was cooled to −10° C., and 17.1 g of SOCl$_2$ was added thereto for 60 minutes while keeping the temperature at −10±4° C. The reaction mixture was diluted with 50 mL of N-methylpyrrolidone, and then a solution in which 12.4 g of 4,4'-diaminodiphenylmethane had been dissolved in 100 ml of N-methylpyrrolidone was added dropwise to the reaction mixture at −10±4° C. for 60 minutes. The mixture was stirred for 2 hours to produce a polyimide precursor. Then, the polyimide precursor was precipitated in 6 liters of water, and the water-polyimide precursor mixture was stirred at a speed of 5,000 rpm for 15 minutes. The polyimide precursor was removed by filtration, and stirred again in 4 liters of water for 30 minutes, and filtered again. Then, the obtained polyimide precursor was dried at 45° C. for 3 days under reduced pressure.

The weight-average molecular weight and the number-average molecular weight of the polyimide precursor were 25,500 and 7,800, respectively.

The peaks of the portions corresponding to the following arrow symbols, as measured by $^{13}$C-NMR (deuterated dimethyl sulfoxide (DMSO)) were compared and the isomer ratios were calculated. Thus, the molar ratio of the repeating unit corresponding to General Formula (1-2) was 92.3% by mole in the repeating unit corresponding to General Formula (1-1).

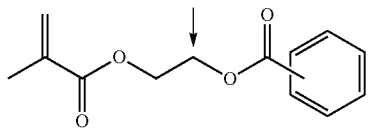

Synthesis Example 2

Synthesis of Polyimide Precursor Composition from 4,4'-Oxydiphthalic Anhydride, 2-Hydroxyethyl Methacrylate, and 4,4'-Diaminodiphenylmethane (A-2; Polyimide Precursor Composition Having Radically Polymerizable Group)

In the same manner as in Synthesis Example 1 except that the stirring time of the reaction for producing a diester of 4,4'-oxydiphthalic acid and 2-hydroxyethyl methacrylate was changed to 4 hours, a polyimide precursor was synthesized.

The weight-average molecular weight and the number-average molecular weight of the polyimide precursor were 26,200 and 7,700, respectively.

The isomer ratios were calculated by the measurement by $^{13}$C-NMR (deuterated DMSO), and thus, the molar ratio of the repeating unit corresponding to General Formula (1-2) was 77.2% by mole in the repeating unit corresponding to General Formula (1-1).

Synthesis Example 3

Synthesis of Polyimide Precursor Composition from 4,4'-Oxydiphthalic Anhydride, 2-Hydroxyethyl Methacrylate, and 4,4'-Diaminodiphenylmethane (A-3; Polyimide Precursor Composition Having Radically Polymerizable Group)

In the same manner as in Synthesis Example 1 except that the stirring time of the reaction for producing a diester of 4,4'-oxydiphthalic acid and 2-hydroxyethyl methacrylate was changed to 8 hours, a polyimide precursor was synthesized.

The weight-average molecular weight and the number-average molecular weight of the polyimide precursor were 25,100 and 8,100, respectively.

The isomer ratios were calculated by the measurement by $^{13}$C-NMR (deuterated DMSO), and thus, the molar ratio of the repeating unit corresponding to General Formula (1-2) was 65.3% by mole in the repeating unit corresponding to General Formula (1-1).

Synthesis Example 4

Synthesis of Polyimide Precursor Composition from 4,4'-Oxydiphthalic Anhydride, 2-Hydroxyethyl Methacrylate, and 4,4'-Diaminodiphenylmethane (A-4; Polyimide Precursor Composition Having Radically Polymerizable Group)

In the same manner as in Synthesis Example 1 except that the stirring time of the reaction for producing a diester of 4,4'-oxydiphthalic acid and 2-hydroxyethyl methacrylate was changed to 12 hours, a polyimide precursor was synthesized.

The weight-average molecular weight and the number-average molecular weight of the polyimide precursor were 25,200 and 8,000, respectively.

The isomer ratios were calculated by the measurement by $^{13}$C-NMR (deuterated DMSO), and thus, the molar ratio of the repeating unit corresponding to General Formula (1-2) was 55.1% by mole in the repeating unit corresponding to General Formula (1-1).

Synthesis Example 5

Synthesis of Polyimide Precursor Composition from 4,4'-Oxydiphthalic Anhydride, 2-Hydroxyethyl Methacrylate, and 4,4'-Diaminodiphenyl Ether (A-5; Polyimide Precursor Composition Having Polymerizable Group)

21.2 g of 4,4'-oxydiphthalic anhydride (dried at 140° C. for 12 hours), 18.0 g of 2-hydroxyethyl methacrylate, 0.05 g of hydroquinone, 23.9 g of pyridine, and 150 mL of diglyme (diethylene glycol dimethyl ether) were mixed, and the mixture was stirred at a temperature of 60° C. for 2 hours to produce a diester of 4,4'-oxydiphthalic acid and 2-hydroxyethyl methacrylate. Then, the reaction mixture was cooled to −10° C., and 17.1 g of SOCl$_2$ was added thereto for 60 minutes while keeping the temperature at −10±4° C. The reaction mixture was diluted with 50 mL of N-methylpyrrolidone, and then a solution in which 12.6 g of 4,4'-diaminodiphenyl ether had been dissolved in 100 ml of N-methylpyrrolidone was added dropwise to the reaction mixture at −10±4° C. for 60 minutes. The mixture was stirred for 2 hours to produce a polyimide precursor. Then, the polyimide precursor was precipitated in 6 liters of water, and the water-polyimide precursor mixture was stirred at a speed of 5,000 rpm for 15 minutes. The polyimide precursor was removed by filtration, and stirred again in 4 liters of water for 30 minutes, and filtered again. Then, the obtained polyimide precursor was dried at 45° C. for 3 days under reduced pressure.

The weight-average molecular weight and the number-average molecular weight of the polyimide precursor were 24,800 and 7,900, respectively.

Synthesis Example 6

Synthesis of Polyimide Precursor Composition from 4,4'-Oxydiphthalic Anhydride, 2-Hydroxyethyl Methacrylate, and 4,4'-Diaminodiphenyl Ether (A-6; Polyimide Precursor Composition Having Radically Polymerizable Group)

In the same manner as in Synthesis Example 5 except that the stirring time of the reaction for producing a diester of 4,4'-oxydiphthalic acid and 2-hydroxyethyl methacrylate was changed to 4 hours, a polyimide precursor was synthesized.

The weight-average molecular weight and the number-average molecular weight of the polyimide precursor were 27,100 and 8,500, respectively.

The isomer ratios were calculated by the measurement by $^{13}$C-NMR (deuterated DMSO), and thus, the molar ratio of the repeating unit corresponding to General Formula (1-2) was 82.5% by mole in the repeating unit corresponding to General Formula (1-1).

Synthesis Example 7

Synthesis of Polyimide Precursor Composition from 4,4'-Oxydiphthalic Anhydride, 2-Hydroxyethyl Methacrylate, and 4,4'-Diaminodiphenyl Ether (A-7; Polyimide Precursor Composition Having Radically Polymerizable Group)

In the same manner as in Synthesis Example 5 except that the stirring time of the reaction for producing a diester of 4,4'-oxydiphthalic acid and 2-hydroxyethyl methacrylate was changed to 8 hours, a polyimide precursor was synthesized.

The weight-average molecular weight and the number-average molecular weight of the polyimide precursor were 26,400 and 8,300, respectively.

The isomer ratios were calculated by the measurement by $^{13}$C-NMR (deuterated DMSO), and thus, the molar ratio of the repeating unit corresponding to General Formula (1-2) was 68.4% by mole in the repeating unit corresponding to General Formula (1-1).

Synthesis Example 8

Synthesis of Polyimide Precursor Composition from 4,4'-Oxydiphthalic Anhydride, 2-Hydroxyethyl Methacrylate, and 4,4'-Diaminodiphenyl Ether (A-8; Polyimide Precursor Composition Having Radically Polymerizable Group)

In the same manner as in Synthesis Example 5 except that the stirring time of the reaction for producing a diester of 4,4'-oxydiphthalic acid and 2-hydroxyethyl methacrylate was changed to 12 hours, a polyimide precursor was synthesized.

The weight-average molecular weight and the number-average molecular weight of the polyimide precursor were 25,400 and 8,100, respectively.

The isomer ratios were calculated by the measurement by $^{13}$C-NMR (deuterated DMSO), and thus, the molar ratio of the repeating unit corresponding to General Formula (1-2) was 52.8% by mole in the repeating unit corresponding to General Formula (1-1).

Synthesis Example 9

Synthesis of Polyimide Precursor Composition from 4,4'-Biphthalic Anhydride, 2-Hydroxyethyl Methacrylate, and 4,4'-Diaminodiphenyl Ether (A-9; Polyimide Precursor Composition Having Polymerizable Group)

20.5 g of 4,4'-biphthalic anhydride (dried at 140° C. for 12 hours), 18.0 g of 2-hydroxyethyl methacrylate, 0.05 g of hydroquinone, 23.9 g of pyridine, and 150 mL of diglyme were mixed, and the mixture was stirred at a temperature of 60° C. for 8 hours to produce a diester of 4,4'-biphthalic acid and 2-hydroxyethyl methacrylate. Then, the reaction mixture was cooled to −10° C., and 17.1 g of $SOCl_2$ was added thereto for 60 minutes while keeping the temperature at −10±4° C. The reaction mixture was diluted with 50 mL of N-methylpyrrolidone, and then a solution in which 12.6 g of 4,4'-diaminodiphenyl ether had been dissolved in 100 ml of N-methylpyrrolidone was added dropwise to the reaction mixture at −10±4° C. for 60 minutes. The mixture was stirred for 2 hours to produce a polyimide precursor. Then, the polyimide precursor was precipitated in 6 liters of water, and the water-polyimide precursor mixture was stirred at a speed of 5,000 rpm for 15 minutes. The polyimide precursor was removed by filtration, and stirred again in 4 liters of water for 30 minutes, and filtered again. Then, the obtained polyimide precursor was dried at 45° C. for 3 days under reduced pressure.

The weight-average molecular weight and the number-average molecular weight of the polyimide precursor were 24,600 and 8,100, respectively.

The isomer ratios were calculated by the measurement by $^{13}$C-NMR (deuterated DMSO), and thus, the molar ratio of the repeating unit corresponding to General Formula (1-2) was 62.5% by mole in the repeating unit corresponding to General Formula (1-1).

Synthesis Example 10

Synthesis of Polyimide Precursor Composition from 4,4'-Biphthalic Anhydride, 2-Hydroxyethyl Methacrylate, and 4,4'-Diaminodiphenyl Ether (A-10; Polyimide Precursor Composition Having Radically Polymerizable Group)

In the same manner as in Synthesis Example 9 except that the stirring time of the reaction for producing a diester of 4,4'-biphthalic acid and 2-hydroxyethyl methacrylate was changed to 12 hours, a polyimide precursor was synthesized.

The weight-average molecular weight and the number-average molecular weight of the polyimide precursor were 24,500 and 7,700, respectively.

The isomer ratios were calculated by the measurement by $^{13}$C-NMR (deuterated DMSO), and thus, the molar ratio of the repeating unit corresponding to General Formula (1-2) was 55.2% by mole in the repeating unit corresponding to General Formula (1-1).

Synthesis Example 11

Synthesis of Polyimide Precursor Composition from 4,4'-Oxydiphthalic Anhydride, 4-Hydroxystyrene, and 4,4'-Diaminodiphenyl Ether (A-11; Polyimide Precursor Composition Having Polymerizable Group)

21.2 g of 4,4'-oxydiphthalic anhydride (dried at 140° C. for 12 hours), 16.6 g of 4-hydroxystyrene, 0.05 g of hydroquinone, 23.9 g of pyridine, and 150 mL of diglyme were mixed, and the mixture was stirred at a temperature of 60° C. for 8 hours to produce a diester of 4,4'-oxydiphthalic acid and 4-hydroxystyrene. Then, the reaction mixture was cooled to −10° C., and 17.1 g of $SOCl_2$ was added thereto for 60 minutes while keeping the temperature at −10±4° C. The reaction mixture was diluted with 50 mL of N-methylpyrrolidone, and then a solution in which 12.6 g of 4,4'-diaminodiphenyl ether had been dissolved in 100 ml of N-methylpyrrolidone was added dropwise to the reaction mixture at −10±4° C. for 60 minutes. The mixture was stirred for 2 hours to produce a polyimide precursor. Then, the polyimide precursor was precipitated in 6 liters of water, and the water-polyimide precursor mixture was stirred at a speed of 5,000 rpm for 15 minutes. The polyimide precursor was removed by filtration, and stirred again in 4 liters of water for 30 minutes, and filtered again. Then, the obtained polyimide precursor was dried at 45° C. for 3 days under reduced pressure.

The weight-average molecular weight and the number-average molecular weight of the polyimide precursor were 25,500 and 8,700, respectively.

The isomer ratios were calculated by the measurement by $^{13}$C-NMR (deuterated DMSO), and thus, the molar ratio of the repeating unit corresponding to General Formula (1-2) was 66.8% by mole in the repeating unit corresponding to General Formula (1-1).

Synthesis Example 12

Synthesis of Polyimide Precursor Composition from 4,4'-Biphthalic Anhydride, 4-Hydroxystyrene, and 4,4'-Diaminodiphenyl Ether (A-12; Polyimide Precursor Composition Having Radically Polymerizable Group)

In the same manner as in Synthesis Example 11 except that the stirring time of the reaction for producing a diester of 4,4'-biphthalic acid and 4-hydroxystyrene was changed to 12 hours, a polyimide precursor was synthesized.

The weight-average molecular weight and the number-average molecular weight of the polyimide precursor were 23,500 and 6,800, respectively.

The isomer ratios were calculated by the measurement by $^{13}$C-NMR (deuterated DMSO), and thus, the molar ratio of the repeating unit corresponding to General Formula (1-2) was 53.1% by mole in the repeating unit corresponding to General Formula (1-1).

Synthesis Example 13

Synthesis of Polyimide Precursor Composition from Pyromellitic Dianhydride, 2-Hydroxyethyl Methacrylate, and 4,4'-Diaminodiphenyl Ether (A-13; Polyimide Precursor Composition Having Polymerizable Group)

15.5 g of pyromellitic dianhydride (dried at 140° C. for 12 hours), 18.0 g of 2-hydroxyethyl methacrylate, 0.05 g of hydroquinone, 23.9 g of pyridine, and 150 mL of diglyme were mixed, and the mixture was stirred at a temperature of 60° C. for 8 hours to produce a diester of pyromellitic acid and 2-hydroxyethyl methacrylate. Then, the reaction mixture was cooled to −10° C., and 17.1 g of $SOCl_2$ was added thereto for 60 minutes while keeping the temperature at −10±4° C. The reaction mixture was diluted with 50 mL of N-methylpyrrolidone, and then a solution in which 12.6 g of 4,4'-diaminodiphenyl ether had been dissolved in 100 ml of N-methylpyrrolidone was added dropwise to the reaction mixture at −10±4° C. for 60 minutes. The mixture was stirred for 2 hours to produce a polyimide precursor. Then, the polyimide precursor was precipitated in 6 liters of water, and the water-polyimide precursor mixture was stirred at a speed of 5,000 rpm for 15 minutes. The polyimide precursor was removed by filtration, and stirred again in 4 liters of water for 30 minutes, and filtered again. Then, the polyimide precursor was dried at 45° C. for 3 days under reduced pressure.

The weight-average molecular weight and the number-average molecular weight of the polyimide precursor were 23,700 and 7,100, respectively.

The isomer ratios were calculated in the same manner as in Synthesis Example 1 by the measurement by $^{13}$C-NMR (deuterated DMSO), and thus, the molar ratio of the cis isomers in the repeating units was 72.5% by mole in all the repeating units (trans isomers+cis isomers).

Synthesis Example 14

Synthesis of Polyimide Precursor Composition from 4,4'-Oxydiphthalic Anhydride, Hydroxyl Group-Containing Diamine (a), and 1,3-Bis(3-aminopropyl)tetramethyldisiloxane (A-14; Polyimide Precursor Composition)

A hydroxyl group-containing diamine (a) shown below was synthesized according to the method described in paragraphs 0070 to 0071 of JP2014-178400A. 24.18 g (0.040 moles) of the obtained hydroxyl group-containing diamine (a) and 1.24 g (0.005 moles) of 1,3-bis(3-aminopropyl)tetramethyldisiloxane were dissolved in 60 g of NMP. 15.51 g (0.05 moles) of 3,3',4,4'-diphenyl ether tetracarboxylic anhydride was added thereto, together with 21 g of NMP, and the mixture was reacted at 40° C. for 10 hours. Thereafter, a solution resulting from dilution of 14.7 g (0.1 moles) of N,N-dimethylformamide diethyl acetal in 15 g of NMP was added dropwise thereto for 10 minutes. After dropwise addition, the mixture was stirred at 40° C. for 3 hours. After completion of the reaction, the solution was put into 2 L of water, and the precipitates of the polymer solid were collected. The polymer solid was dried in a vacuum drier at 80° C. for 72 hours to obtain a polyimide precursor A-14.

The weight-average molecular weight and the number-average molecular weight of the polyimide precursor were 18,000 and 8,300, respectively.

The isomer ratios were calculated from comparison of peaks corresponding to carbon atoms of a methyl group at a site corresponding to the polyvinyl precursor of Synthesis Example 1, that is, at a methyl ether site, by the measurement by $^{13}$C-NMR (deuterated DMSO), and thus, the molar ratio of the repeating unit corresponding to General Formula (1-2) was 69.5% by mole in the repeating unit corresponding to General Formula (1-1).

Synthesis Example 15

Synthesis of Polyimide Precursor Composition from 4,4'-Oxydiphthalic Anhydride, Hydroxyl Group-Containing Diamine (a), and 1,3-Bis(3-aminopropyl)tetramethyldisiloxane (A-15; Polyimide Precursor Composition)

In the same manner as in Synthesis Example 14 except that the reaction of the hydroxyl group-containing diamine (a), 1,3-bis(3-aminopropyl)tetramethyldisiloxane, and 3,3', 4,4'-diphenyl ether tetracarboxylic anhydride was changed to 60° C. for 2 hours, a polyimide precursor was synthesized.

The weight-average molecular weight and the number-average molecular weight of the polyimide precursor were 19,200 and 8,500, respectively.

The isomer ratios were calculated from comparison of peaks corresponding to carbon atoms of a methyl group at a site corresponding to the polyvinyl precursor of Synthesis Example 1, that is, at a methyl ether site, by the measurement by $^{13}$C-NMR (deuterated DMSO), and thus, the molar ratio of the repeating unit corresponding to General Formula (1-2) was 50.1% by mole in the repeating unit corresponding to General Formula (1-1).

Hydroxyl group-containing diamine (a)

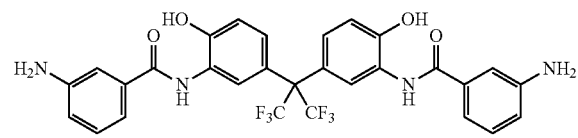 [SMILES: Nc1cccc(C(=O)Nc2cc(C(c3ccc(O)c(NC(=O)c4cccc(N)c4)c3)(C(F)(F)F)C(F)(F)F)ccc2O)c1]

Examples 1 to 26, and Comparative Examples 1 to 12

The components (A) to (F) described in Table 5 were mixed to form a uniform solution, and then filtered with precision, using a polytetrafluoroethylene filter having a pore diameter of 0.4 µM, thereby preparing a coating liquid of a photosensitive resin composition.

(Evaluation)
(Cyclization Time)

The photosensitive resin composition was applied onto a silicon wafer by spinning (1,200 rpm, 30 seconds). The silicon wafer having the photosensitive resin composition applied thereonto was dried in a hot plate at 100° C. for 5 minutes to form a uniform film having a thickness of 10 µm on the silicon wafer.

For Examples 1 to 22, and Comparative Examples 1 to 11, the film applied onto the silicon wafer was exposed using an aligner (Karl-Suss MA150). Exposure was carried out with a high-pressure mercury lamp under irradiation at 500 mJ/cm$^2$ in terms of exposure energy at a wavelength 365 nm. After exposure, the photosensitive resin composition was scraped, the temperature was raised to 180° C. at a rate of 5° C./minute in a nitrogen atmosphere, thermal gravimetric analysis (TGA measurement) in the state of maintaining 180° C., and the cyclization time was evaluated.

For Examples 23 to 26, and Comparative Example 12, the film applied onto the silicon wafer was exposed using an aligner (Karl-Suss MA150). Exposure was carried out with a high-pressure mercury lamp under irradiation at 500 mJ/cm$^2$ in terms of exposure energy at a wavelength 365 nm. After exposure, the photosensitive resin composition was scraped off, the temperature was raised to 180° C. at a rate of 5° C./minute in a nitrogen atmosphere, thermal gravimetric analysis (TGA measurement) in the state of maintaining 180° C., and the cyclization time was evaluated.

The polyimide precursor had a reduction in weight as the cyclization reaction proceeded, but the time taken until the reduction in weight did not occur was evaluated in accordance with the following standard. A shorter time indicates a higher cyclization rate, which indicates a preferred result.

A: More than 10 minutes and 30 minutes or less
B: More than 30 minutes and 60 minutes or less
C: More than 60 minutes and 120 minutes or less
D: More than 120 minutes.

(Stability)

After preparing the photosensitive resin composition, a container (material of the container: light-shielding glass, capacity: 100 mL) having 10 g of the photosensitive resin composition inside was sealed, and left to stand in the environment of 25° C. and a humidity of 65%. As the cyclization of the photosensitive resin composition proceeded, the stability was evaluated from the time taken until the solid was precipitated. A longer time indicates higher stability of the composition, which indicates a preferred result. The precipitates of the solid were filtered through a mesh having a pore diameter of 0.8 µm, and the presence or absence of foreign matters on the mesh was observed with the naked eye.

A: Precipitation of the solid was not seen even after 120 days.
B: The solid was precipitated after 60 days and within 120 days.
C: The solid was precipitated after 30 days and within 60 days.
D: The solid was precipitated within 30 days.

TABLE 5

| | (A) Polyimide precursor | | (B) Compound having ethylenically unsaturated bond | | (C) Photoradical polymerization initiator | | (D) Thermal radical polymerization initiator | | (E) Additive | | (F) Solvent | | Results | |
|---|---|---|---|---|---|---|---|---|---|---|---|---|---|---|
| | Type | % by mass | Type | % by mass | Type | % by mass | Type | % by mass | Type | % by mass | Type | % by mass | Cyclization time | Stability |
| Example 1 | A-2 | 39.0 | | | C-1 | 1.0 | | | | | F-1 | 60 | A | B |
| Example 2 | A-2 | 38.8 | | | C-1 | 1.0 | | | E-1 | 0.2 | F-1 | 60 | A | B |
| Example 3 | A-2 | 33.0 | B-1 | 5.0 | C-1 | 1.0 | D-1 | 1.0 | | | F-1/F-2 | 48/12 | A | B |
| Example 4 | A-2 | 34.0 | B-2 | 5.0 | C-2 | 1.0 | | | | | F-1 | 60 | A | B |
| Example 5 | A-2 | 34.0 | B-3 | 5.0 | C-1 | 1.0 | | | | | F-1 | 60 | A | B |
| Example 6 | A-3 | 34.0 | | | C-1 | 1.0 | | | E-3 | 5.0 | F-1 | 60 | A | A |

TABLE 5-continued

| | (A) Polyimide precursor | | (B) Compound having ethylenically unsaturated bond | | (C) Photoradical polymerization initiator | | (D) Thermal radical polymerization initiator | | (E) Additive | | (F) Solvent | | Results | |
|---|---|---|---|---|---|---|---|---|---|---|---|---|---|---|
| | Type | % by mass | Type | % by mass | Type | % by mass | Type | % by mass | Type | % by mass | Type | % by mass | Cyclization time | Stability |
| Example 7 | A-3 | 39.0 | | | C-3 | 1.0 | | | | | F-1/F-2 | 4 | B | A |
| Example 8 | A-3 | 33.0 | B-1 | 5.0 | C-1 | 1.0 | D-2 | 1.0 | | | F-1 | 60 | B | A |
| Example 9 | A-3 | 32.0 | B-2 | 7.0 | C-1 | 1.0 | | | | | F-1 | 60 | B | A |
| Example 10 | A-3 | 33.8 | B-3 | 5.0 | C-1 | 1.0 | | | E-2 | 0.2 | F-1 | 60 | B | A |
| Example 11 | A-6 | 39.0 | | | C-1 | 1.0 | | | | | F-1/F-2 | 48/12 | A | B |
| Example 12 | A-6 | 38.0 | | | C-1 | 1.0 | D-1 | 1.0 | | | F-1 | 60 | A | B |
| Example 13 | A-6 | 29.0 | B-1 | 5.0 | C-4 | 1.0 | | | E-3 | 5.0 | F-1 | 60 | A | B |
| Example 14 | A-6 | 34.0 | B-2 | 5.0 | C-1 | 1.0 | | | | | F-1 | 60 | A | B |
| Example 15 | A-6 | 34.0 | B-3 | 5.0 | C-1 | 1.0 | | | | | F-1/F-2 | 48/12 | A | B |
| Example 16 | A-7 | 39.0 | | | C-1 | 1.0 | | | | | F-1 | 60 | B | A |
| Example 17 | A-7 | 38.9 | | | C-1 | 1.0 | | | E-4 | 0.1 | F-1 | 60 | B | A |
| Example 18 | A-7 | 34.0 | B-1 | 5.0 | C-1 | 1.0 | | | | | F-1 | 60 | B | A |
| Example 19 | A-7 | 33.8 | B-2 | 5.0 | C-5 | 1.0 | | | E-1 | 0.2 | F-1 | 60 | B | A |
| Example 20 | A-7 | 33.0 | B-3 | 5.0 | C-1 | 1.0 | D-1 | 1.0 | | | F-1 | 60 | B | A |
| Example 21 | A-9 | 34.0 | B-3 | 5.0 | C-1 | 1.0 | | | | | F-1 | 60 | B | A |
| Example 22 | A-11 | 34.0 | B-3 | 5.0 | C-1 | 1.0 | | | | | F-1 | 60 | B | A |
| Example 23 | A-14 | 12.2 | | | | | | | E-5/E-9/ E-10/E-11 | 12.2/2.0/ 8.2/4.1 | F-1 | 61.2 | B | A |
| Example 24 | A-14 | 40.0 | | | | | | | E-6/E-11 | 12.0/8.0 | F-1 | 40 | B | A |
| Example 25 | A-14 | 40.0 | | | | | | | E-7/E-11 | 12.0/8.0 | F-1 | 40 | B | A |
| Example 26 | A-14 | 42.6 | | | | | | | E-8/E-11 | 6.4/8.5 | F-1 | 42.5 | B | A |
| Comparative Example 1 | A-1 | 39.0 | | | C-1 | 1.0 | | | | | F-1 | 60 | A | D |
| Comparative Example 2 | A-1 | 34.0 | B-3 | 5.0 | C-1 | 1.0 | | | | | F-1/F-2 | 48/12 | A | D |
| Comparative Example 3 | A-4 | 39.0 | | | C-1 | 1.0 | | | | | F-1 | 60 | D | B |
| Comparative Example 4 | A-4 | 34.0 | B-3 | 5.0 | C-1 | 1.0 | | | | | F-1 | 60 | D | B |
| Comparative Example 5 | A-5 | 39.0 | | | C-1 | 1.0 | | | | | F-1 | 60 | A | D |
| Comparative Example 6 | A-5 | 34.0 | B-3 | 5.0 | C-1 | 1.0 | | | | | F-1 | 60 | A | D |
| Comparative Example 7 | A-8 | 39.0 | | | C-1 | 1.0 | | | | | F-1/F-2 | 48/12 | D | B |
| Comparative Example 8 | A-8 | 34.0 | B-3 | 5.0 | C-1 | 1.0 | | | | | F-1 | 60 | D | B |
| Comparative Example 9 | A-10 | 34.0 | B-3 | 5.0 | C-1 | 1.0 | | | | | F-1 | 60 | D | B |
| Comparative Example 10 | A-12 | 34.0 | B-3 | 5.0 | C-1 | 1.0 | | | | | F-1 | 60 | D | B |
| Comparative Example 11 | A-13 | 34.0 | B-3 | 5.0 | C-1 | 1.0 | | | | | F-1 | 60 | D | B |
| Comparative Example 12 | A-15 | 40.0 | | | | | | | E-6/E-11 | 12.0/8.0 | F-1 | 40 | D | B |

From the above results, for the photosensitive resin compositions of Examples 1 to 26, the cyclization reaction time in the heat treatment at 180° C. was within 60 minutes, and the solid was not precipitated for 60 days or more as for a change in the photosensitive resin composition over time, indicating stability.

On the other hand, for the photosensitive resin compositions of Comparative Examples 1, 2, 5, and 6, the cyclization time was good, but the stability of the stability of the photosensitive resin composition was poor. In addition, for the photosensitive resin compositions of Comparative Examples 3, 4, and 7 to 12, the stability of the composition was good, but the cyclization time was long and the characteristics of the cured film were insufficient.

The abbreviations described in Table 5 are as follows.

(A) Polyimide Precursor

A-1 to A-15: Polyimide precursors A-1 to A-15 synthesized in Synthesis Examples 1 to 8

(B) Compound Having Ethylenically Unsaturated Bond

B-1: NK Ester M-40G (monofunctional methacrylate manufactured by Shin-Nakamura Chemical Co., Ltd., the following structure)

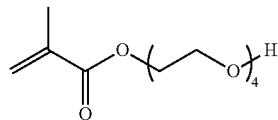

B-2: NK Ester 4G (bifunctional methacrylate manufactured by Shin-Nakamura Chemical Co., Ltd., the following structure)

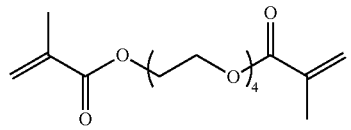

B-3: NK Ester A-9300 (trifunctional methacrylate manufactured by Shin-Nakamura Chemical Co., Ltd., the following structure)

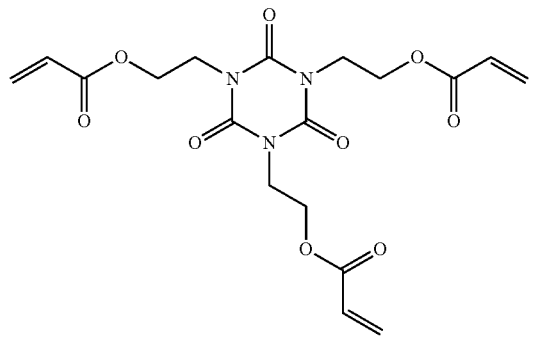 [SMILES: C=CC(=O)OCCn1c(=O)n(CCOC(=O)C=C)c(=O)n(CCOC(=O)C=C)c1=O]

(C) Photoradical Polymerization Initiator

C-1: IRGACURE-OXE01 (manufactured by BASF Corp., the following structure)

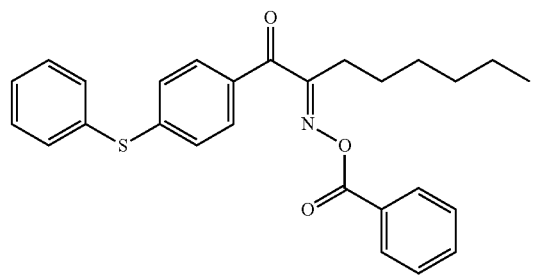

OXE-01

C-2: Compound 24 described in paragraph 0345 of JP2014-500852A

C-3: Compound 36 described in paragraph 0345 of JP2014-500852A

C-4: Compound 37 described in paragraph 0345 of JP2014-500852A

C-5: Compound 40 described in paragraph 0345 of JP2014-500852A

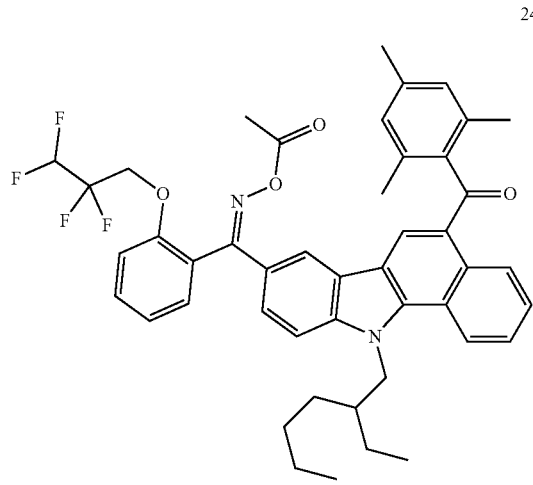

24

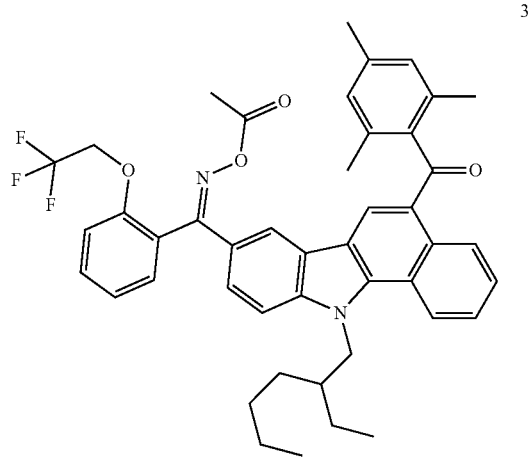

36

-continued

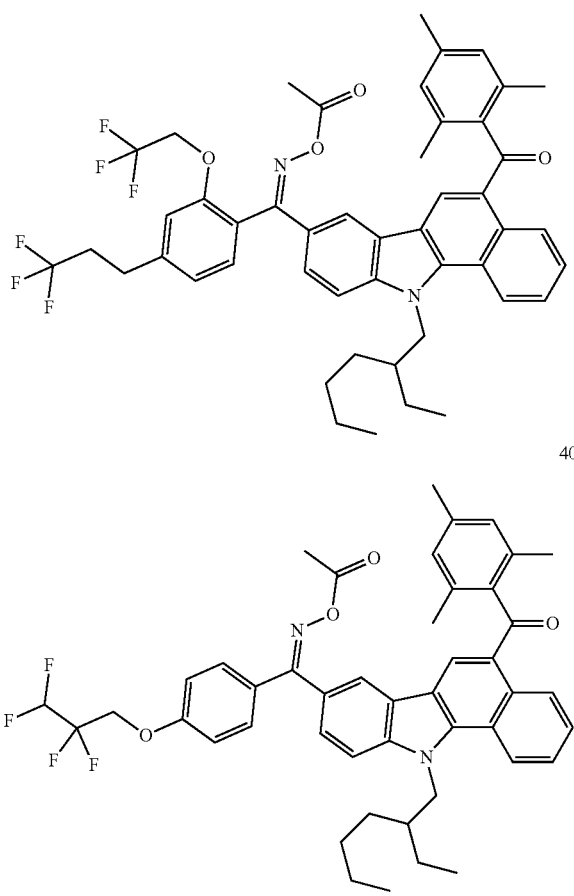

(D) Thermal Radical Polymerization Initiator

D-1: PERBUTYL Z (manufactured by Nippon Fat and Oil Co., Ltd., tert-butylperoxybenzoate, decomposition temperature (10 hour half-life period temperature)=104° C.)

D-2: PERCUMYL D (manufactured by Nippon Fat and Oil Co., Ltd., dicumyl peroxide, decomposition temperature (10 hour half-life period temperature)=116.4° C.)

(E) Additive

E-1 (corrosion inhibitor): 1H-Tetrazole

E-2 (corrosion inhibitor): 1,2,4-Triazole

E-3 (thermal base generator): The following compound, pKa 1.2

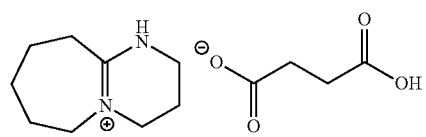 [SMILES: C1CCC2=[N+](CC1)CCCN2 ; O=C([O-])CCC(=O)O]

E-4 (polymerization inhibitor): 1,4-Benzoquinone

E-5 (compound having an alkoxymethyl group): HMOM-TPHAP (trade name, manufactured by Honshu Chemical Industry Co., Ltd.)

E-6 (epoxy compound): EPICLON (registered trademark) EXA-4880 (trade name, manufactured by Dainippon Ink and Chemicals, Inc.)

E-7 (oxetane compound): ARON Oxetane OXT-191 (trade name, manufactured by Toagosei Co., Ltd.)

E-8 (benzoxazine compound): B-m Type benzoxazine (trade name, manufactured by Shikoku Chemicals Corporation)

E-9 (dissolution accelerator): BIR-PC (trade name, manufactured by Asahi Organic Chemicals Industry Co., Ltd.)

E-10 (resin containing a phenolic OH group): Novolac resin obtained by the method described in paragraph 0092 of JP2014-157297A E-11 (photo-acid generator): The following compound (synthesized according to paragraph 0082 of JP2014-157297A)

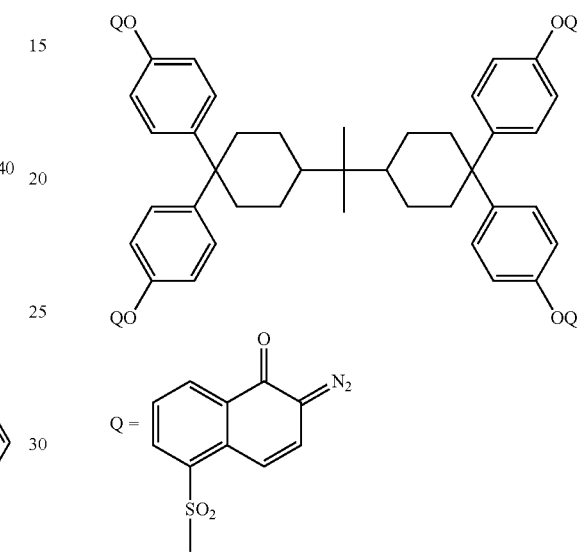

(F) Solvent

F-1: γ-Butyrolactone

F-2: Dimethyl sulfoxide

Example 100

The photosensitive resin composition of Example 13 was applied onto a resin substrate having a copper thin layer formed thereon by spinning (3,500 rpm, 30 seconds). The photosensitive resin composition applied onto the resin substrate was dried at 100° C. for 5 minutes, and then exposed using an aligner (Karl-Suss MA150). The exposure was carried out with a high-pressure mercury lamp, and the exposure energy at a wavelength of 365 nm was measured. After exposure, the image was developed with cyclopentanone for 75 seconds.

Subsequently, heating was performed at 180° C. for 20 minutes, thereby forming a re-wiring interlayer insulating film.

This re-wiring interlayer insulating film had excellent insulating properties.

In addition, a semiconductor device was produced using this re-wiring interlayer insulating film, and it was confirmed that the semiconductor device worked without problems.

Example 101

The photosensitive resin composition of Example 23 was applied onto a 8-inch silicon wafer such that the film thickness after prebaking became 10 μm, and then prebaked using a hot plate (a coating and developing device ACT8, manufactured by Tokyo Electron, Ltd.) at 120° C. for 3 minutes to obtain a photosensitive resin film. Exposure was performed using an aligner (Karl-Suss MA150). The exposure was performed with a high-pressure mercury lamp, and the exposure energy at a wavelength of 365 nm was measured. After exposure, a 2.38%-by-mass aqueous solution of tetramethylammonium hydroxide with 50 rotations for 10 seconds was sprayed onto the exposed film, using a developing device ACT8, manufactured by Tokyo Electron, Ltd. Thereafter, the resultant was left to stand for 70 seconds at zero rotation, a rinsing treatment with water was performed at 400 rotations, spun-off at 3,000 rotations for 10 seconds, and dried.

Subsequently, heating was performed at 230° C. for 20 minutes, thereby forming a re-wiring interlayer insulating film.

This re-wiring interlayer insulating film had excellent insulating properties.

In addition, a semiconductor device was produced using this re-wiring interlayer insulating film, and it was confirmed that the semiconductor device worked without problems.

EXPLANATION OF REFERENCES

100: semiconductor device
101a to 101d: semiconductor elements
101: laminate
102b to 102d: through-electrodes
103a to 103e: metal bumps
105: re-wiring layer
110, 110a, 110b: underfill layers
115: insulating layer
120: wiring board
120a: surface electrode

What is claimed is:

1. A polyimide precursor composition comprising:
a polyimide precursor including repeating units represented by General Formula (1-1),
wherein the molar ratio of repeating units represented by General Formula (1-2) among the structural isomers of the polyimide precursor is 60% to 90% by mole,

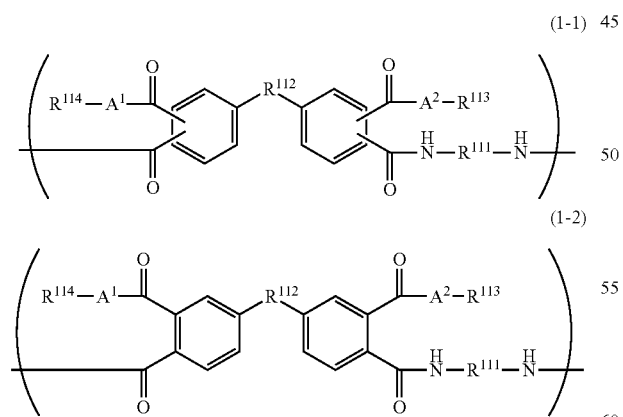

in General Formulae (1-1) and (1-2), $A^1$ and $A^2$ each independently represents an oxygen atom or NH, $R^{111}$ and $R^{112}$ each independently represents a single bond or a divalent organic group, and $R^{113}$ and $R^{114}$ each independently represents a hydrogen atom or a monovalent organic group, wherein the weight-average molecular weight/number-average molecular weight which is the dispersity of the polyimide precursor is 2.0 to 4.0.

2. The polyimide precursor composition according to claim 1,
wherein at least one of $R^{113}$ or $R^{114}$ contains a polymerizable group.

3. The polyimide precursor composition according to claim 1,
wherein both of $R^{113}$ and $R^{114}$ contain a polymerizable group.

4. The polyimide precursor composition according to claim 1,
wherein at least one of $A^1$ or $A^2$ is an oxygen atom.

5. The polyimide precursor composition according to claim 1,
wherein $R^{112}$ is a single bond, or a group selected from a hydrocarbon group having 1 to 10 carbon atoms, —O—, —C(=O)—, —S—, —S(=O)$_2$—, —NHCO—, and a combination thereof.

6. The polyimide precursor composition according to claim 1,
wherein the weight-average molecular weight of the polyimide precursor is 1,000 to 100,000.

7. A photosensitive resin composition comprising:
the polyimide precursor composition according to claim 1; and
a curable compound.

8. The photosensitive resin composition according to claim 7,
wherein the curable compound includes a compound having an ethylenically unsaturated bond.

9. The photosensitive resin composition according to claim 7,
wherein the curable compound includes a compound having two or more ethylenically unsaturated groups.

10. The photosensitive resin composition according to claim 7,
wherein the curable compound is at least one compound selected from a compound having at least one of a hydroxymethyl group, an alkoxymethyl group, and an acyloxymethyl group, an epoxy compound, an oxetane compound, and a benzoxazine compound.

11. The photosensitive resin composition according to claim 7, further comprising:
at least one kind of thermal base generator selected from an acidic compound which generates a base upon heating to 40° C. or higher and an ammonium salt having an anion with a pKa1 of 0 to 4 and an ammonium cation.

12. The photosensitive resin composition according to claim 11,
wherein the acidic compound is a compound which generates a base upon heating to 120° C. to 200° C.

13. The photosensitive resin composition according to claim 11,
wherein the acidic compound is an ammonium salt.

14. The photosensitive resin composition according to claim 11,
wherein the acidic compound is a salt of an ammonium cation and a carboxylate anion.

15. The photosensitive resin composition according to claim 11,
wherein the ammonium salt having an anion with a pKa1 of 0 to 4 and an ammonium cation is an acidic compound.

16. The photosensitive resin composition according to claim 11,
wherein the anion contained in the ammonium salt is a carboxylate anion.

17. The photosensitive resin composition according to claim 7, further comprising:
a photoradical polymerization initiator.

18. The photosensitive resin composition according to claim 7, further comprising:
a photo-acid generator.

19. A cured film formed by curing the photosensitive resin composition according to claim 7.

20. A semiconductor device comprising:
the cured film according to claim 19.

21. A method for producing a cured film, comprising:
applying the photosensitive resin composition according to claim 7 onto a substrate; and
curing the photosensitive resin composition applied onto the substrate.

22. A method for producing a polyimide precursor composition, comprising:
reacting a compound represented by General Formula (P) with a compound represented by General Formula (Q) to produce a diester or a diamide; and
reacting the diester or the diamide with a compound represented by General Formula (R),
wherein the reaction for producing the diester or the diamide is carried out at 40° C. to 80° C. for 3 to 10 hours,

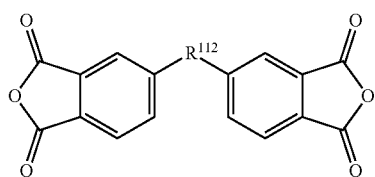

General Formula (P)

in General Formula (P), $R^{112}$ represents a single bond or a divalent organic group;

$HA^3\text{-}R^{115}$ General Formula (Q)

in General Formula (Q), $A^3$'s each independently represent an oxygen atom or NH, and $R^{115}$ represents a monovalent organic group; and $H_2N\text{—}R^{111}\text{—}NH_2$ General Formula (R)

in General Formula (R), $R^{111}$ represents a divalent organic group, wherein the polyimide precursor composition comprises a polyimide precursor including repeating units represented by General Formula (1-1), and the molar ratio of repeating units represented by General Formula (1-2) among the structural isomers of the polyimide precursor is 60% to 90% by mole,

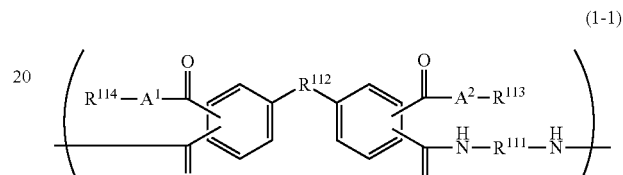

(1-1)

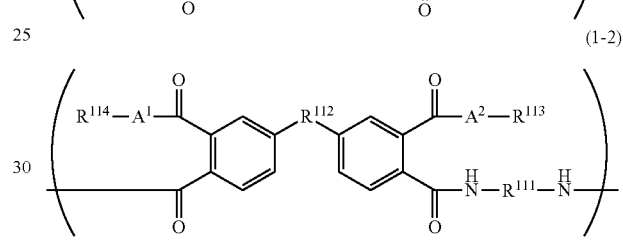

(1-2)

in General Formulae (1-1) and (1-2), $A^1$ and $A^2$ each independently represents an oxygen atom or NH, $R^{111}$ and $R^{112}$ each independently represents a single bond or a divalent organic group, and $R^{113}$ and $R^{114}$ each independently represents a hydrogen atom or a monovalent organic group.

* * * * *